United States Patent
Pan et al.

(10) Patent No.: US 11,453,745 B2
(45) Date of Patent: Sep. 27, 2022

(54) HIGH POLYMER, MIXTURE CONTAINING SAME, COMPOSITION, ORGANIC ELECTRONIC COMPONENT, AND MONOMER FOR POLYMERIZATION

(71) Applicant: GUANGZHOU CHINARAY OPTOELECTRONIC MATERIALS LTD., Guangdong (CN)

(72) Inventors: Junyou Pan, Guangdong (CN); Hong Huang, Guangdong (CN)

(73) Assignee: GUANGZHOU CHINARAY OPTOELECTRONIC MATERIALS LTD., Guangdong (CN)

( * ) Notice: Subject to any disclaimer, the term of this patent is extended or adjusted under 35 U.S.C. 154(b) by 562 days.

(21) Appl. No.: 16/463,273

(22) PCT Filed: Nov. 23, 2017

(86) PCT No.: PCT/CN2017/112716
§ 371 (c)(1),
(2) Date: May 22, 2019

(87) PCT Pub. No.: WO2018/095395
PCT Pub. Date: May 31, 2018

(65) Prior Publication Data
US 2019/0292309 A1    Sep. 26, 2019

(30) Foreign Application Priority Data
Nov. 23, 2016   (CN) .......................... 201611047040.7

(51) Int. Cl.
C08G 61/04    (2006.01)
H01L 51/00    (2006.01)
H01L 51/50    (2006.01)

(52) U.S. Cl.
CPC .......... C08G 61/04 (2013.01); H01L 51/0043 (2013.01); H01L 51/0055 (2013.01); H01L 51/0067 (2013.01); H01L 51/0072 (2013.01); H01L 51/0073 (2013.01); H01L 51/0074 (2013.01); H01L 51/50 (2013.01); *C08G 2261/149* (2013.01); *C08G 2261/95* (2013.01)

(58) Field of Classification Search
CPC .............. C08G 61/04; C08G 2261/149; C08G 2261/95; H01L 51/0043; H01L 51/0055; H01L 51/0067; H01L 51/0072; H01L 51/0073; H01L 51/0074; H01L 51/50
USPC ........................................................ 257/40
See application file for complete search history.

(56) References Cited

U.S. PATENT DOCUMENTS

| | | | |
|---|---|---|---|
| 3,567,450 A | 3/1971 | Brantly et al. | |
| 3,615,404 A | 10/1971 | Price et al. | |
| 4,720,432 A | 1/1988 | VanSlyke et al. | |
| 4,769,292 A | 9/1988 | Tang et al. | |
| 5,061,569 A | 10/1991 | VanSlyke et al. | |
| 5,121,029 A | 6/1992 | Hosokawa et al. | |
| 5,130,603 A | 7/1992 | Tokailin et al. | |
| 6,020,078 A | 2/2000 | Chen et al. | |
| 6,251,531 B1 | 6/2001 | Enokida et al. | |
| 6,824,895 B1 | 11/2004 | Sowinski et al. | |
| 6,830,828 B2 | 12/2004 | Thompson et al. | |
| 6,835,469 B2 | 12/2004 | Kwong et al. | |
| 7,029,766 B2 | 4/2006 | Huo et al. | |
| 7,250,532 B2 | 7/2007 | Iwakuma et al. | |
| 7,767,317 B2 | 8/2010 | Begley et al. | |
| 2001/0053462 A1 | 12/2001 | Mishima | |
| 2003/0091862 A1 | 5/2003 | Tokito et al. | |
| 2005/0258742 A1 | 11/2005 | Tsai et al. | |
| 2006/0210830 A1 | 9/2006 | Funahashi et al. | |
| 2006/0222886 A1 | 10/2006 | Kwong et al. | |
| 2007/0087219 A1 | 4/2007 | Ren et al. | |
| 2007/0092753 A1 | 4/2007 | Begley et al. | |
| 2007/0252517 A1 | 11/2007 | Owczarczyk et al. | |
| 2008/0027220 A1 | 1/2008 | Stossel et al. | |
| 2008/0113101 A1 | 5/2008 | Inoue et al. | |
| 2009/0061681 A1 | 3/2009 | McMunigal et al. | |
| 2009/0134784 A1 | 5/2009 | Lin et al. | |
| 2010/0045171 A1 | 2/2010 | Katakura et al. | |

(Continued)

FOREIGN PATENT DOCUMENTS

CN    1379009 A    11/2002
CN    1583691 A    2/2005
(Continued)

OTHER PUBLICATIONS

Lee et al, "High-Efficiency Orange and Tandem White Organic Light-Emitting Diodes Using Phosphorescent Dyes with Horizontally Oriented Emitting Dipoles", Advanced Materials, vol. 26 (2014) pp. 1-5.
Newkome et al. "Dendrimers and Dendrons", Wiley-VCH Verlag GmbH & Co. KGaA, ISBN 3-527-29997-1 (2002).
(Continued)

*Primary Examiner* — Ling Siu Choi
*Assistant Examiner* — Ronald Grinsted
(74) *Attorney, Agent, or Firm* — PV IP PC; Wei Te Chung; Ude Lu

(57) ABSTRACT

A polymer, a mixture containing the same, a formulation, an organic electronic component, and a monomer for polymerization. The polymer comprises a repeat unit E1 and a repeat unit E2. An E1 group on a side chain of the repeat unit E1 and an E2 group on a side chain of the repeat unit E2 have features for forming Exciplexes, min((LUMO(E1)−HOMO(E2), LUMO(E2)−HOMO(E1))≤min($E_T$(E1),$E_T$(E2))+0.1 eV being satisfied, and accordingly a polymer suitable for printing technologies is provided, thereby reducing manufacturing costs of OLEDs.

11 Claims, No Drawings

(56) References Cited

U.S. PATENT DOCUMENTS

| | | | |
|---|---|---|---|
| 2010/0171101 | A1 | 7/2010 | Tanaka et al. |
| 2011/0084601 | A1 | 4/2011 | Nakayama et al. |
| 2012/0004407 | A1 | 1/2012 | Stoessel et al. |
| 2012/0217869 | A1 | 8/2012 | Adachi et al. |
| 2016/0225998 | A1 | 8/2016 | Kato et al. |
| 2017/0358751 | A1* | 12/2017 | Pan ................. C07C 13/00 |

FOREIGN PATENT DOCUMENTS

| | | | |
|---|---|---|---|
| CN | 102270751 A1 | 12/2011 | |
| CN | 102282150 A | 12/2011 | |
| CN | 103483332 A | 1/2014 | |
| CN | 105679949 A1 | 6/2016 | |
| DE | 102005058557 A1 | 6/2007 | |
| EP | 1144543 B1 | 3/2004 | |
| EP | 1191613 B1 | 3/2006 | |
| EP | 1957606 A1 | 8/2008 | |
| EP | 1191614 B1 | 5/2009 | |
| EP | 1191612 B1 | 9/2009 | |
| EP | 1941562 B1 | 5/2010 | |
| JP | 2913116 B2 | 6/1999 | |
| JP | 8053397 A | 3/2008 | |
| TW | 201309696 A | 3/2013 | |
| TW | 201309778 A | 3/2013 | |
| TW | 201343874 A | 11/2013 | |
| TW | 201350558 A | 12/2013 | |
| WO | 200070655 A2 | 11/2000 | |
| WO | 2001021729 A1 | 3/2001 | |
| WO | 200141512 A1 | 6/2001 | |
| WO | 200202714 A2 | 1/2002 | |
| WO | 200215645 A1 | 2/2002 | |
| WO | 2005019373 A2 | 3/2005 | |
| WO | 2005033244 A1 | 4/2005 | |
| WO | 2006/000388 A1 | 1/2006 | |
| WO | 2006/000389 A1 | 1/2006 | |
| WO | 2006/058737 A1 | 6/2006 | |
| WO | 2006/122630 A1 | 11/2006 | |
| WO | 2007/065549 A1 | 6/2007 | |
| WO | 2007095118 A2 | 8/2007 | |
| WO | 2007/115610 A1 | 10/2007 | |
| WO | 2007/140847 A1 | 12/2007 | |
| WO | 2008/006449 A1 | 1/2008 | |
| WO | 2007119420 A | 8/2009 | |
| WO | 2009118087 A1 | 10/2009 | |
| WO | 2009146770 A2 | 12/2009 | |
| WO | 2010015307 A1 | 2/2010 | |
| WO | 2010031485 A1 | 3/2010 | |
| WO | 2010054728 A1 | 5/2010 | |
| WO | 2010054731 A1 | 5/2010 | |
| WO | 2010086089 A1 | 8/2010 | |
| WO | 2010099852 A1 | 9/2010 | |
| WO | 2010102709 A1 | 9/2010 | |
| WO | 2010135519 A1 | 11/2010 | |
| WO | 2009116414 A1 | 7/2011 | |
| WO | 2011110277 A1 | 9/2011 | |
| WO | 2011141110 A2 | 11/2011 | |
| WO | 2011157339 A1 | 12/2011 | |
| WO | 2012007086 A1 | 1/2012 | |
| WO | 2012007087 A1 | 1/2012 | |
| WO | 2012007088 A1 | 1/2012 | |
| WO | 2013133359 A1 | 9/2013 | |
| WO | 2013154064 A1 | 10/2013 | |
| WO | 2016/086886 A1 | 6/2016 | |
| WO | WO-2016086886 A1 * | 6/2016 | ........... C07C 49/798 |

OTHER PUBLICATIONS

Endo et. al., "Thermally Activated Delayed Fluorescence from Sn4 þ -Porphyrin Complexes and Their Application to Organic Light-Emitting Diodes—A Novel Mechanism for Electroluminescence", Adv. Mater., vol. 21 (2009) pp. 4802-4806.
Endo et. al., "Efficient up-conversion of triplet excitons into a singlet state and its application for organic light emitting diodes", Appl. Phys. Lett., vol. 98 (2011) pp. 083302-01-083302-03.
Lee et al., "High-efficiency organic light-emitting diodes utilizing thermally activated delayed fluorescence from triazine-based donor-acceptor hybrid molecules", vol. 101 Appl. Phys. Lett., vol. 101 (2012) 093306-01-093306-04.
Tanaka, "Efficient green thermally activated delayed fluorescence (TADF) from a phenoxazine-triphenyltriazine (PXZ-TRZ) derivative", Chem. Commun. vol. 48 (2012) 11392-11394.
Goushi et.al., "Organic light-emitting diodes employing efficient reverse intersystem crossing for triplet-to-singlet state conversion", Nature Photonics, vol. 6 (2012) pp. 253-258.
Uoyama et al., "Highly efficient organic light-emitting diodes from delayed fluorescence", Nature, vol. 492 (2012) pp. 234-238.
Zhang et.al., "Design of Efficient Thermally Activated Delayed Fluorescence Materials for Pure Blue Organic Light Emitting Diodes", J. Am. Chem. Soc, vol. 134 (2012) pp. 14706-14709.
Mehes et.al., "Enhanced Electroluminescence Efficiency in a Spiro-Acridine Derivative through Thermally Activated Delayed Fluorescence", Angew. Chem. Int. Ed, vol. 51 (2012) pp. 11311-11315.
Nakagawa et.al., "Electroluminescence based on thermally activated delayed fluorescence generated by a spirobifluorene donor-acceptor structure", Chem. Commun., vol. 48 (2012) 9580-9582.
Nasu et.al., "A highly luminescent spiro-anthracenone-based organic light-emitting diode exhibiting thermally activated delayed fluorescence", Chem. Commun., vol. 49 (2013), 10385-10387.
Li et.al., "Highly Efficient Organic Light-Emitting Diode Based on a Hidden Thermally Activated Delayed Fluorescence Channel in a Heptazine Derivative", Adv. Mater., vol. 25 (2013) pp. 1-5.
Dias et.al., "Triplet Harvesting with 100% Efficiency by Way of Thermally Activated Delayed Fluorescence in Charge Transfer OLED Emitters", Adv. Mater., vol. 25 (2013) pp. 3707-3714.
Komino et.al., "Suppression of Efficiency Roll-Off Characteristics in Thermally Activated Delayed Fluorescence Based Organic Light-Emitting Diodes Using Randomly Oriented Host Molecules", Chem. Mater., vol. 25 (2013) pp. 3038-3047.
Tanaka et.al., "Twisted Intramolecular Charge Transfer State for Long-Wavelength Thermally Activated Delayed Fluorescence", Chem. Mater., vol. 25, (2013) pp. 3766-3771.
Lee et.al., "Oxadiazole- and triazole-based highly-efficient thermally activated delayed fluorescence emitters for organic light-emitting diodes", J. Mater. Chem. C., vol. 1 (2013) pp. 4599-4605.
Ishimatsu et.al., "Solvent Effect on Thermally Activated Delayed Fluorescence by 1,2,3,5-Tetrakis(carbazol-9-yl)-4,6-dicyanobenzene", J. Phys. Chem. A., vol. 117 (2013) pp. 5607-5612.
Adachi et al., "High-efficiency red electrophosphorescence devices", Appl. Phys. Lett. vol. 78 (2001), pp. 1622-1624.
Kido et. al., "Bright red lightemitting organic electroluminescent devices having a europium complex as an emitter", Appl. Phys. Lett. vol. 65 (1994), pp. 2124-2126.
Kido et al., "Electroluminescence in a Terbium Complex", Chem. Lett. (1990) pp. 657-660.
Johnson et. al., "Luminescent Iridium(I), Rhodium(I), and Platinum(II) Dithiolate Complexes", JACS (1983) vol. 105, pp. 1795-1802.
Wrighton et al., "The Nature of the Lowest Excited State in Tricarbonylchloro-1, 10-phenanthrolinerhenium(I) and Related Complexes", JACS vol. 96 (1974) pp. 998-1003.
Ma, et. al., "Electroluminescence from triplet metal-ligand charge-transfer excited state of transition metal complexes", Synth. Metals vol. 94 (1998) pp. 245-248.
Baldo, et al., "High-efficiency fluorescent organic light-emitting devices using a phosphorescent sensitizer", Nature vol. 403, (2000), pp. 750-753.
Kipphan (Handbook of Print Media: Technologies and Production Methods), ISBN 3-540-67326-1,Chapter 1.3, pp. 40-67, Chapter 1.5, pp. 117-144, Chapter 5.5, pp. 711-730.
Bulovic et. al., "Transparent light-emitting devices", Nature, vol. 380 (1996) pp. 29.
Gu et. al., "Transparent organic light emitting device", Appl. Phys. Lett. vol. 68 (1996) pp. 2606-2608.
European Application No. 17874343.1, "European Search Report" dated Oct. 28, 2019, 7 pages.
Chinese Patent Application 2017800595659 "First Office Action", dated Jul. 28, 2020, 8 pages.

(56) References Cited

OTHER PUBLICATIONS

International Search Report received in PCT/CN2017/112716, dated Feb. 9, 2018.
Otsuki, Eiji, et al., "Vapor Deposition Polymerization of Vinyl Compounds and Fabrication of OLED Having Double Emmissive Layers", Thin Solid Films, 2009, pp. 703-706.

* cited by examiner

HIGH POLYMER, MIXTURE CONTAINING SAME, COMPOSITION, ORGANIC ELECTRONIC COMPONENT, AND MONOMER FOR POLYMERIZATION

CROSS-REFERENCE TO RELATED APPLICATIONS

The present disclosure is the National Stage of International Application No. PCT/CN2017/112716, filed Nov. 23, 2017, entitled "HIGH POLYMER, MIXTURE CONTAINING SAME, COMPOSITION, ORGANIC ELECTRONIC COMPONENT, AND MONOMER FOR POLYMERIZATION", which claims priority to Chinese Patent Application No. 201611047040.7 entitled "exciplex, organic electronic device comprising the same and application thereof", filed on Nov. 23, 2016, which is incorporated by reference herein for all purposes.

TECHNICAL FIELD

The present disclosure relates to the field of electroluminescent materials, and in particular to a polymer, a mixture, a formulation, and an organic electronic device comprising the same, and a monomer for polymerization.

BACKGROUND

Organic light emitting diodes (OLEDs) have great potential in implementation of novel optoelectronic devices, such as in applications of flat panel displays and lighting, because of the synthetic diversity of organic semiconductor materials, the possibility of achieving large-area flexible devices, low manufacturing costs, and excellent optical and electrical properties. In order to improve the luminous efficiency of organic light-emitting diodes, various light-emitting material systems based on fluorescence and phosphorescence have been developed. The organic light-emitting diodes using phosphorescent materials have achieved quite a high performance, for example, almost an internal luminescence quantum efficiency of 100%. However, so far, the phosphorescent host materials which have a practical value are a bipolar transport compound or a co-host compound, and its material combination is relatively complicated, which cause imbalance between hole transport and electron transport when applied to the device, therefore, the lifetime of the phosphorescent device is short. Kim proposed the concept of exciplex as a phosphorescent host material, so that two different organic compounds can be used to form an intermediate state, i.e., an exciplex, to achieve a long lifetime of phosphorescent OLED devices. This can be achieved by the exciplex host material, see Kim et al., Adv. Mater., Vol 26, 5864, (2014).

In order to take full advantage of organic materials, it is desirable to prepare OLEDs at a low cost and in a large area by printing. Reported existing organic materials capable of forming an exciplex are small molecular materials, and have a relatively low molecular weight, which are not suitable for a printing process.

Therefore, novel material systems suitable for the printing has yet to be developed.

SUMMARY

In view of the aforementioned deficiencies of the prior art, it is an object of the present disclosure to provide a novel polymeric material to solve the problem that the conventional exciplex materials are not suitable for the printing process.

The technical solution of the present disclosure is as follows: A polymer includes a repeating unit represented by general formula (1), where n and m are integers greater than or equal to 1; $\min((LUMO(E1)-HOMO(E2), LUMO(E2)-HOMO(E1))\leq\min(E_T(E1), E_T(E2))+0.1$ eV, where LUMO(E1), HOMO(E1), and $E_T(E1)$ are energy levels of a lowest unoccupied molecular orbital, a highest occupied molecular orbital, and a triplet excited state of E1 group, respectively; LUMO(E2), HOMO(E2), and $E_T(E2)$ are energy levels of a lowest unoccupied molecular orbital, a highest occupied molecular orbital, and a triplet excited state of E2 group, respectively.

(1)

In one embodiment, a ratio of n:m in the polymer ranges from 3:7 to 7:3.

In one embodiment, the E1 group includes an electron-donating group D, and/or the E2 group includes an electron-accepting group. In one embodiment, the E1 group and/or the E2 group has a (HOMO–(HOMO–1)) greater than or equal to 0.3 eV. In some embodiments, the E1 group and the E2 group have a structural unit represented by the following general formula (I) or (II), respectively:

(I)

(II)

Ar is an aromatic or heteroaromatic structural unit. The electron-donating group D may be the same or different in multiple occurrences, and the electron-accepting group A may be the same or different in multiple occurrences. p and r are an integer between 1 and 6, and q and s are 0 or 1.

Another related but different polymer is represented by the following general formula (4), where n is an integer greater than or equal to 1:

(4)

Wherein, (HOMO–(HOMO–1)) of the E1 group is greater than or equal to 0.3 eV.

A polymerizable monomer including the above E1 group or the above E2 group, and combinations thereof are provided.

A formulation includes any of the aforementioned polymers and at least one organic solvent.

An application of any of the aforementioned polymers in an organic electronic device.

An organic electronic device includes at least any of the aforementioned polymers.

Advantageous effects: the polymers of the general formula (1) according to the present disclosure are prone to form an exciplex, which, when used for a phosphorescent host, can improve the efficiency of the device, while providing a better material solution for printing OLEDs due to better solubility in an organic solvent and good film forming performance. The polymers of the general formula (4) have high stability and are easy to be solution processed.

DETAILED DESCRIPTION OF EMBODIMENTS

In order to make the objects, technical solutions, and advantages of the present disclosure more clearly, the present disclosure will be further described in detail below with reference to the accompanying drawings and embodiments. It is understood that the specific examples described herein are merely illustrative of the disclosure and are not intended to limit the disclosure.

A polymer includes a repeating unit represented by general formula (1), where n and m are integers greater than or equal to 1; $\min((LUMO(E1)-HOMO(E2), LUMO(E2)-HOMO(E1)))\leq \min(E_T(E1), E_T(E2))+0.1$ eV, where LUMO(E1), HOMO(E1), and $E_T(E1)$ are energy levels of a lowest unoccupied molecular orbital, a highest occupied molecular orbital, and a triplet excited state of E1 group, respectively; LUMO(E2), HOMO(E2), and $E_T(E2)$ are energy levels of a lowest unoccupied molecular orbital, a highest occupied molecular orbital, and a triplet excited state of E2 group, respectively.

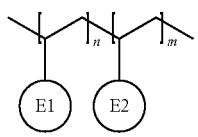

(1)

In one embodiment, $\min((LUMO(E1)-HOMO(E2), LUMO(E2)-HOMO(E1)))\leq \min(E_T(E1), E_T(E2))$;

In another embodiment, $\min((LUMO(E1)-HOMO(E2), LUMO(E2)-HOMO(E1)))\leq \min(E_T(E1), E_T(E2))-0.05$ eV;

In yet another embodiment, $\min((LUMO(E1)-HOMO(E2), LUMO(E2)-HOMO(E1)))\leq \min(E_T(E1), E_T(E2))-0.1$ eV;

In yet another embodiment, $\min((LUMO(E1)-HOMO(E2), LUMO(E2)-HOMO(E1)))\leq \min(E_T(E1), E_T(E2))-0.15$ eV;

In a further embodiment, $\min((LUMO(E1)-HOMO(E2), LUMO(E2)-HOMO(E1)))\leq \min(E_T(E1), E_T(E2))-0.2$ eV;

In embodiments of the present disclosure, triplet excited state energy level $E_T$, HOMO, and LUMO play a key role in the energy level structure of the organic material. The determination of these energy levels is introduced as follows.

HOMO and LUMO energy levels can be measured by photoelectric effects, such as XPS (X-ray photoelectron spectroscopy) and UPS (UV photoelectron spectroscopy), or by cyclic voltammetry (hereinafter referred to as CV). Recently, quantum chemical methods, such as density functional theory (hereinafter referred to as DFT), have also become effective methods for calculating molecular orbital energy levels.

The triplet excited state energy level $E_T$ of an organic material can be measured by a low-temperature time-resolved spectroscopy or by quantum simulation calculation (for example, by Time-dependent DFT), such as by commercial software Gaussian 03W (Gaussian Inc.). Detailed simulation methods can be found in WO2011141110 or as described below in the examples.

It should be noted that the absolute values of HOMO, LUMO, and $E_T$ depend on the measurement method or calculation method used, and even for the same method but different evaluation method, for example, different HOMO/LUMO value can be provided at the starting point and peak point on a CV curve. Therefore, a reasonable and meaningful comparison should be carried out using the same measurement method and the same evaluation method. As described in the embodiments of the present disclosure, the values of HOMO, LUMO, and $E_T$ are simulations based on Time-dependent DFT, without affecting the application of other measurement or calculation methods.

The polymer according to the present disclosure has an advantage that the E1 group and the E2 group are linked as a side chain structure through a non-conjugated polymer backbone to achieve a higher molecular weight while maintaining the energy structure of a single repeating unit, that is, HOMO, LUMO, and $E_T$ of the single repeating unit remain substantially unchanged relative to the E1 group or the E2 group, while forming an exciplex in the polymer.

In the disclosure, (HOMO−1) is defined as an energy level of the second highest occupied molecular orbital, (HOMO−2) is an energy level of the third highest occupied molecular orbital, and so on. (LUMO+1) is defined as an energy level of the second lowest unoccupied molecular orbital, (LUMO+2) is an energy level of the third lowest occupied molecular orbital, and so on.

In the present disclosure, a repeating unit in which the E1 group is located is defined as a repeating unit E1, and a repeating unit in which the E2 group is located is defined as a repeating unit E2. Generally, a ratio n:m between the number of the repeating units E1 and the number of the repeating units E2 in the polymer ranges from 3:7 to 7:3.

In one embodiment, the ratio n:m between the number of the repeating units E1 and the number of the repeating units E2 in the polymer ranges from 4:6 to 7:3. In another embodiment, the ratio ranges from 4:6 to 6:4. In yet another embodiment, the ratio ranges from 5:5 to 6:4. In a further embodiment, the ratio is 5:5.

In order to improve the solubility and processability of the polymer, an additional group R is generally attached to the backbone of the polymer to increase the solubility of the polymer while increasing the molecular weight of the polymer to provide better luminescence performance and device performance. In one embodiment, the polymer according to the present disclosure includes a repeating unit represented by general formula (2).

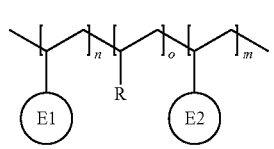

(2)

R is selected from the group consisting of a linear alkane containing 1 to 15 carbon atoms, a branched alkane containing 1 to 15 carbon atoms, a cycloalkane containing 1 to 15 carbon atoms, an aromatic ring system containing 2 to 20 carbon atoms, a heteroaromatic ring system containing 2 to 20 carbon atoms, and a non-aromatic ring system containing 2 to 20 carbon atoms. o is an integer greater than or equal to 0.

In one embodiment, R is a structural unit selected from an organic functional material, and the organic functional material may be selected from the group consisting of HTM, ETM, a fluorescent material, a phosphorescent material, and a host material.

In another embodiment, R is a structural unit selected from a fluorescent material or a phosphorescent material.

According to the polymer of the present disclosure, an exciplex can be formed between the repeating unit E1 and the repeating unit E2, and can be used as a host material or an emitter in the light-emitting layer. When it is used as the host material, in some embodiments, the exciplex formed by the repeating unit E1 and the repeating unit E2 has a proportion in the polymer ranging from 70% to 99.9%.

In one embodiment, the repeating unit E1 or the repeating unit E2 may be present in an amount of from 30 mol % to 50 mol % in the polymer. In another embodiment, the repeating unit E1 or the repeating unit E2 may be present in an amount of from 35 mol % to 50 mol % in the polymer. In yet another embodiment, the repeating unit E1 or the repeating unit E2 may be present in an amount of from 40 mol % to 50 mol % in the polymer. In still another embodiment, the repeating unit E1 or the repeating unit E2 may be present in an amount of from 40 mol % to 48 mol % in the polymer. In a further embodiment, the repeating unit E1 or the repeating unit E2 may be present in an amount of from 41 mol % to 46 mol % in the polymer.

In one embodiment, the R group in the general formula (2) further includes an emitter unit. In some embodiments, the repeating unit R may be present in an amount of from 0.1 mol % to 30 mol % in the polymer. In the present disclosure, a repeating unit where the R group is located is defined as the repeating unit R.

In another embodiment, the repeating unit R containing the emitter may be present in an amount of from 1 mol % to 52 mol % in the polymer. In yet another embodiment, the repeating unit R containing the emitter may be present in an amount of from 2 mol % to 20 mol % in the polymer. In still another embodiment, the repeating unit R containing the emitter may be present in an amount of from 3 mol % to 81 mol % in the polymer. In still another embodiment, the repeating unit R containing the emitter may be present in an amount of from 4 mol % to 61 mol % in the polymer. In a further embodiment, the repeating unit R containing the emitter may be present in an amount of from 5 mol % to 15 mol % in the polymer.

In the present disclosure, the host material, the matrix material, Host material, and Matrix material have the same meaning and are interchangeable. Singlet and singlet state have the same meaning and can be interchanged. Triplet and triplet excited state have the same meaning and can be interchangeable.

As used herein, the term "small molecule" refers to a molecule that is not a polymer, oligomer, dendrimer, or blend. In particular, there is no repeating structure in the small molecule. The small molecule has a molecular weight less than or equal to 3000 g/mol. In another embodiment, the molecular weight≤2000 g/mol. In yet another embodiment, the molecular weight≤1500 g/mol.

The polymer includes a homopolymer, a copolymer, and a block copolymer. In addition, in the present disclosure, the polymer also includes a dendrimer. Regarding the synthesis and application of the dendrimer, see [Dendrimers and Dendrons, Wiley-VCH Verlag GmbH & Co. KGaA, 2002, Ed. George R. Newkome, Charles N. Moorefield, Fritz Vogtle.].

The backbone of the conjugated polymer is mainly composed of $sp^2$ hybrid orbital of carbon (C) atoms. Famous examples are: polyacetylene and poly(phenylene vinylene). The C atom on the backbone thereof can also be substituted by other non-C atoms, and it is still considered to be a conjugated polymer when the $sp^2$ hybridization on the backbone is interrupted by some natural defects. In addition, in the present disclosure, the conjugated polymer further includes aryl amine, aryl phosphine and other heteroarmotics, organometallic complexes, and the like. The polymer according to the present disclosure may also be a non-conjugated polymer.

In some embodiments, according to the polymer of the present disclosure, at least one of the E1 group and the E2 group has a ((HOMO−(HOMO−1)) greater than or equal to 0.2 eV. In one embodiment, the ((HOMO−(HOMO−1)) is greater than or equal to 0.25 eV. In another embodiment, the ((HOMO−(HOMO−1)) is greater than or equal to 0.3 eV. In yet another embodiment, the ((HOMO−(HOMO−1)) is greater than or equal to 0.35 eV. In still another embodiment, the ((HOMO−(HOMO−1)) is greater than or equal to 0.4 eV. In a further embodiment, the ((HOMO−(HOMO−1)) is greater than or equal to 0.45 eV. It's facilitated to the stability of the hole transport when Δ((HOMO−(HOMO−1)) of the E1 group and/or the E2 group is larger.

In one embodiment, the E1 group contains one or more of the structural units represented by the following formulas (2) to (9):

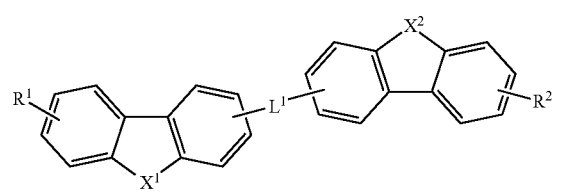

(2)

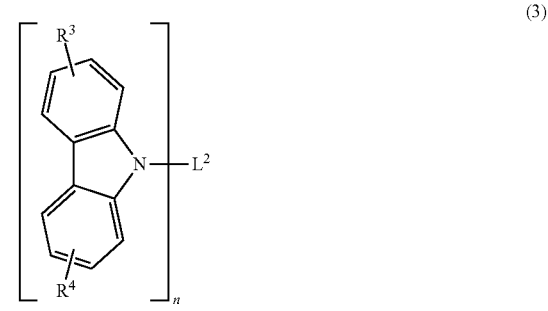

(3)

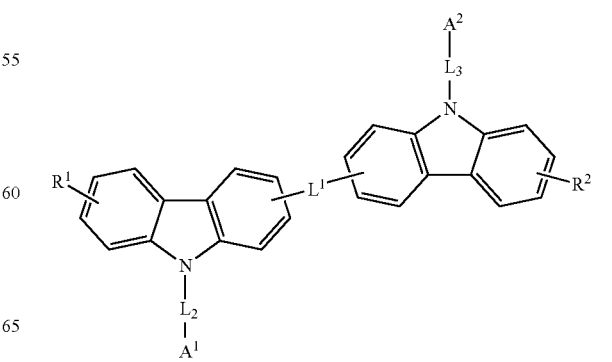

(4)

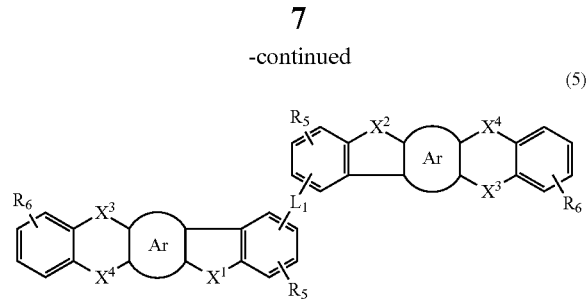
(5)

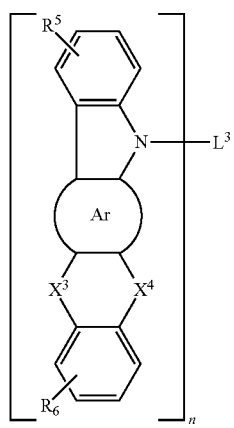
(6)

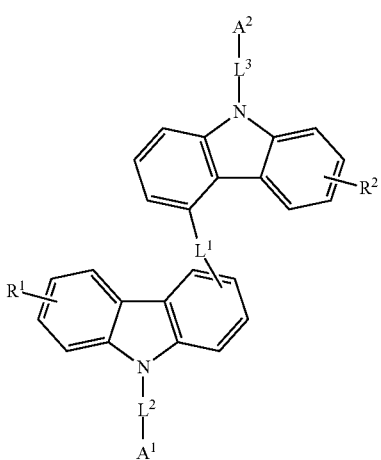
(7)

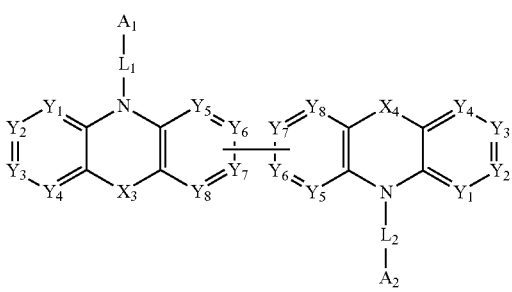
(8)

(9)

Wherein, $L^1$ represents a single bond, an aromatic group containing 6 to 30 carbon atoms or a heteroaromatic group containing 3 to 30 carbon atoms, and $L^1$ may be linked to any carbon atom on the benzene ring;

Ar, $Ar_1$, and $Ar_2$ independently represent an aromatic group containing 6 to 30 carbon atoms or a heteroaromatic group containing 3 to 30 carbon atoms;

$A^1$ and $A^2$ independently represent an aromatic group containing 6 to 30 carbon atoms or a heteroaromatic group containing 3 to 30 carbon atoms;

$L^2$ and $L^3$ independently represent an aromatic group containing 6 to 30 carbon atoms or a heteroaromatic group containing 3 to 30 carbon atoms;

$X^1$ and $X^2$ independently represent N(R), $C(R)_2$, $Si(R)_2$, O, C=N(R), C=$C(R)_2$, P(R), P(=O)R, S, S=O, or $SO_2$;

$X^3$ and $X^4$ independently represent a single bond, N(R), $C(R)_2$, $Si(R)_2$, O, C=N(R), C=$C(R)_2$, P(R), P(=O)R, S, S=O, or $SO_2$, but cannot be single bonds at the same time;

$Y^1$ to $Y^8$ independently represent N(R), $C(R)_2$, $Si(R)_2$, O, C=N(R), C=$C(R)_2$, P(R), P(=O)R, S, S=O, or $SO_2$;

$R^1$, $R^2$, $R^3$, $R^4$, $R^5$, $R^6$, and R independently represent H, D (deuterium atom), F, CN, alkenyl, alkynyl, nitrile, amino, nitro, acyl, alkoxy, carbonyl, sulfone, an alkyl containing 1 to 30 carbon atoms, a cycloalkyl containing 3 to 30 carbon atoms, an aryl containing 6 to 60 carbon atoms, or an aromatic heterocyclic group containing 3 to 60 carbon atoms. $R^1$, $R^2$, $R^3$, $R^4$, $R^5$, and $R^6$ may be linked to any carbon atom on the fused ring.

n represents an integer from 1 to 6.

In one embodiment, according to the polymer of the present disclosure, the E1 group contains an electron-donating group D and/or the E2 group contains an electron-accepting group A.

In another embodiment, according to the polymer of the present disclosure, the E1 group contains a structural unit represented by general formula I:

$$[D]_p[Ar]_q \quad (I)$$

Ar is an aromatic or heteroaromatic structural unit, and D may be independently selected from the same or different electron-donating groups in multiple occurrences. p is an integer between 1 and 6, and q is 0 or 1.

Suitable electron-donating groups D may be selected from groups having any basic structure of the following general formulas I-1, 1-2, and 1-3:

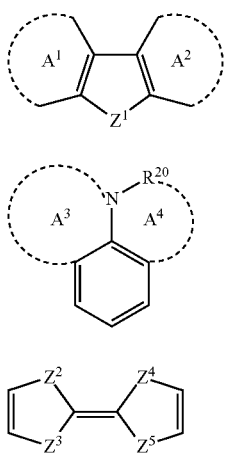

I-1

I-2

I-3

$Z^1$ is H, O, S, or Si, and $A^1$ and $A^2$ may independently form an aromatic ring, a heteroaromatic ring, an aliphatic ring, or a non-aromatic heterocyclic ring, respectively. $R^{20}$ represents H, aryl, or an atomic group necessary to form a ring represented by $A^4$. $A^3$ and $A^4$ may also independently form a heteroaromatic ring or a non-heteroaromatic ring, respectively. $Z^2$, $Z^3$, $Z^4$, and $Z^5$ independently represent O or S, respectively.

In one embodiment, the aforementioned electron-donating group D is selected from groups having at least one of basic structures of the following structural formulas D1 to D15:

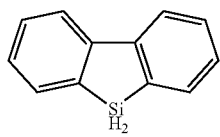

D1

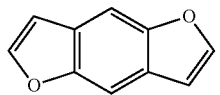

D2

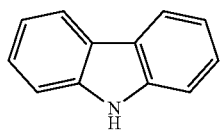

D3

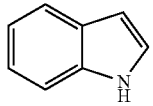

D4

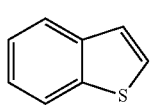

D5

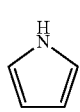

D6

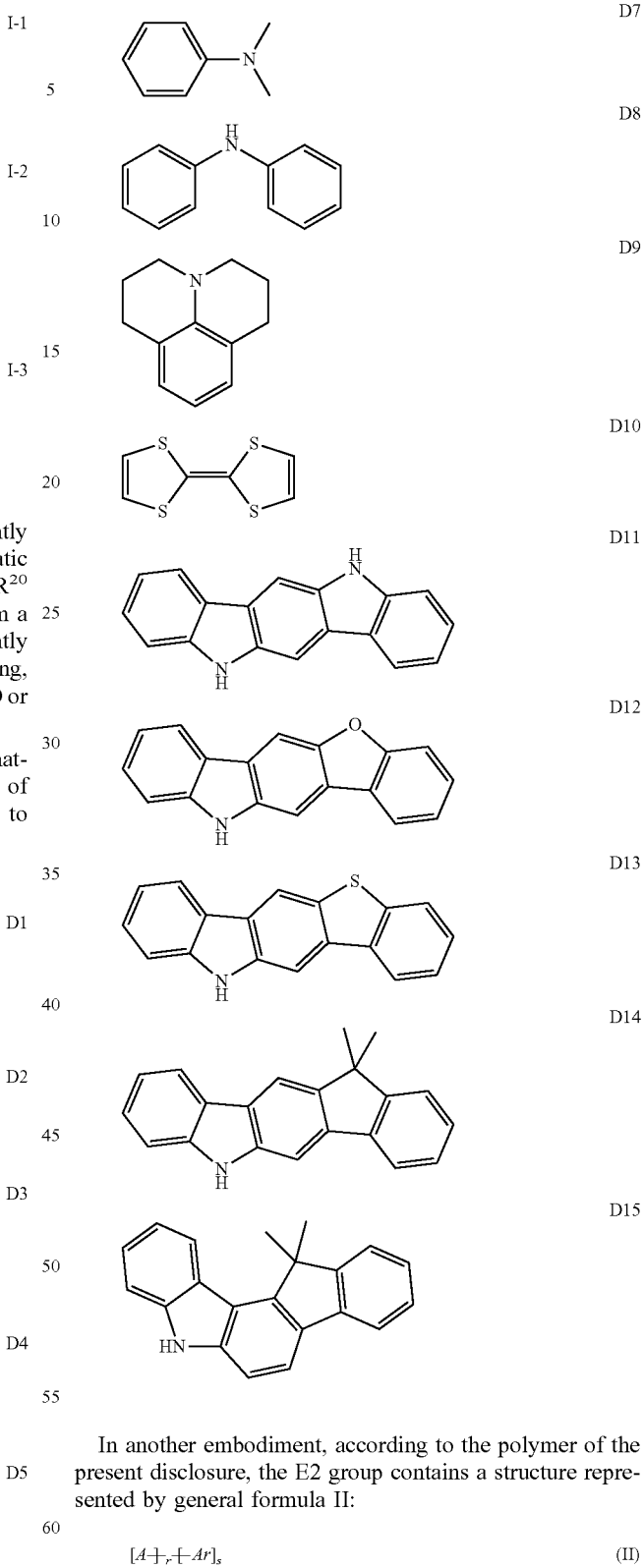

In another embodiment, according to the polymer of the present disclosure, the E2 group contains a structure represented by general formula II:

$$[A]_r[Ar]_s \quad (II)$$

Ar is an aromatic or heteroaromatic structural unit, and the electron-accepting group A may be independently selected from the same or different electron-accepting groups in multiple occurrences. r is an integer between 1 and 6, and s is 0 or 1.

In one embodiment, suitable electron-accepting groups A may be selected from F, a cyano group, or at least one of groups having any basic structure of the following general formulas:

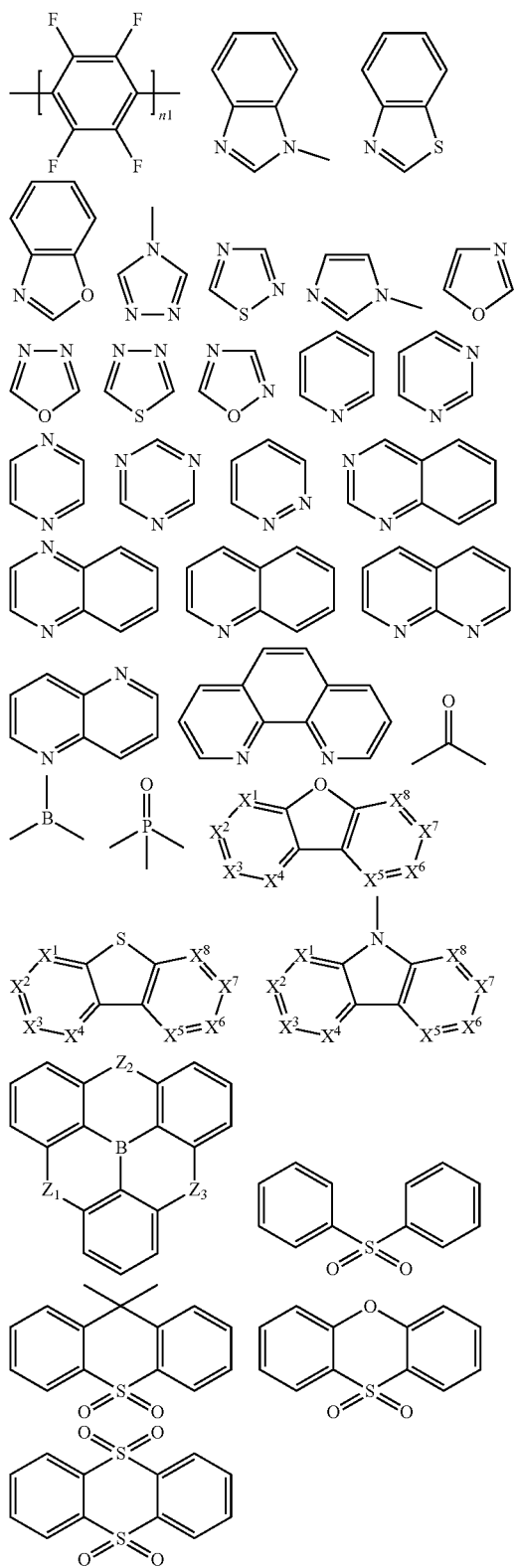

n1 is an integer from 1 to 3. $X^1$ to $X^8$ are selected from $CR^{12}$ or N, and at least one of $X^1$ to $X^8$ is N. $R^{12}$ may be selected from the group consisting of hydrogen, alkyl, alkoxy, amino, alkenyl, alkynyl, aralkyl, heteroalkyl, aryl, and heteroaryl. $Z_1$ to $Z_3$ are a single bond, $C(R^{12})_2$, O, or S. When the electron-accepting group A is F or a cyano group, s is 1.

In one embodiment, the suitable electron-accepting group A is selected from a cyano group, and s is 1.

In one embodiment, according to the polymer of the present disclosure, Ar in the general formula I and the general formula II is selected from groups as follows:

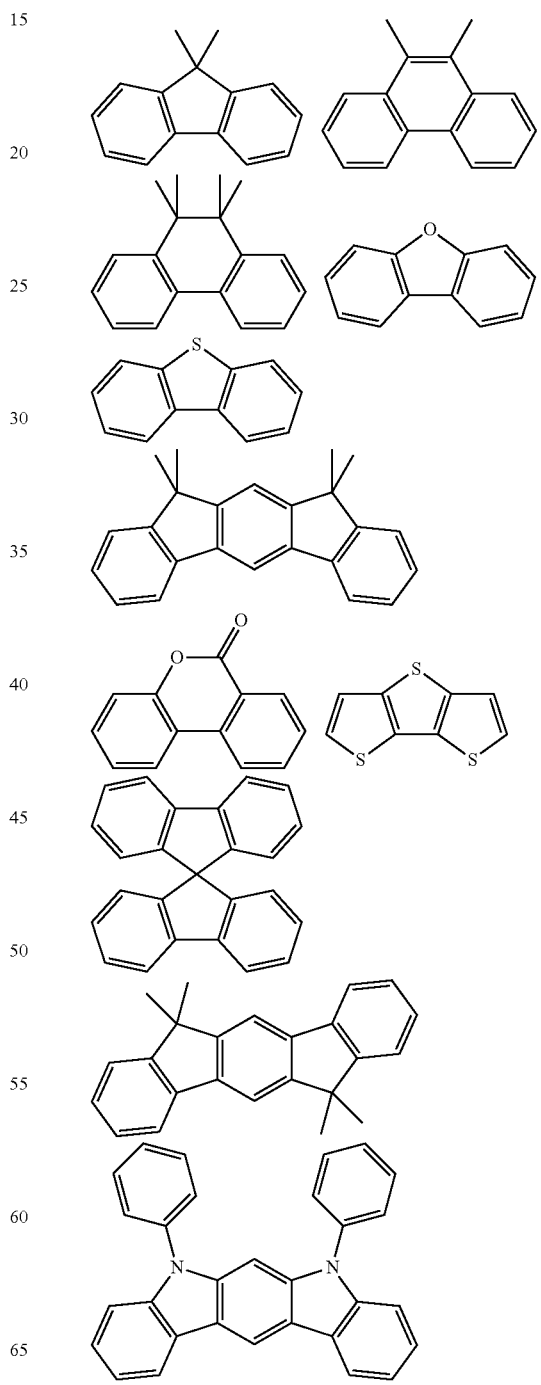

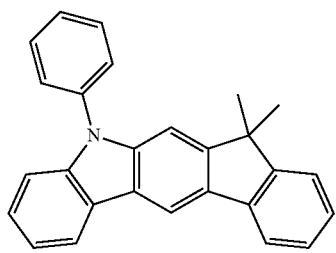
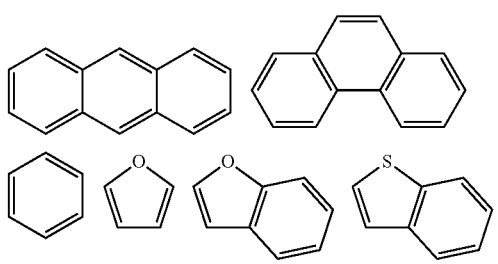
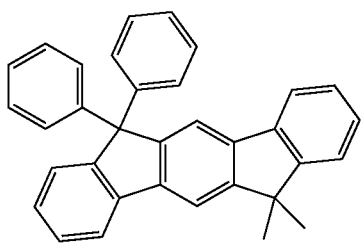
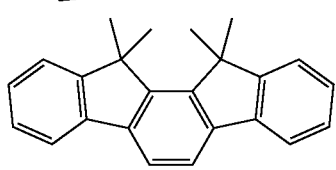
n2 is 1, 2, 3, or 4. Ar in the general formula I and the general formula II may be the same or different.
Examples of structural units that can be used for the E1 group in the polymer according to the present disclosure are:
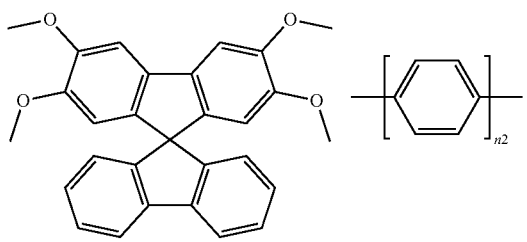
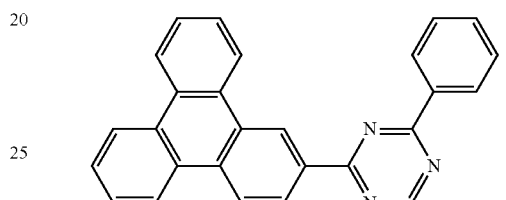
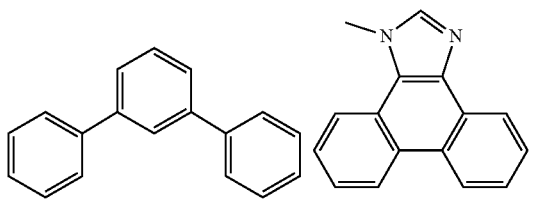
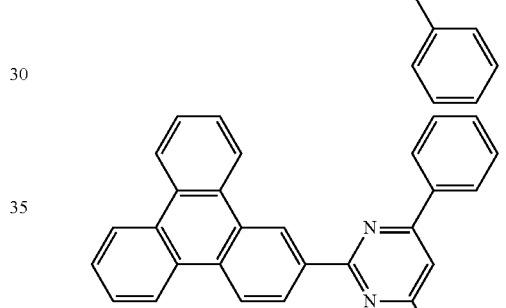
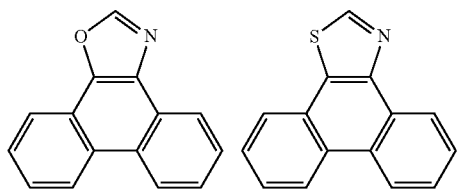
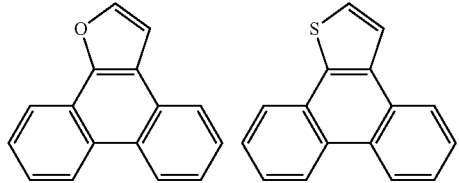
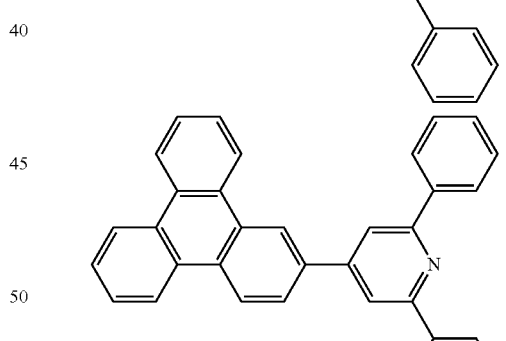
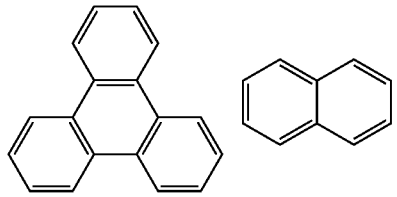
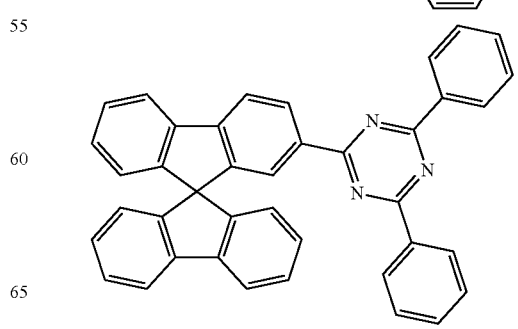

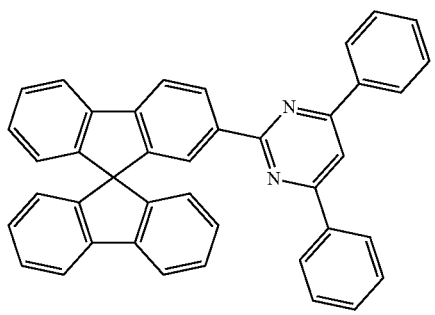
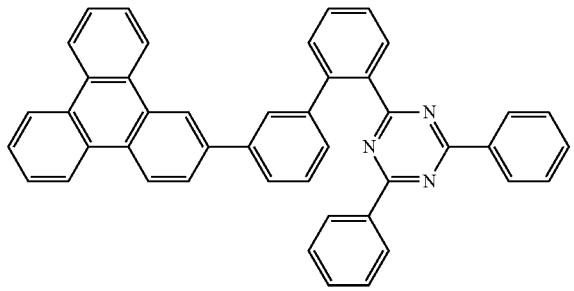
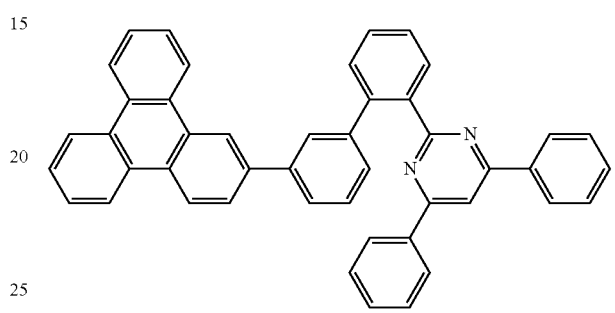
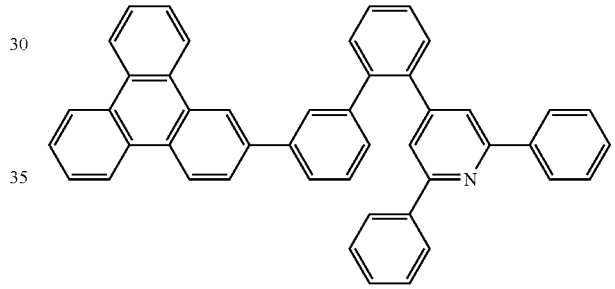
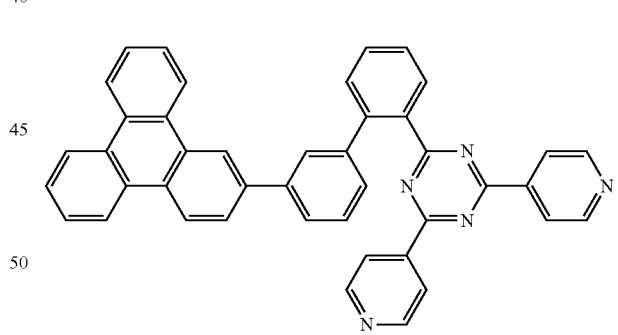
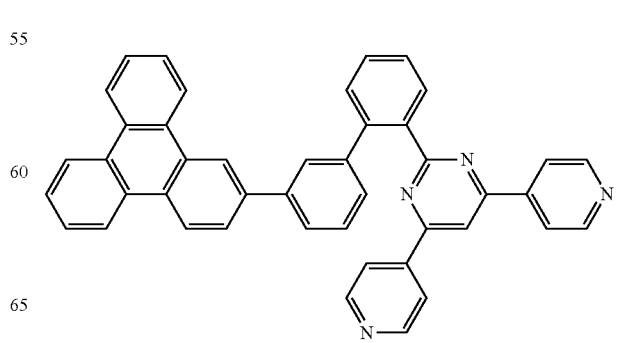

-continued
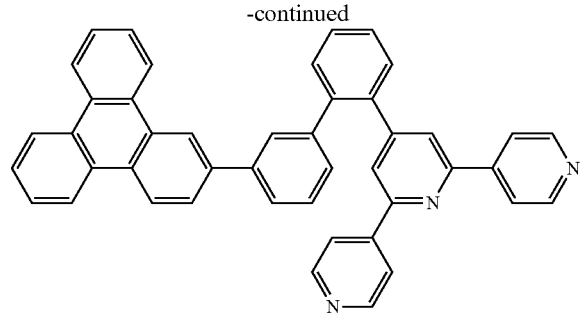
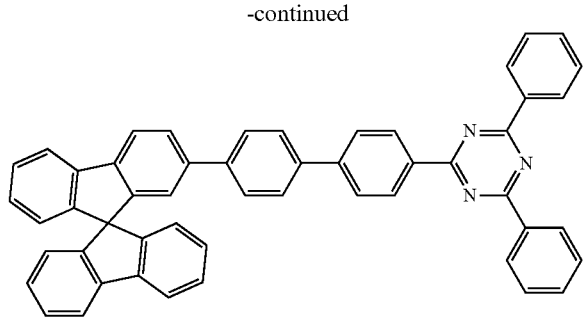
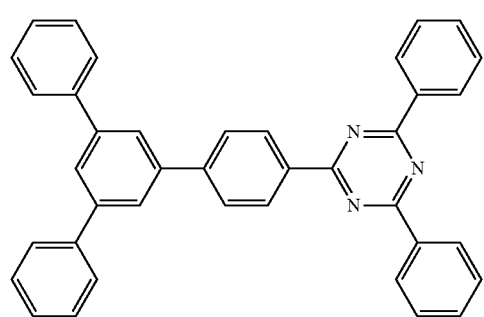
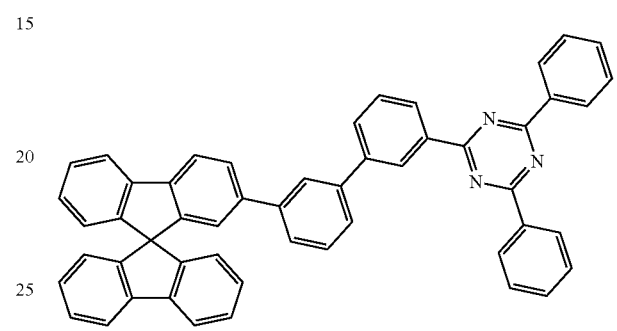
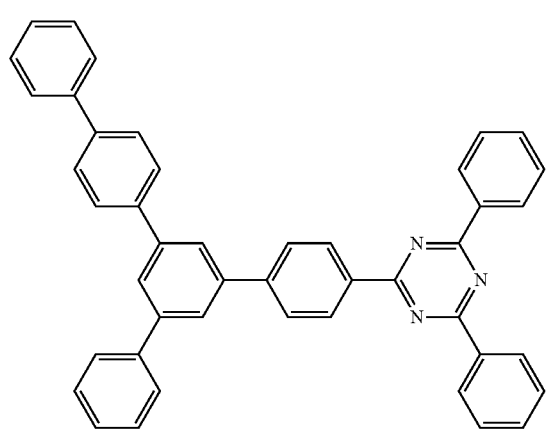
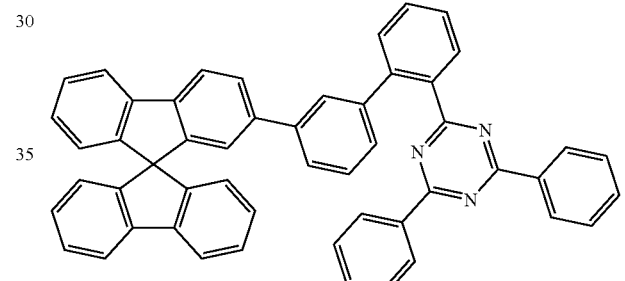
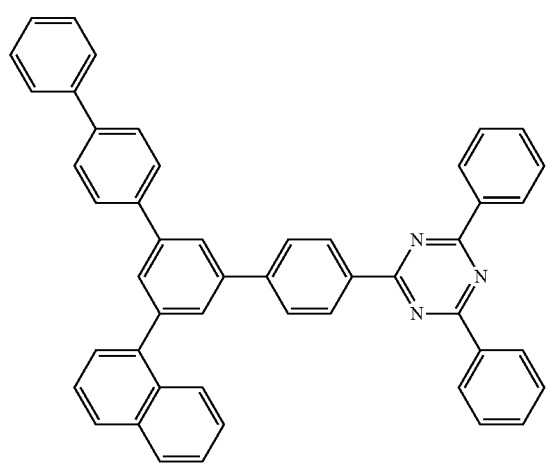
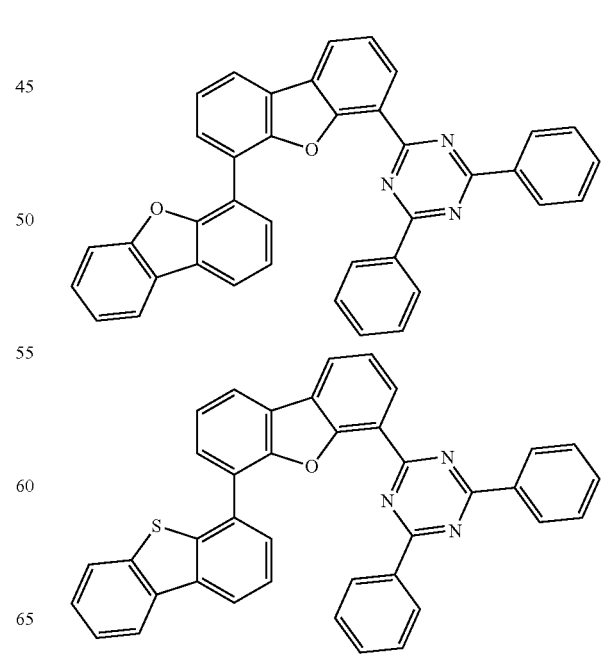

-continued
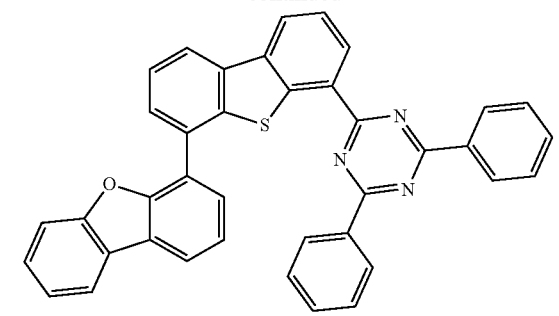
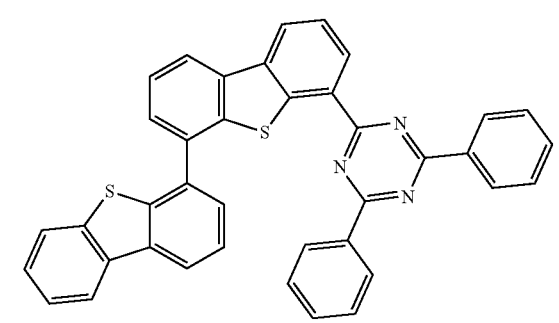
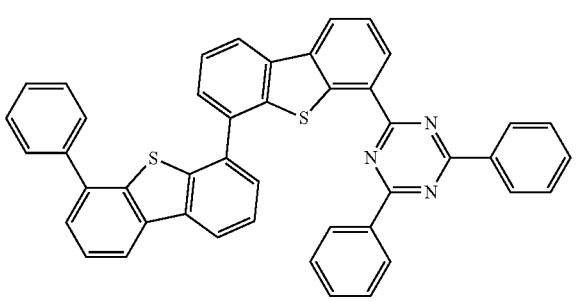
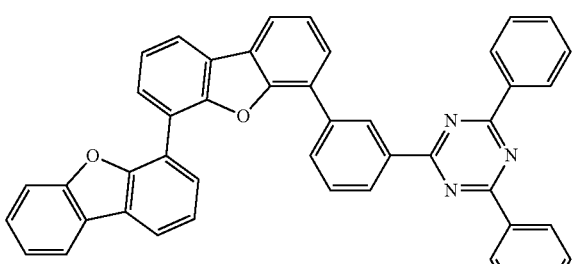
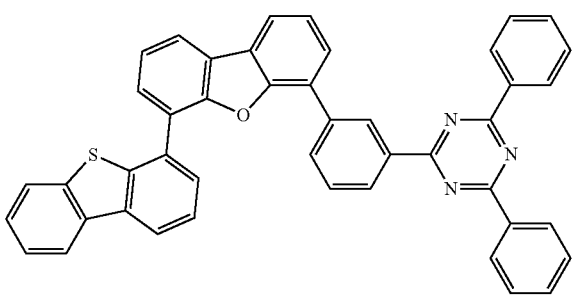
-continued
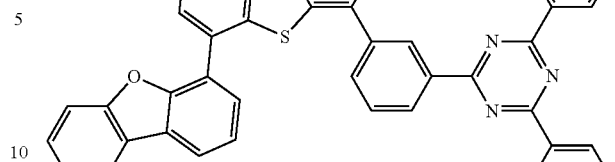
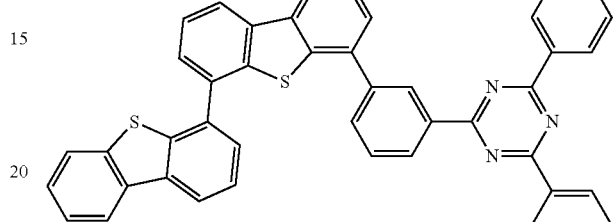
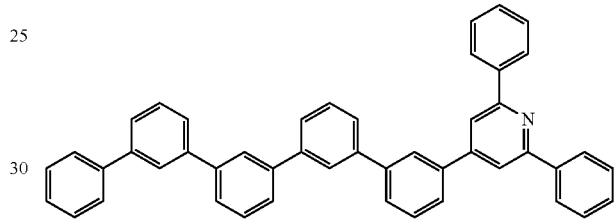
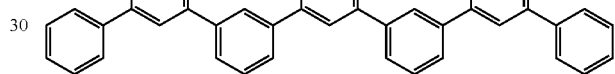
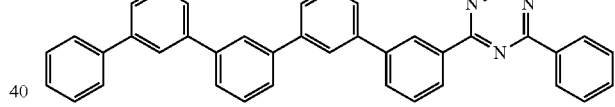
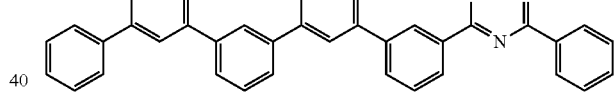
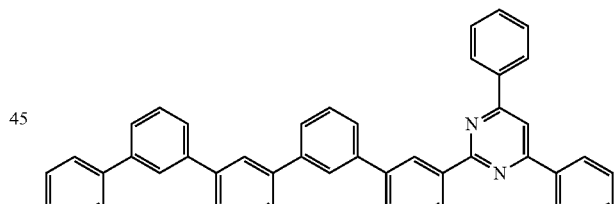
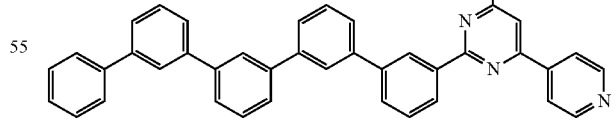
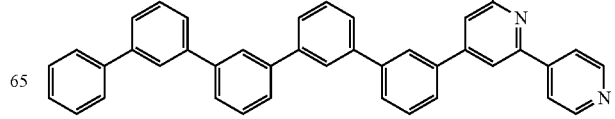

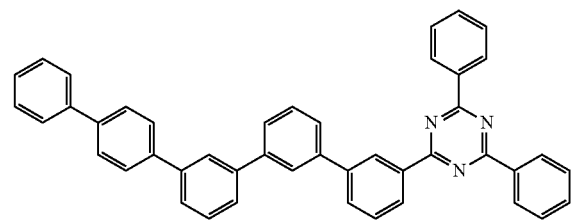
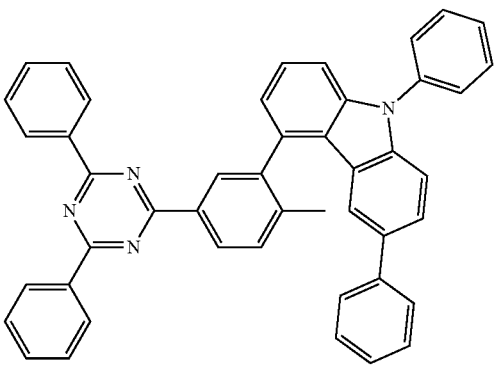
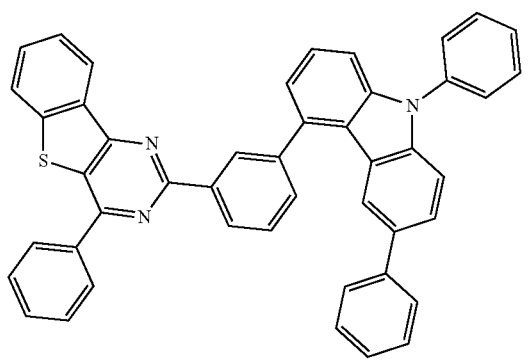
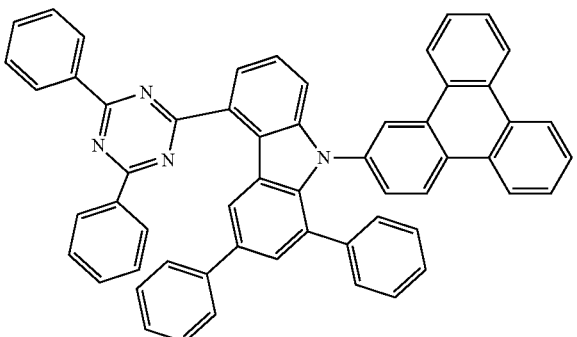
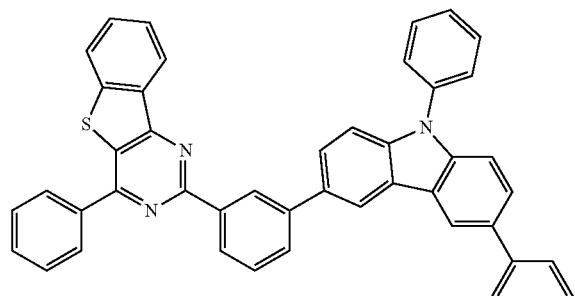
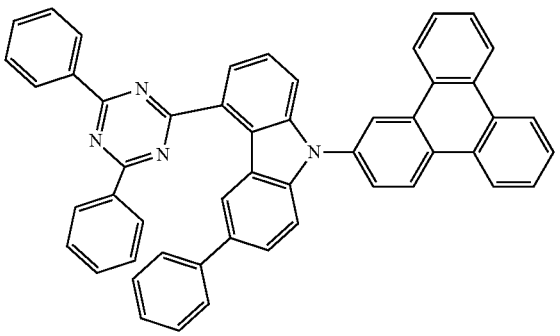
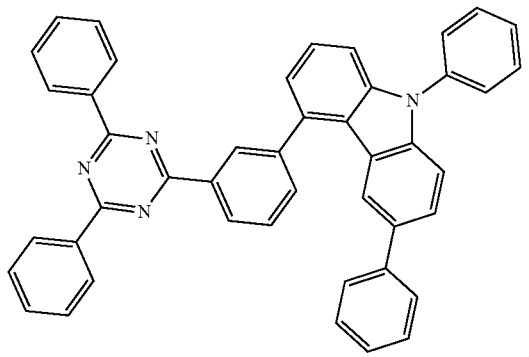
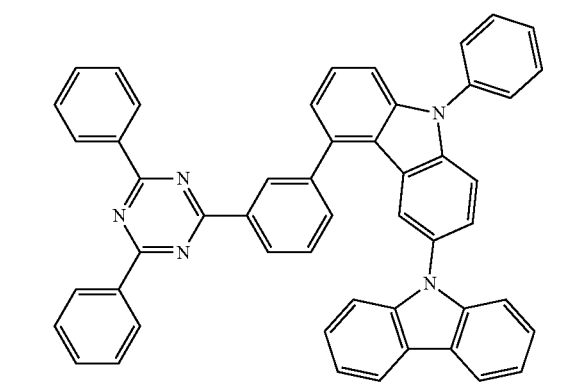
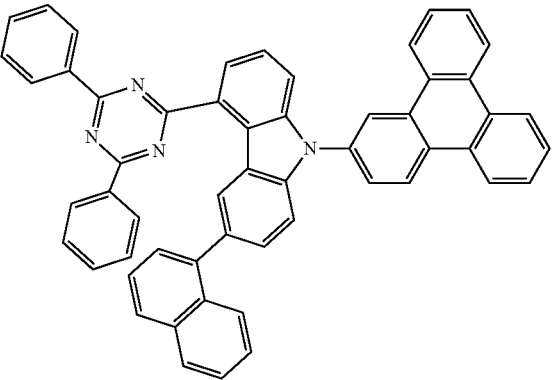

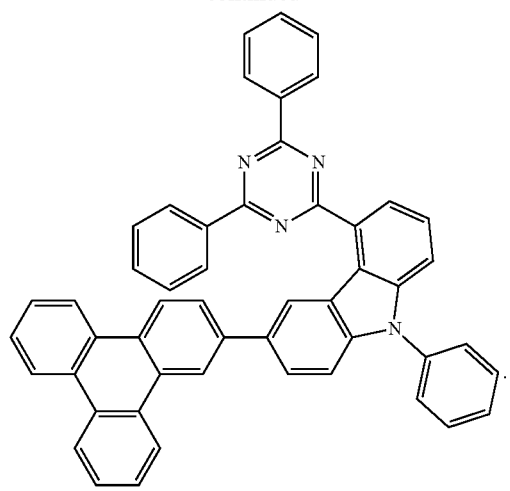
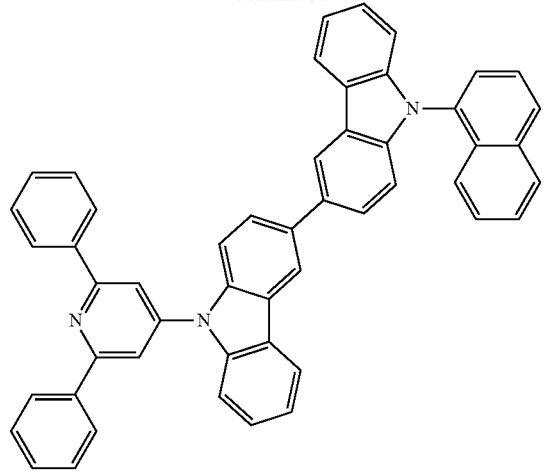
In one embodiment, examples of structural units that can be used for the E2 group in the polymer according to the present disclosure are:
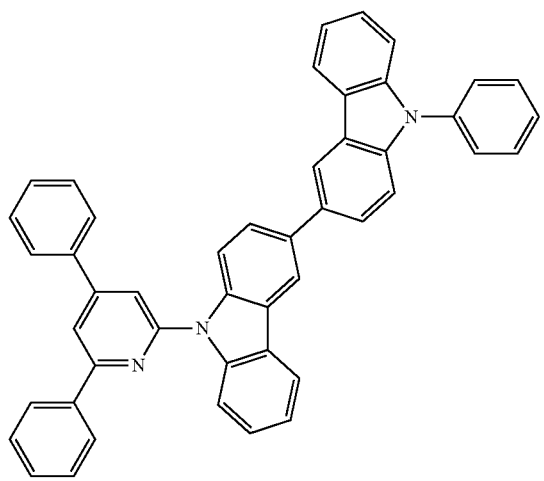
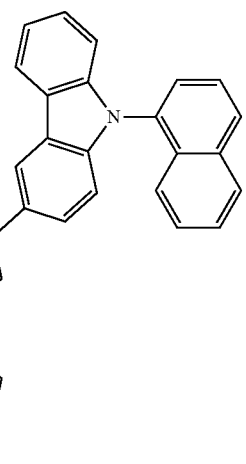
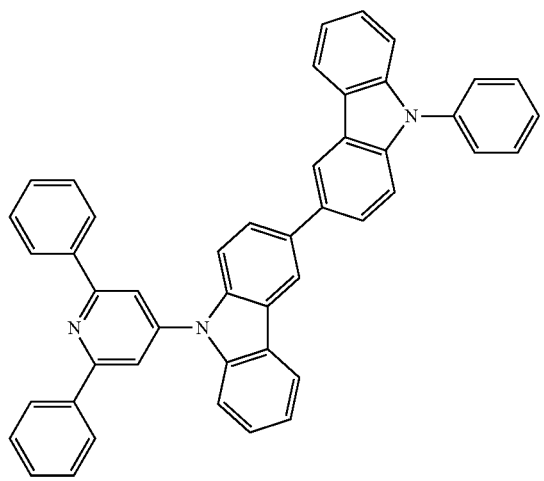
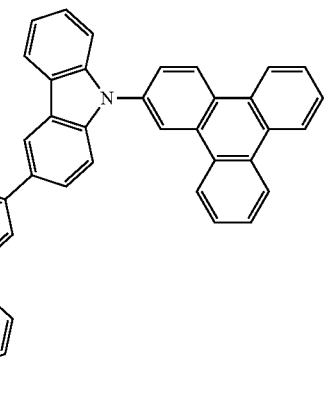

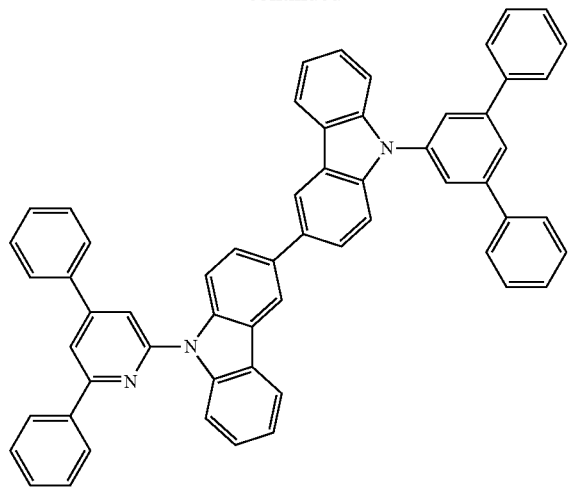
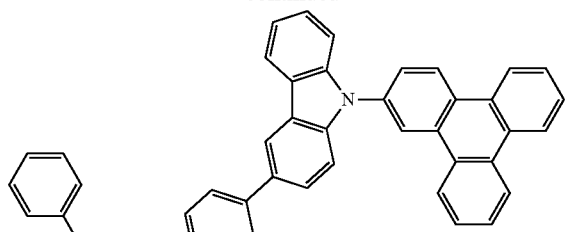
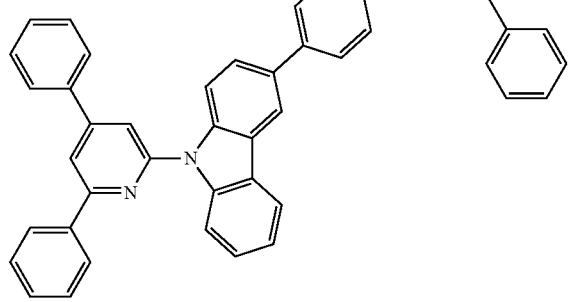
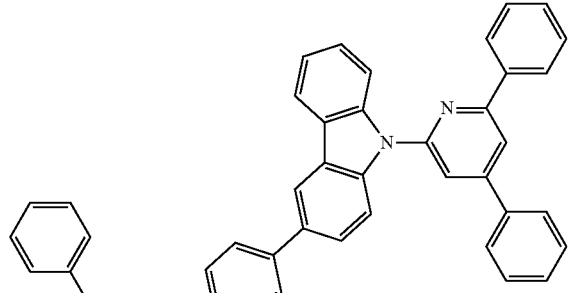
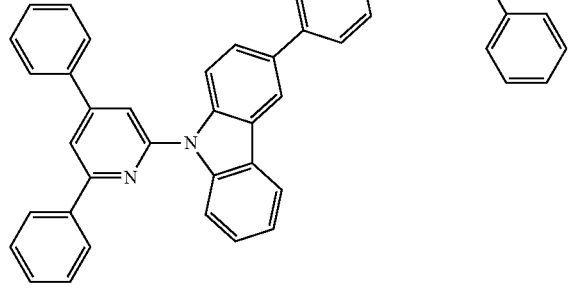
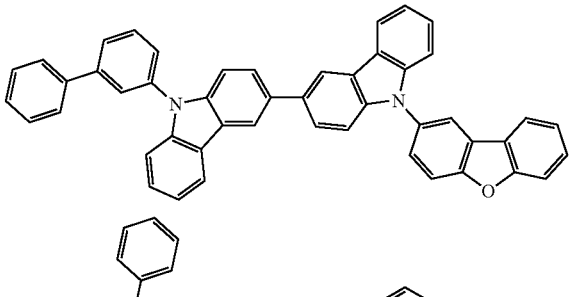
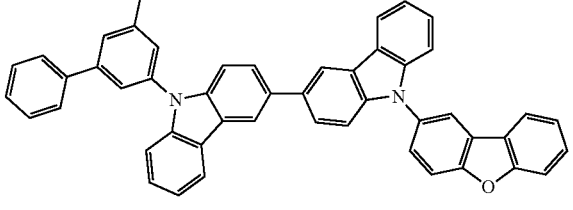

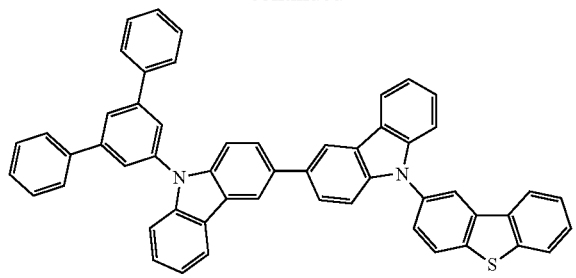
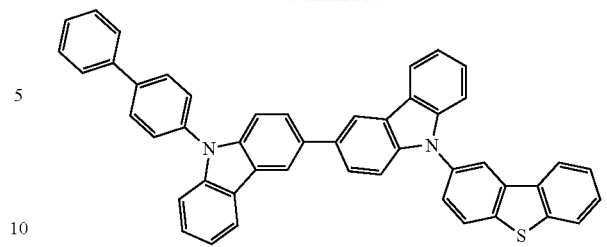
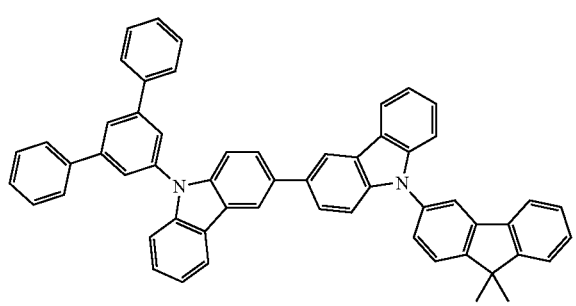
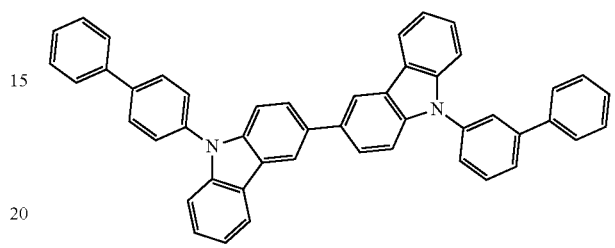
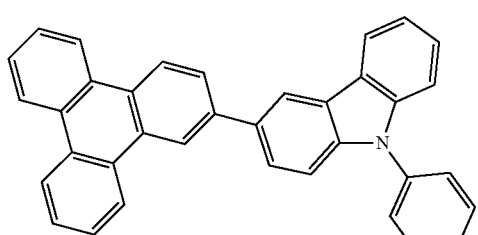
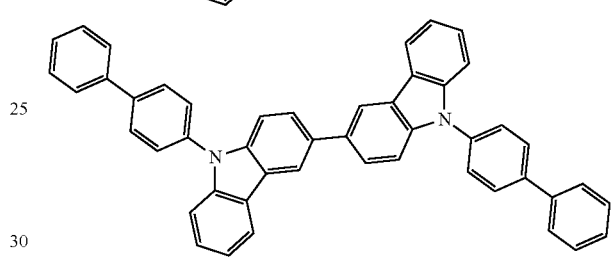
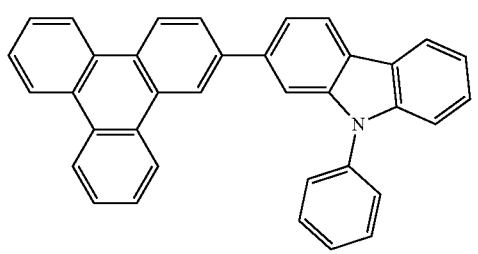
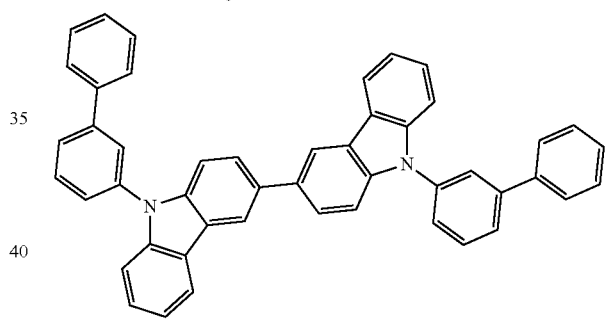
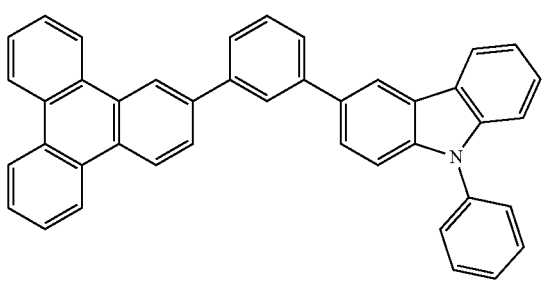
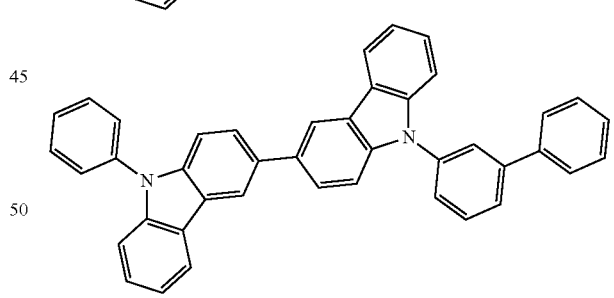
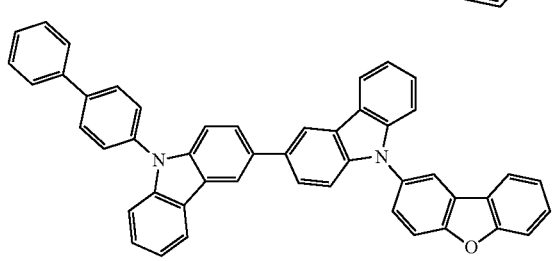
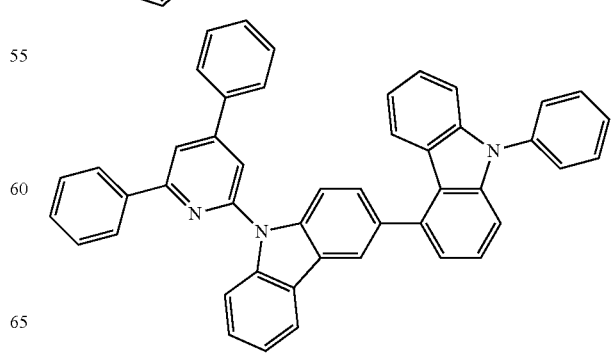

-continued
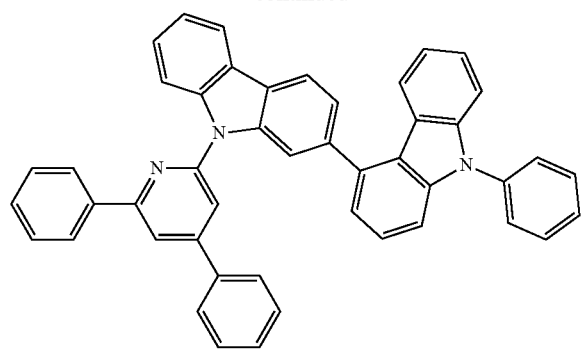
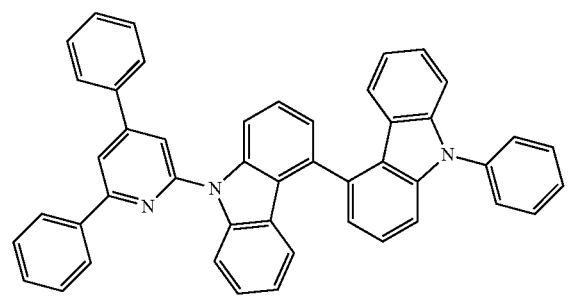
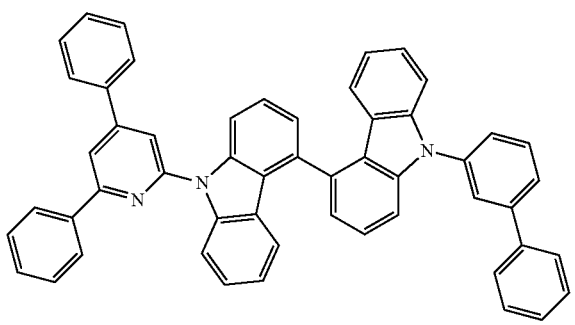
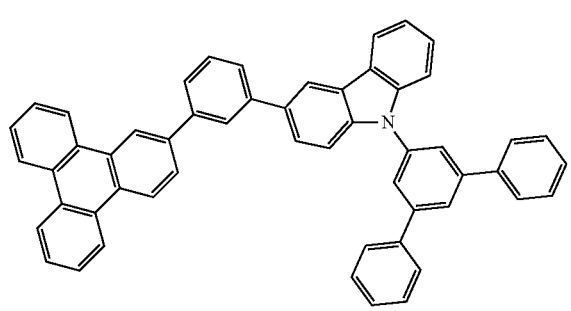
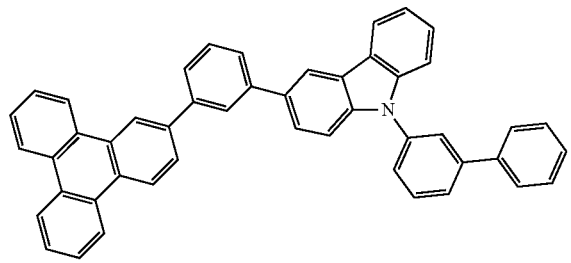
-continued
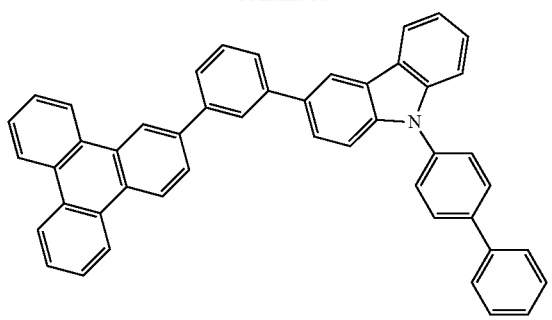
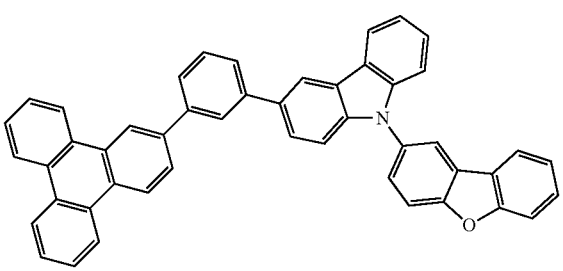
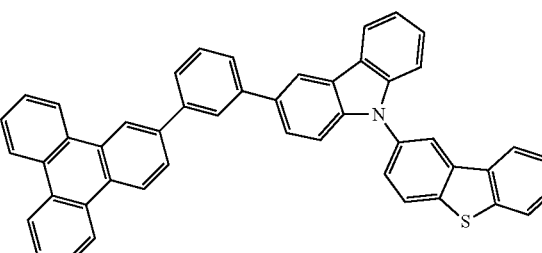
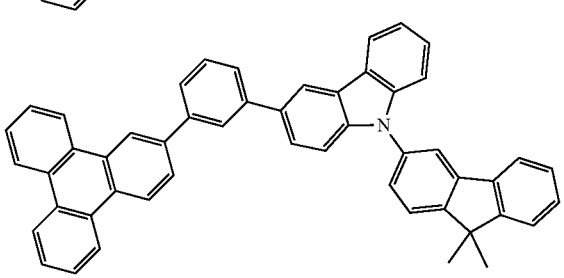
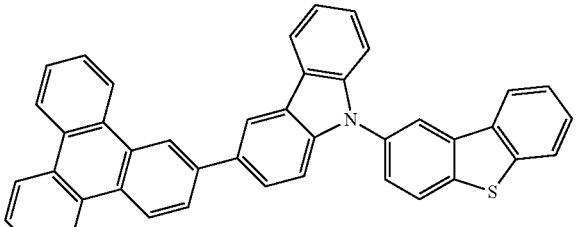
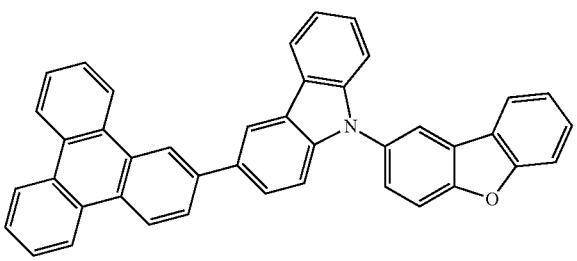

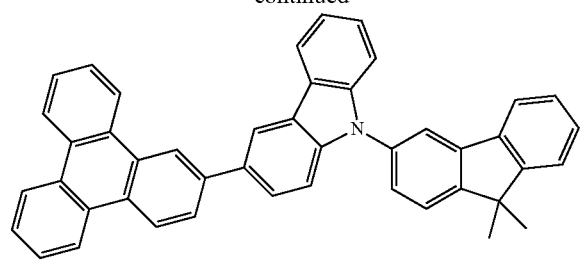
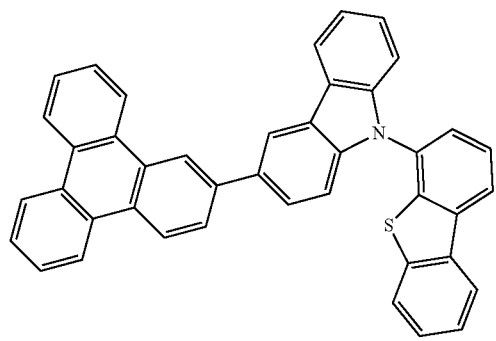
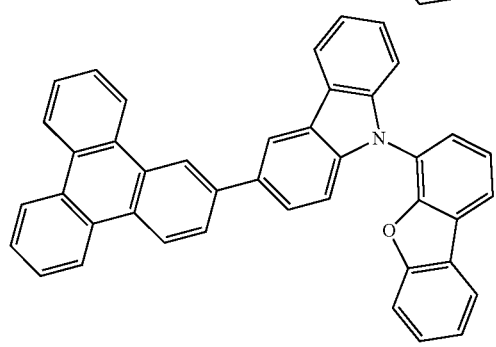
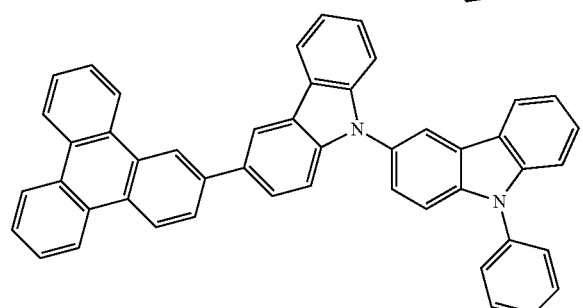
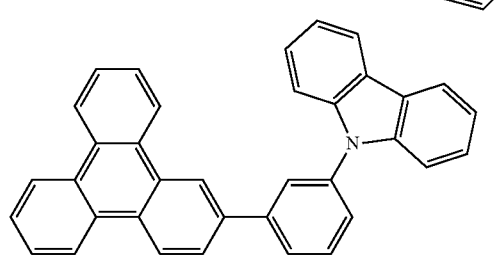
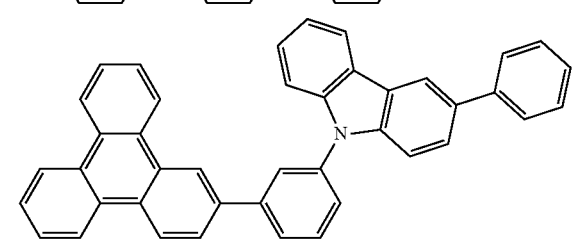
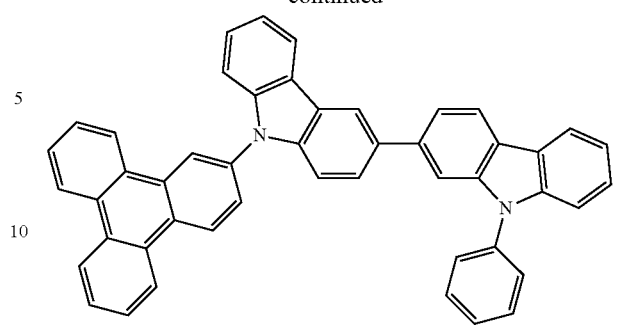
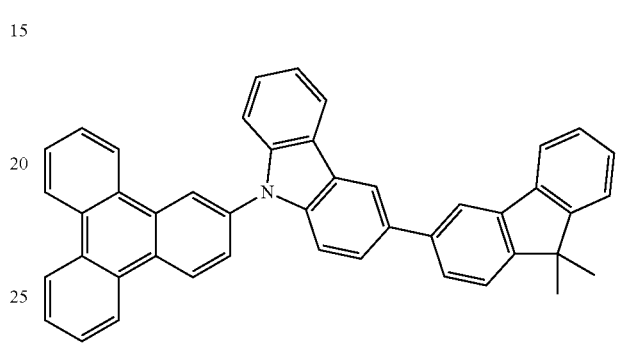
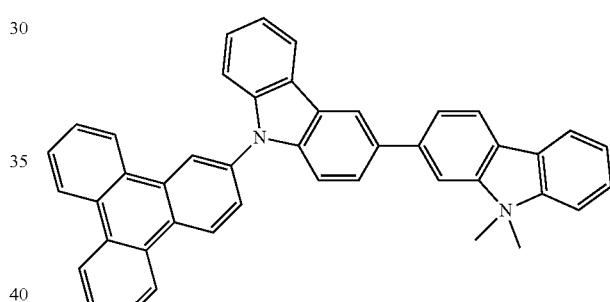
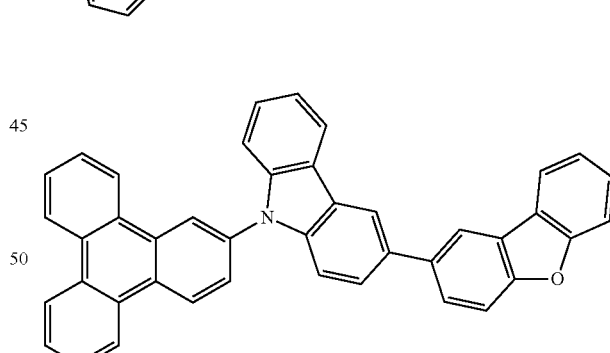
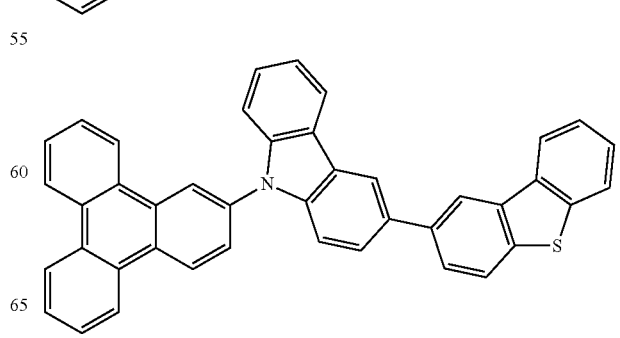

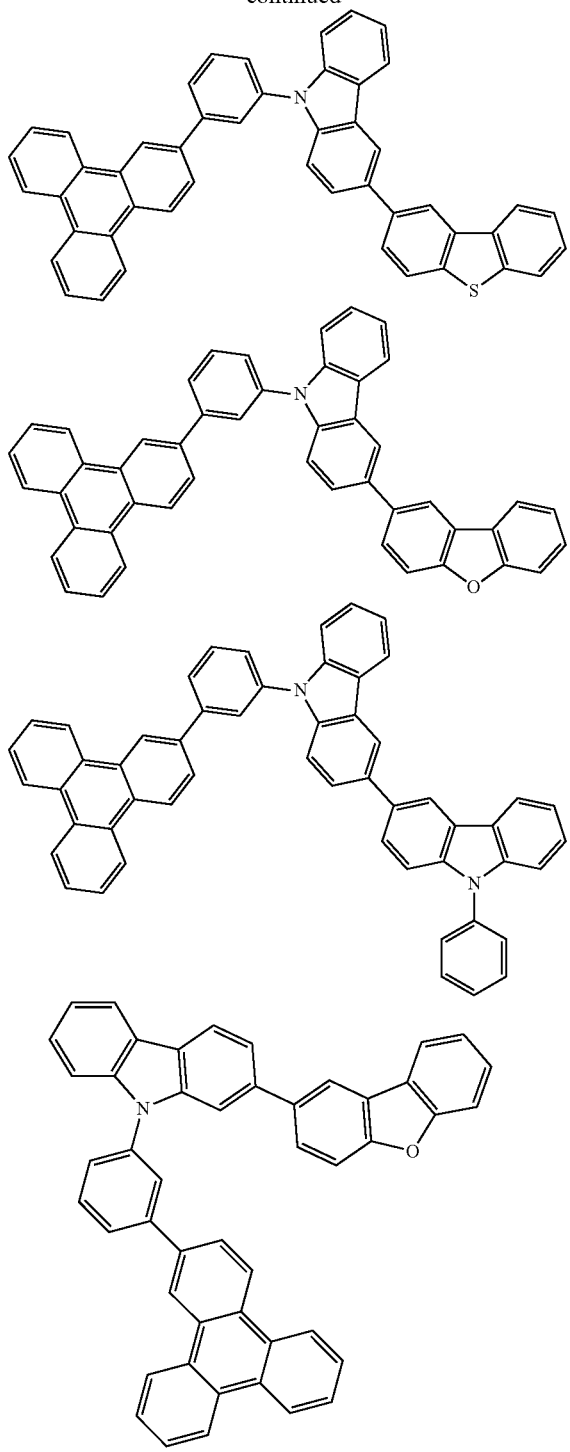

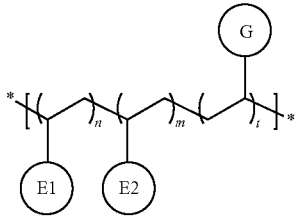

(3)

Wherein, G is another organic functional group, and n and m have the same meanings in the general formula (3) as in the general formula (1) and the general formula (2), and t is an integer greater than or equal to 0.

The other organic functional group G may be the same or different in multiple occurrences and independently selected from the group consisting of a hole (also called an electron hole) injection or transport group, a hole blocking group, an electron injection or transport group, an electron blocking group, an organic host group, a singlet emitter group (fluorescent emitter group), a triplet emitter group (phosphorescent emitter group), and a thermally activated delayed fluorescent (TADF) emitter group in multiple occurrences. The small molecular organic functional materials corresponding to these organic functional groups are a hole (also called an electron hole) injection or transport material (HIM/HTM), a hole blocking material (HBM), an electron injection or transport material (EIM/ETM), an electron blocking material (EBM), an organic host material (Host), a singlet emitter (fluorescent emitter), a triplet emitter (phosphorescent emitter), and a TADF emitter. These organic functional materials are described in detail in, for example, WO2010135519A1, US20090134784A1, and WO2011110277A1. The three patent documents are specially incorporated herein by reference in their entirety.

The following is a more detailed description of these functional materials (but not limited thereto).

1. HIM/HTM/EBM

Suitable organic HIM/HTM materials may be selected from the compounds containing the following structural units: phthalocyanines, porphyrins, amines, aryl amines, biphenyl triaryl amines, thiophenes, fused thiophenes such as dithiophenethiophene and thiophthene, pyrrole, aniline, carbazole, indeno-fluorene, and derivatives thereof. In addition, suitable HIMs also include: fluorocarbon-containing polymers; polymers containing conductive dopants; conductive polymers such as PEDOT/PSS; self-assembled monomers such as compounds containing phosphonic acid and silane derivatives; metal oxides such as MoOx; metal complexes and crosslinking compounds, and the like.

The electron blocking layer (EBL) is used to block electrons from adjacent functional layers, particularly the light-emitting layers. In contrast to a light-emitting device without a blocking layer, the presence of EBL typically results in an increase in luminous efficiency. The electron blocking material (EBM) of the electron blocking layer (EBL) requires a higher LUMO than an adjacent functional layer such as the light-emitting layer. In one embodiment, the EBM has a greater energy level of excited state than the adjacent light-emitting layer, such as a singlet or triplet, depending on the emitter, while the EBM has a hole transport function. Typically, HIM/HTM materials with high LUMO energy levels can be used as EBMs.

In the present disclosure, the plurality of E1 groups in the plurality of repeating units E1 may be the same or different, and the plurality of E2 groups in the plurality of repeating units E2 may be the same or different.

The polymer according to the present disclosure further contains another organic functional group.

In some embodiments, the polymer according to the present disclosure has a structure represented by the following general formula (3):

Examples of cyclic aromatic amine-derived compounds that can be used as HIM, HTM, or EBM include, but are not limited to, the general structures as follows:

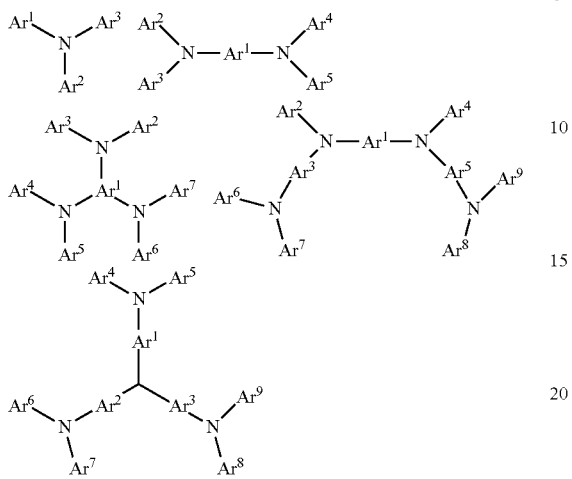

Each of $Ar^1$ to $Ar^8$ may be independently selected from the group consisting of cyclic aromatic hydrocarbon compounds, such as benzene, biphenyl, triphenyl, benzo, naphthalene, anthracene, phenalene, phenanthrene, fluorene, pyrene, chrysene, perylene, azulene; and aromatic heterocyclic compounds such as dibenzothiophene, dibenzofuran, furan, thiophene, benzofuran, benzothiophene, carbazole, pyrazole, imidazole, triazole, isoxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, dibenzoselenophene, benzoselenophene, benzofuropyridine, indolocarbazole, pyridylindole, pyrrolodipyridine, furodipyridine, benzothienopyridine, thienodipyridine, benzoselenophenopyridine and selenophenodipyridine; and groups containing 2 to 10 ring structures, which may be the same or different types of cyclic aryl or aromatic heterocyclic groups, and are linked to each other directly or through at least one of the following groups, such as an oxygen atom, a nitrogen atom, a sulfur atom, a silicon atom, a phosphorus atom, a boron atom, a chain structural unit, and an aliphatic ring group. Each Ar may be further substituted, and the substituents may be selected from the group consisting of hydrogen, alkyl, alkoxy, amino, alkene, alkyne, aralkyl, heteroalkyl, aryl, and heteroaryl.

In one aspect, $Ar^1$ to $Ar^9$ may be independently selected from the group consisting of:

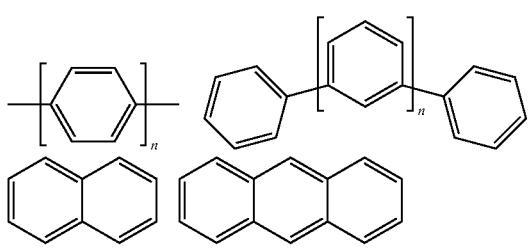

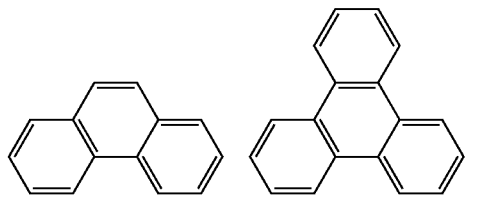

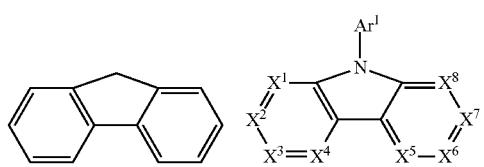

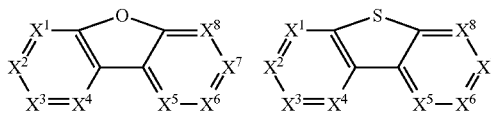

n is an integer from 1 to 20; $X^1$ to $X^8$ are CH or N; $Ar^1$ is defined as above.

Additional examples of cyclic aromatic amine-derived compounds can be found in U.S. Pat. Nos. 3,567,450, 4,720,432, 5,061,569, 3,615,404, and 5,061,569.

Examples of metal complexes that may be used as HTM or HIM include, but are not limited to, the general structure as follows:

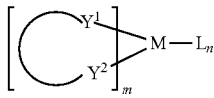

M is a metal having an atomic weight greater than 40;

$(Y^1—Y^2)$ is a bidentate ligand, $Y^1$ and $Y^2$ are independently selected from the group consisting of C, N, O, P, and S; L is an auxiliary ligand; m is an integer with the value from 1 to the maximum coordination number of the metal; m+n is the maximum coordination number of the metal.

In one embodiment, $(Y^1—Y^2)$ is a 2-phenylpyridine derivative.

In another embodiment, $(Y^1—Y^2)$ is a carbene ligand.

In another embodiment, M is selected from the group consisting of Ir, Pt, Os, and Zn.

In another aspect, the HOMO of the metal complex is greater than −5.5 eV (relative to the vacuum level).

Examples of suitable HIM/HTM compounds are listed in the following table:

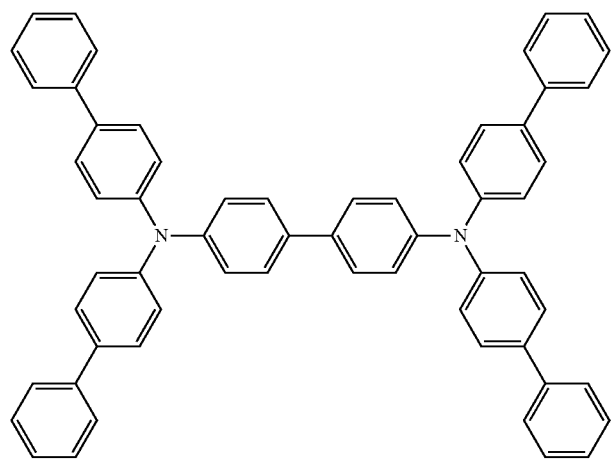 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
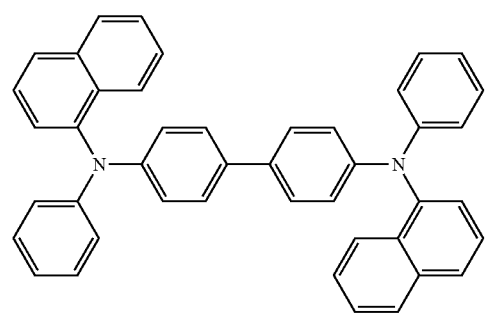 [SMILES: c1ccc(N(c2ccc(-c3ccc(N(c4ccccc4)c4cccc5ccccc45)cc3)cc2)c2cccc3ccccc23)cc1]
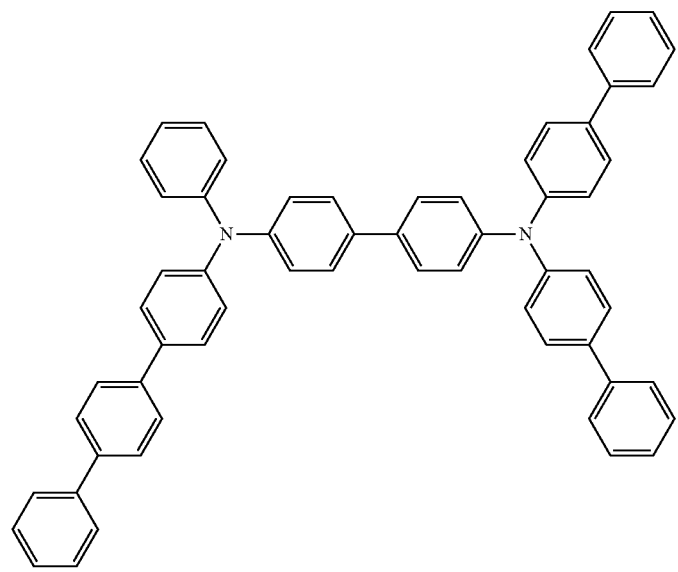 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]

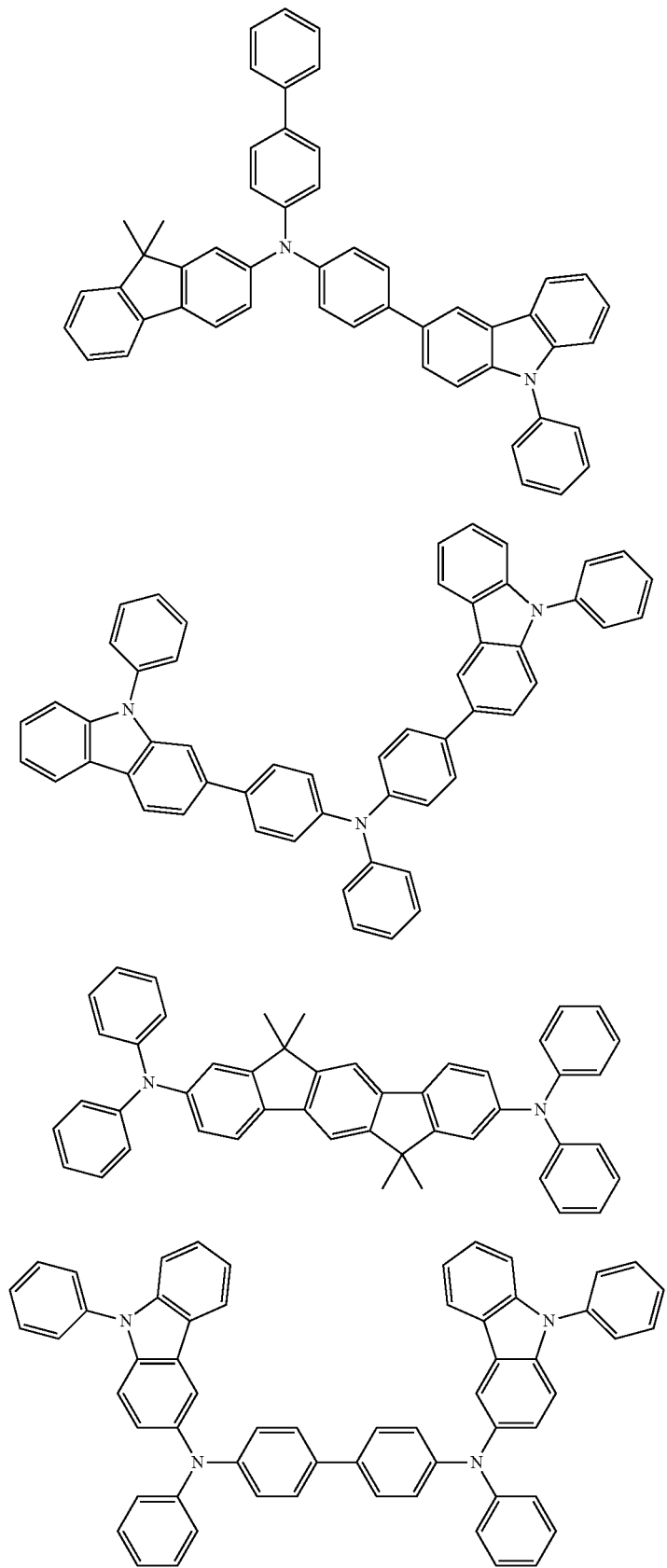

-continued
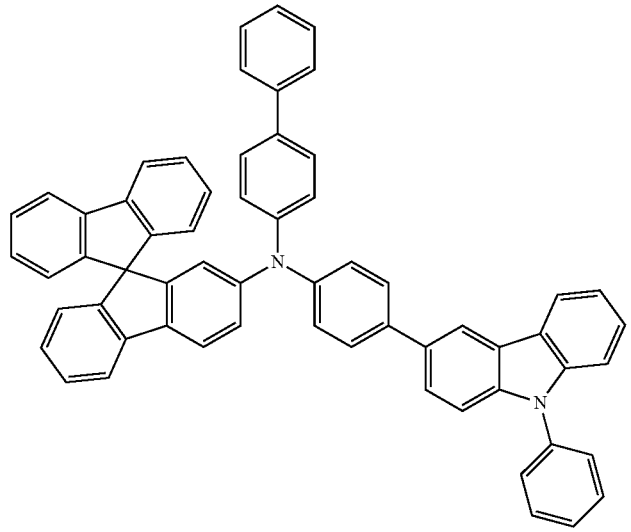 [SMILES: c1ccc(-c2ccc(N(c3ccc(-c4ccc5c(c4)c4ccccc4n5-c4ccccc4)cc3)c3ccc4c(c3)C3(c5ccccc5-c5ccccc53)c3ccccc3-4)cc2)cc1]
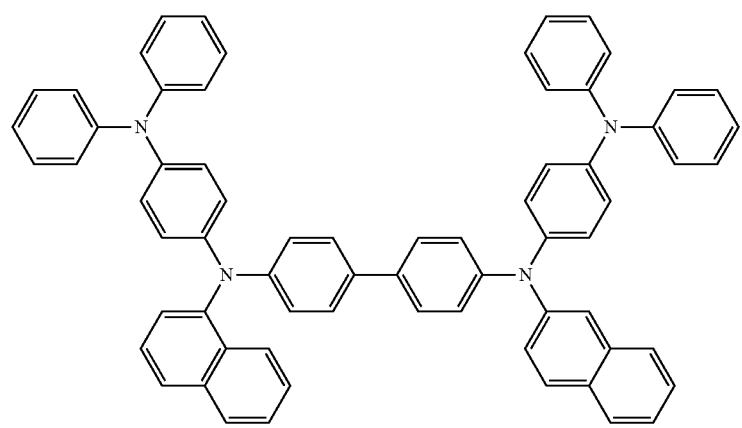 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3ccc4ccccc4c3)cc2)cc1]
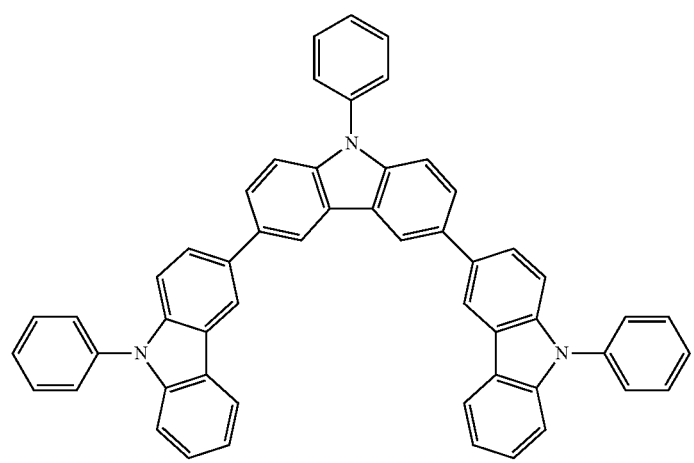 [SMILES: c1ccc(-n2c3ccccc3c3cc(-c4ccc5c(c4)c4cc(-c6ccc7c(c6)c6ccccc6n7-c6ccccc6)ccc4n5-c4ccccc4)ccc32)cc1]

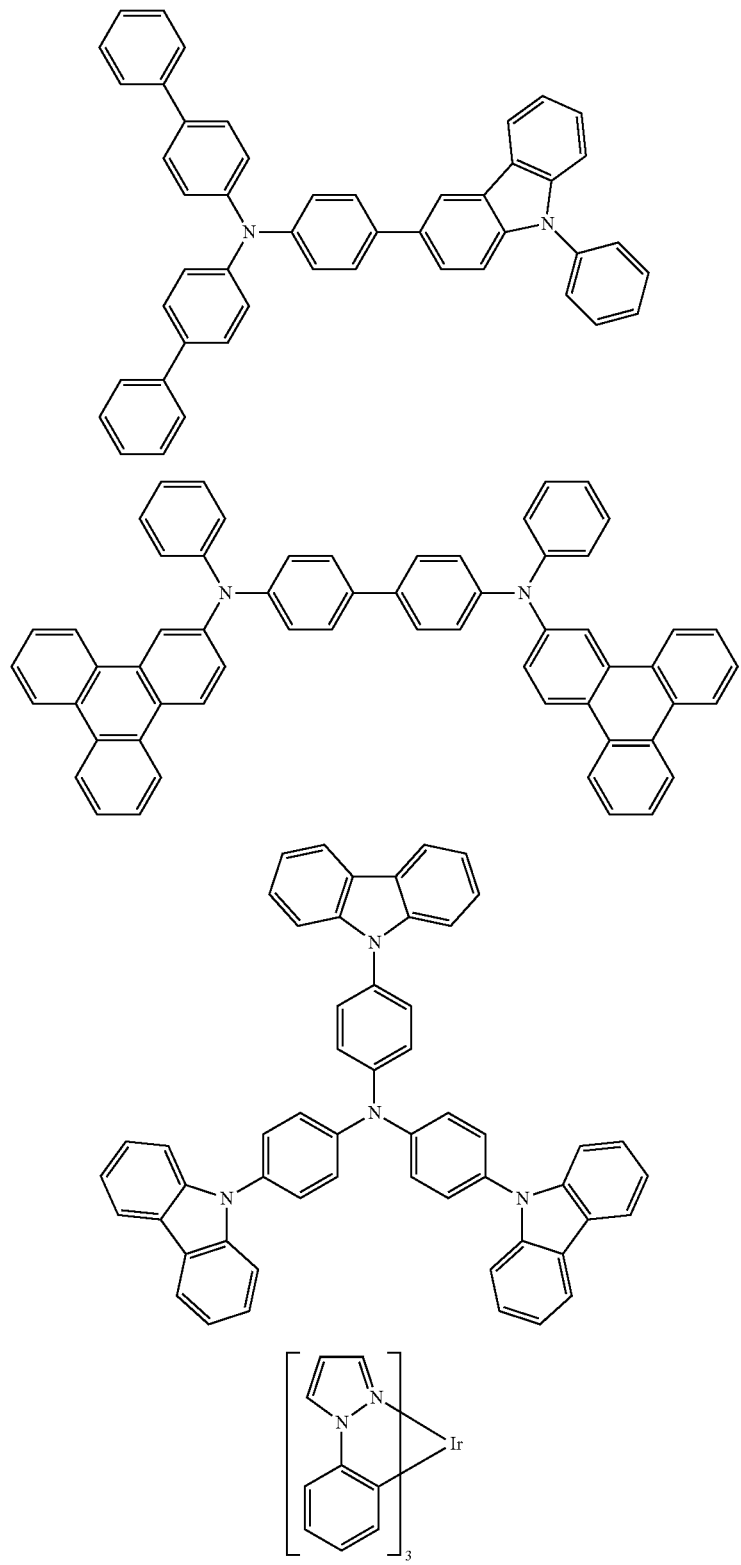

2. EIM/ETM/HBM

Examples of EIM/ETM material are not particularly limited, and any metal complex or organic compound may be used as EIM/ETM as long as they can transport electrons. Organic EIM/ETM materials may be selected from the group consisting of tris (8-hydroxyquinoline)aluminum (AlQ3), phenazine, phenanthroline, anthracene, phenanthrene, fluorene, bifluorene, spirobifluorene, p-phenylacetylene, pyridazine, pyrazine, triazine, triazole, imidazole, quinolone, isoquinoline, quinoxaline, oxazole, isoxazole, oxadiazole, thiadiazole, pyridine, pyrazole, pyrrole, pyrimidine, acridine, pyrene, perylene, trans-indenofluorene, cis-indenonfluorene, dibenzol-indenofluorene, indenonaphthalene, benzanthracene, azaphosphole, azaborole, aromatic ketone, lactam, and derivatives thereof.

The hole blocking layer (HBL) is typically used to block holes from adjacent functional layers, particularly the light-emitting layers. In contrast to a light-emitting device without a blocking layer, the presence of HBL typically results in an increase in luminous efficiency. The hole blocking material (HBM) of the hole blocking layer (HBL) requires a lower HUMO than an adjacent functional layer, such as the light-emitting layer. In one embodiment, the HBM has a larger energy level of excited state than the adjacent light-emitting layer, such as a singlet or triplet, depending on the emitter. In another embodiment, the HBM has an electron transport function. Typically, EIM/ETM materials with deep HUMO energy levels can be used as HBMs.

In another aspect, compounds that may be used as EIM/ETM/HBM may be molecules containing at least one of the following groups:

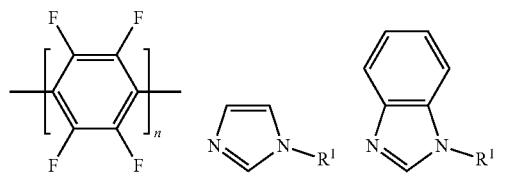

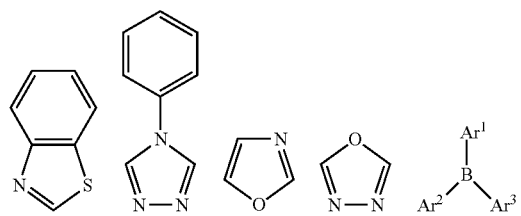

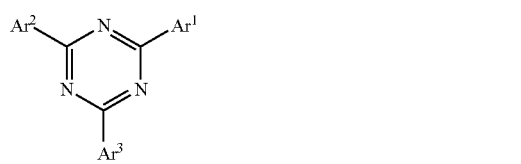

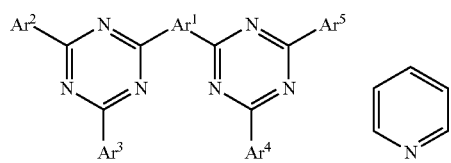

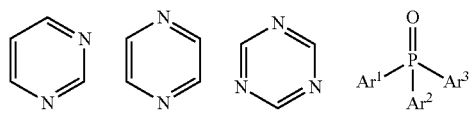

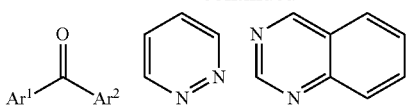

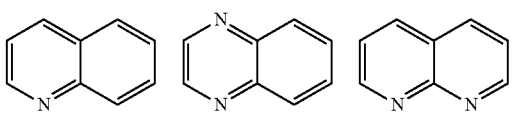

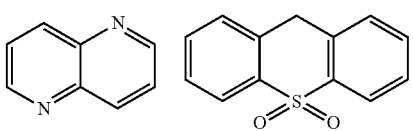

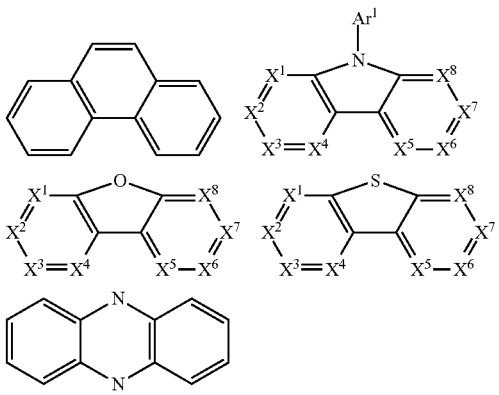

$R^1$ may be selected from the group consisting of hydrogen, alkyl, alkoxy, amino, alkenyl, alkynyl, aralkyl, heteroalkyl, aryl, and heteroaryl, which have the same meaning as $Ar^1$ and $Ar^2$ in HTM as described above when they are aryl or heteroaryl. $Ar^1$ to $Ar^5$ have the same meaning as $Ar^1$ in HTM as described above. n is an integer from 0 to 20. $X^1$ to $X^8$ are selected from $CR^1$ or N.

On the other hand, examples of metal complexes that may be used as EIM/ETM include, but are not limited to, the following general structures:

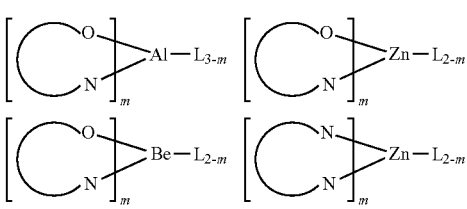

(O—N) or (N—N) is bidentate ligand, and the metal coordinates with O, N, or N, N. L is an auxiliary ligand. m is an integer whose value ranges from 1 to the maximum coordination number of the metal.

Examples of suitable ETM compounds are listed in the following table:

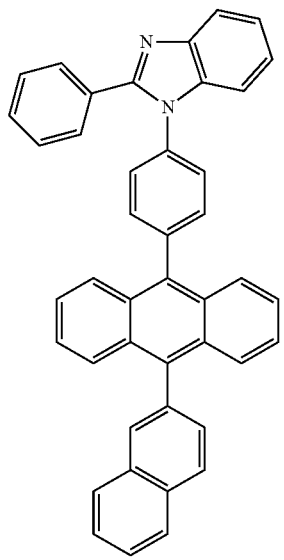 [SMILES: c1ccc(-c2nc3ccccc3n2-c2ccc(-c3c4ccccc4c(-c4ccc5ccccc5c4)c4ccccc34)cc2)cc1]
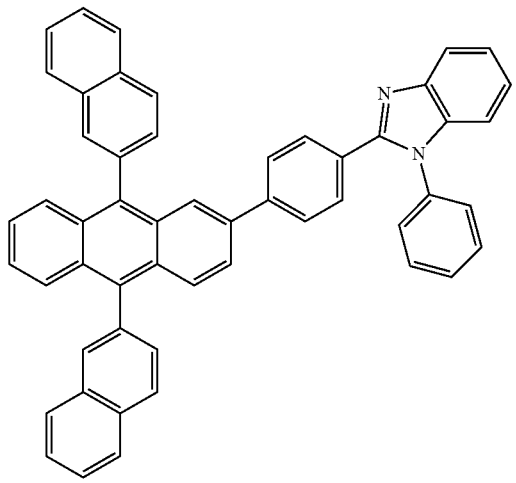 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]
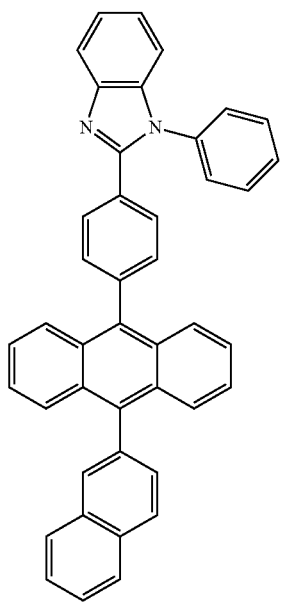 [SMILES: c1ccc(-n2c(-c3ccc(-c4c5ccccc5c(-c5ccc6ccccc6c5)c5ccccc45)cc3)nc3ccccc32)cc1]

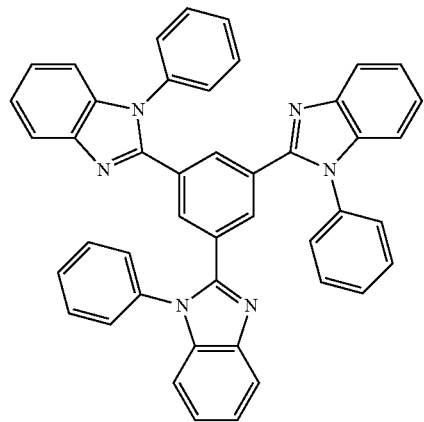 [SMILES: c1ccc(-n2c(-c3cc(-c4nc5ccccc5n4-c4ccccc4)cc(-c4nc5ccccc5n4-c4ccccc4)c3)nc3ccccc32)cc1]
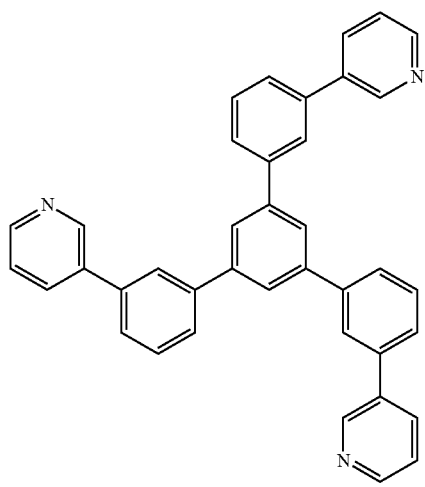 [SMILES: c1cncc(-c2cccc(-c3cc(-c4cccc(-c5cccnc5)c4)cc(-c4cccc(-c5cccnc5)c4)c3)c2)c1]
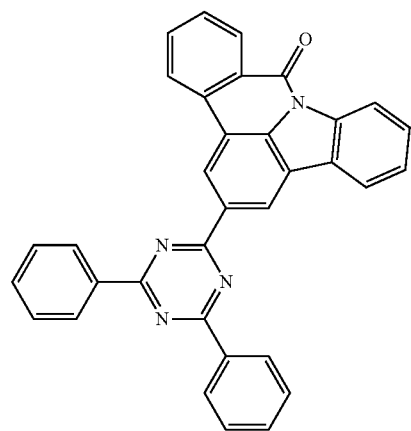 [SMILES: O=c1c2ccccc2c2cc(-c3nc(-c4ccccc4)nc(-c4ccccc4)n3)cc3c4ccccc4n1c23]

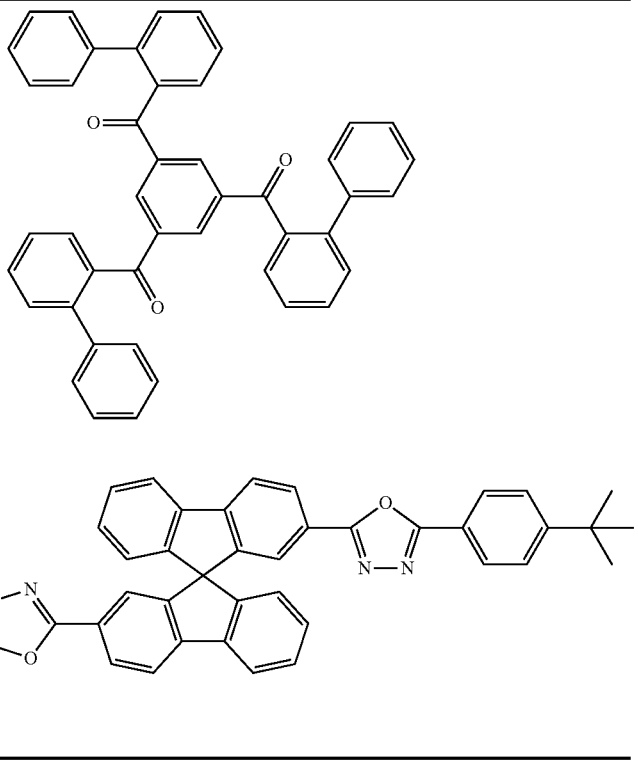

In another embodiment, an organic alkali metal compound can be used as the EIM. In the present disclosure, the organic alkali metal compound may be understood as a compound having at least one alkali metal, i.e., lithium, sodium, potassium, rubidium, and cesium, and further including at least one organic ligand.

Suitable organic alkali metal compounds include the compounds described in U.S. Pat. No. 7,767,317B2, EP1941562B1, and EP1144543B1.

Organic alkali metal compounds are compounds of the following formula:

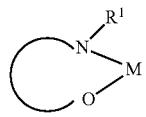

$R^1$ has the same meaning as described above, and the arc represents bond linking two or three atoms and the bond to form a 5- or 6-membered ring with metal M when necessary, while the atoms may also be substituted with one or more $R^1$. M is an alkali metal selected from the group consisting of lithium, sodium, potassium, rubidium, and cesium.

The organic alkali metal compound may be in the form of a monomer, as described above, or in the form of an aggregate, for example, two alkali metal ions with two ligands, 4 alkali metal ions with 4 ligands, 6 alkali metal ions with 6 ligands or in other forms.

Organic alkali metal compounds are compounds of the following formula:

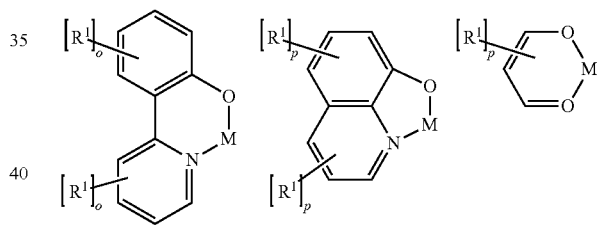

the symbols used are as defined above, and in addition:

o may be the same or different at each occurrence, and selected from 0, 1, 2, 3, or 4; and p may be the same or different at each occurrence, and selected from 0, 1, 2, or 3.

In one embodiment, the alkali metal M is selected from the group consisting of lithium, sodium, and potassium. In another embodiment, the alkali metal M is lithium or sodium. In yet another embodiment, the alkali metal M is lithium.

In one embodiment, the organic alkali metal compound is used in the electron injection layer. In another embodiment, the electron injection layer consists of the organic alkali metal compound.

In yet another embodiment, the organic alkali metal compound is doped into other ETMs to form an electron transport layer or is doped into an electron injection layer. In still another embodiment, it is doped into the electron transport layer.

Examples of suitable organic alkali metal compounds are listed in the following table:

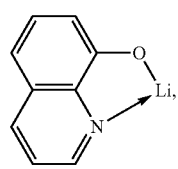
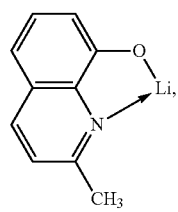
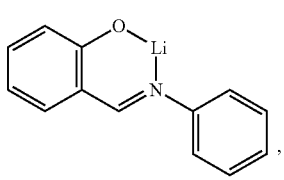
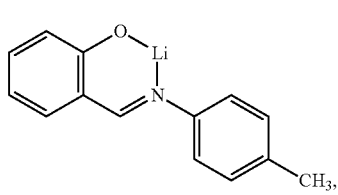
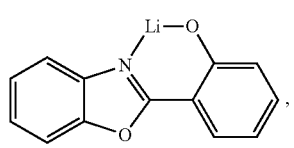
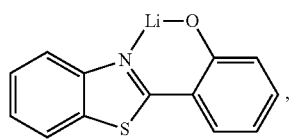
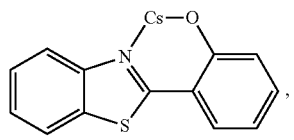
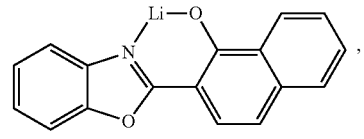
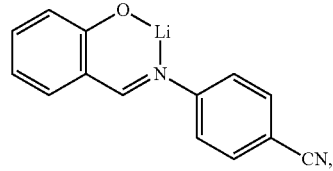
-continued
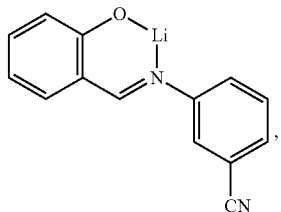
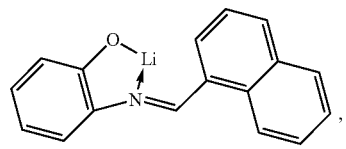
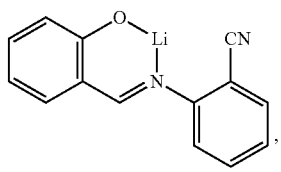
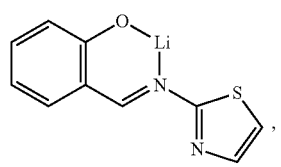
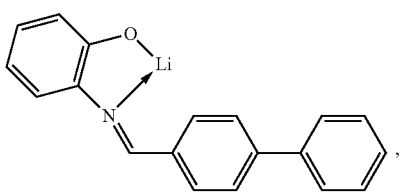
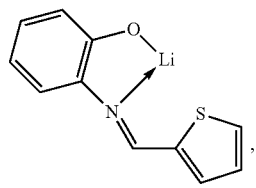
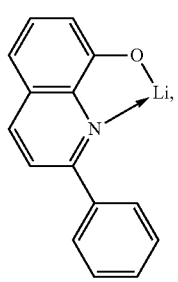

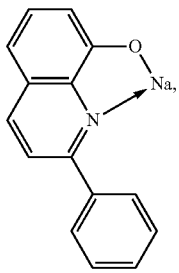
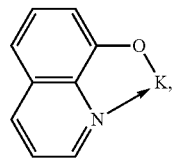
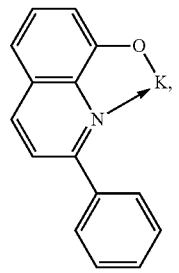
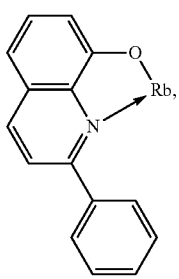
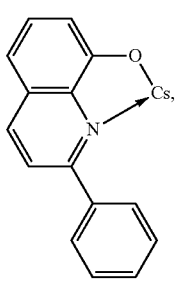
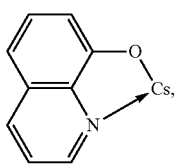
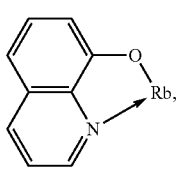

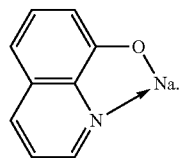

3. Triplet Matrix Material (Triplet Host):

Examples of the triplet host materials are not particularly limited, and any metal complex or organic compound may be used as the host material as long as its triplet energy is greater than that of the emitter, particularly a triplet emitter or a phosphorescent emitter. Examples of metal complexes that can be used as the triplet hosts include, but are not limited to, the general structure as follows:

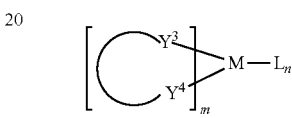

M is a metal; ($Y^3$—$Y^4$) is a bidentate ligand, $Y^3$ and $Y^4$ are independently selected from the group consisting of C, N, O, P, and S. L is an auxiliary ligand; m is an integer whose value ranges from 1 to the maximum coordination number of the metal. m+n is the maximum coordination number of the metal.

In one embodiment, the metal complex which can be used as the triplet host has the following form:

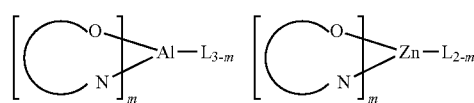

(O—N) is a bidentate ligand in which the metal coordinates with O and N atoms.

In one embodiment, M may be selected form Ir and Pt.

Examples of organic compounds which can be used as the triplet hosts are selected from the group consisting of: compounds containing cyclic aryl groups, such as benzene, biphenyl, triphenyl, benzo, and fluorene; and compounds containing aromatic heterocyclic groups, such as dibenzothiophene, dibenzofuran, dibenzoselenophen, furan, thiophene, benzofuran, benzothiophene, benzoselenophene, carbazole, indolocarbazole, indolopyridine, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indazole, oxazole, bisbenzoxazole, benzoisoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furanpyridine, benzothienopyridine, thienopyridine, benzoselenophenopyridine, and selenophenodipyridine; and groups containing 2 to 10 ring structures, which may be the same or different types of cyclic aryl or aromatic heterocyclic groups, and are linked to each other directly or through at least one of the following groups, such as an oxygen atom, a nitrogen atom, a sulfur atom, a silicon atom, a phosphorus atom, a boron atom, a chain structure unit, and an aliphatic ring group.

Each Ar may be further substituted and the substituents may be selected from the group consisting of hydrogen, alkyl, alkoxy, amino, alkenyl, alkynyl, aralkyl, heteroalkyl, aryl, and heteroaryl.

In one embodiment, the triplet host materials can be selected from compounds containing at least one of the following groups:

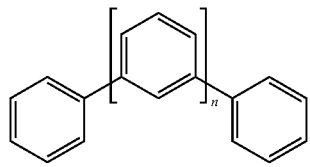

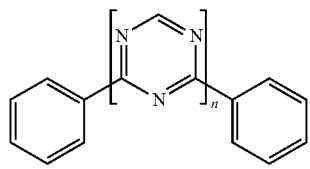

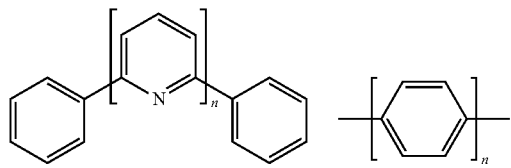

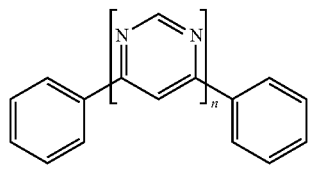

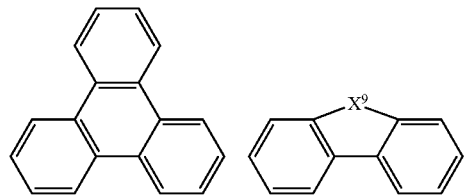

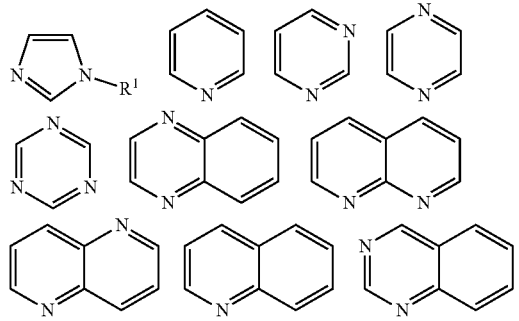

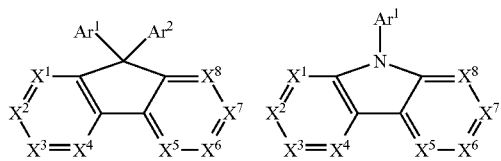

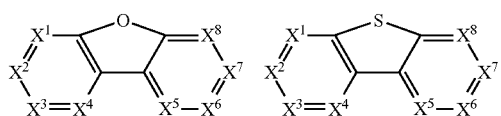

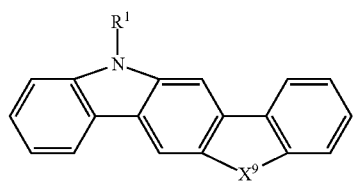

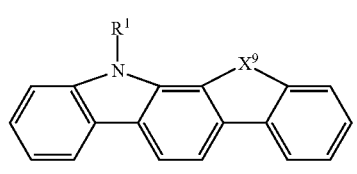

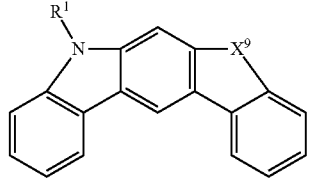

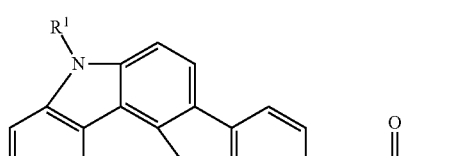

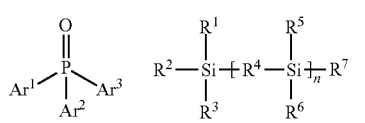

$R^1$ to $R^7$ may be independently selected from the group consisting of hydrogen, alkyl, alkoxy, amino, alkenyl, alkynyl, aralkyl, heteroalkyl, aryl, and heteroaryl, which have the same meaning as $Ar^1$ and $Ar^2$ described above when they are aryl or heteroaryl. n is an integer from 0 to 20. $X^1$ to $X^8$ are selected from CH or N; and $X^9$ is selected from $CR^1R^2$ or $NR^1$.

Examples of suitable triplet host materials are listed in the following table:

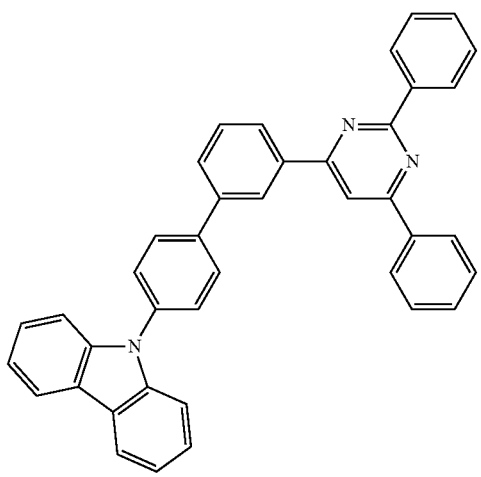 [SMILES: c1ccc(-c2cc(-c3cccc(-c4ccc(-n5c6ccccc6c6ccccc65)cc4)c3)nc(-c3ccccc3)n2)cc1]
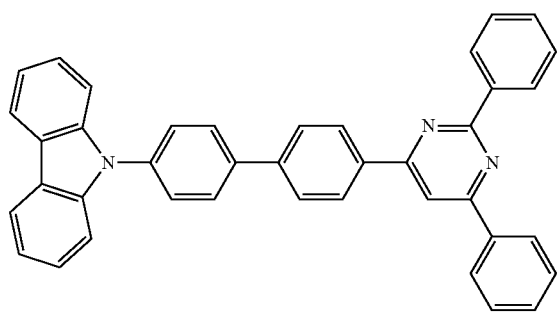 [SMILES: c1ccc(-c2cc(-c3ccc(-c4ccc(-n5c6ccccc6c6ccccc65)cc4)cc3)nc(-c3ccccc3)n2)cc1]
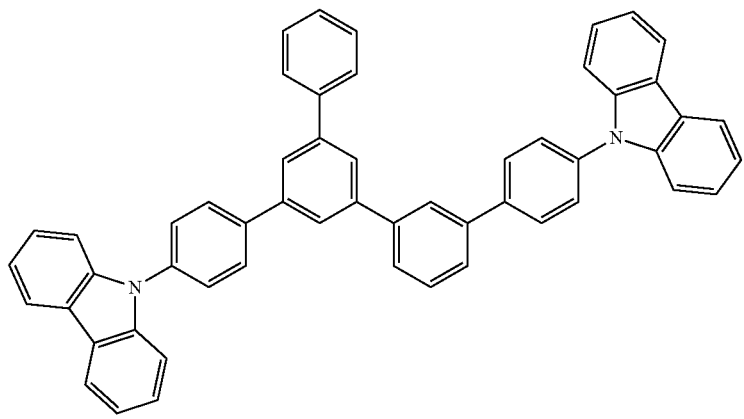 [SMILES: c1ccc(-c2cc(-c3ccc(-n4c5ccccc5c5ccccc54)cc3)cc(-c3cccc(-c4ccc(-n5c6ccccc6c6ccccc65)cc4)c3)c2)cc1]
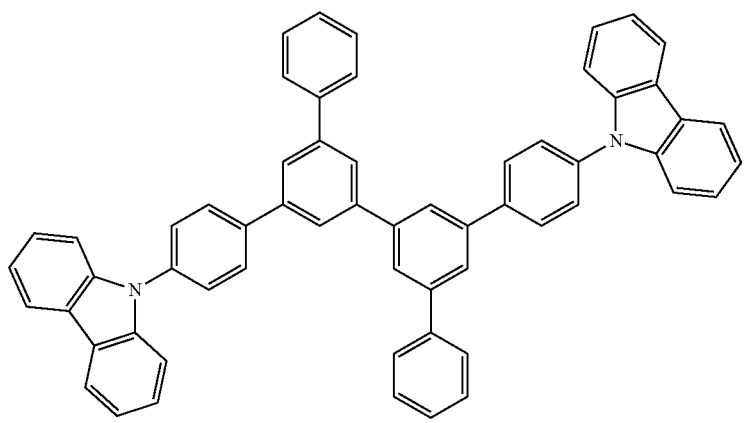 [SMILES: c1ccc(-c2cc(-c3ccc(-n4c5ccccc5c5ccccc54)cc3)cc(-c3cc(-c4ccccc4)cc(-c4ccc(-n5c6ccccc6c6ccccc65)cc4)c3)c2)cc1]

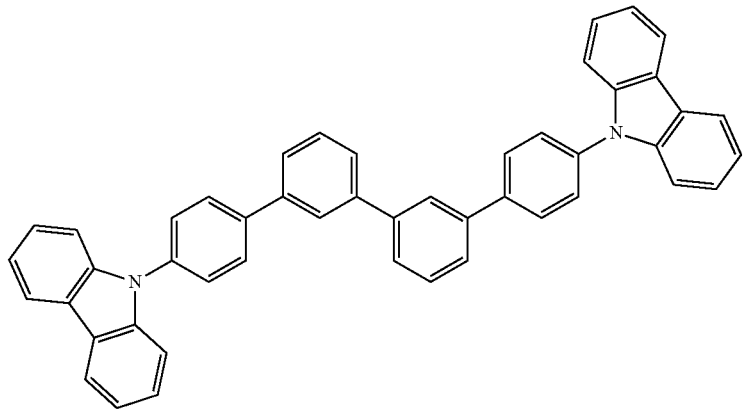 [SMILES: c1cc(-c2ccc(-n3c4ccccc4c4ccccc43)cc2)cc(-c2cccc(-c3ccc(-n4c5ccccc5c5ccccc54)cc3)c2)c1]

4. Singlet Matrix Material (Singlet Host):

Examples of the singlet host materials are not particularly limited, and any organic compound may be used as the host as long as its singlet energy is greater than that of the emitter, particularly a singlet emitter or a fluorescent emitter.

Examples of organic compounds used as the singlet host materials may be selected from the group consisting of: compounds containing cyclic aryl groups, such as benzene, biphenyl, triphenyl, benzo, naphthalene, anthracene, phenalene, phenanthrene, fluorene, pyrene, chrysene, perylene, azulene; and aromatic heterocyclic compounds such as dibenzothiophene, dibenzofuran, dibenzoselenophen, furan, thiophene, benzofuran, benzothiophene, benzoselenophene, carbazole, indolocarbazole, indolopyridine, pyrrolodipyridine, pyrazole, imidazole, triazole, isoxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indazole, indolizine, benzoxazole, benzoisoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and groups containing 2 to 10 ring structures, which may be the same or different types of cyclic aryl or aromatic heterocyclic groups, and are linked to each other directly or through at least one of the following groups, such as an oxygen atom, a nitrogen atom, a sulfur atom, a silicon atom, a phosphorus atom, a boron atom, a chain structure unit, and an aliphatic ring group.

In one embodiment, the singlet host material may be selected from compounds containing at least one of the following groups:

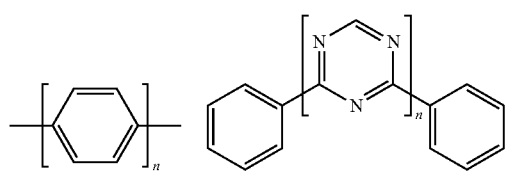

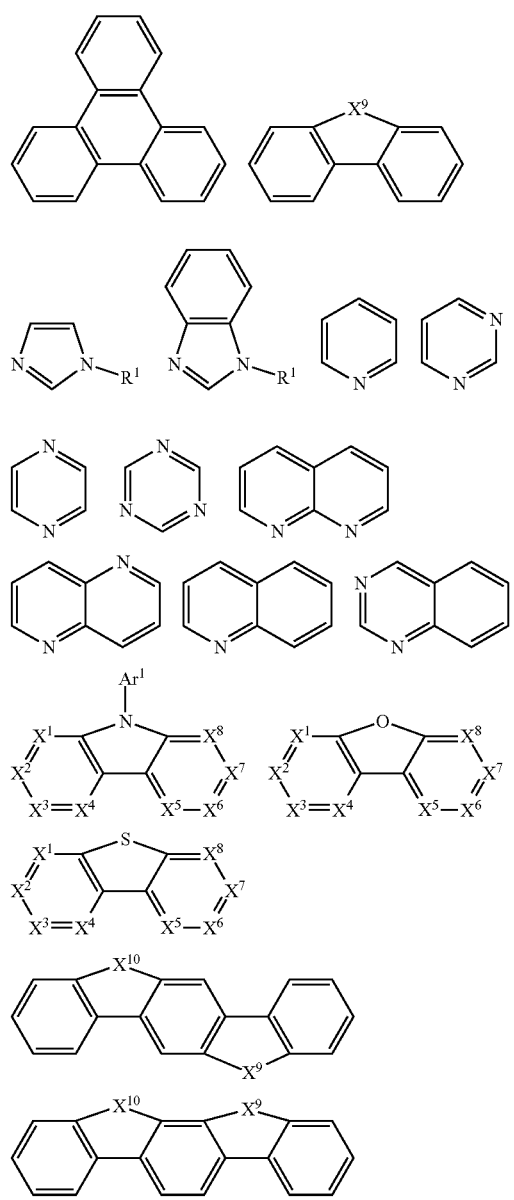

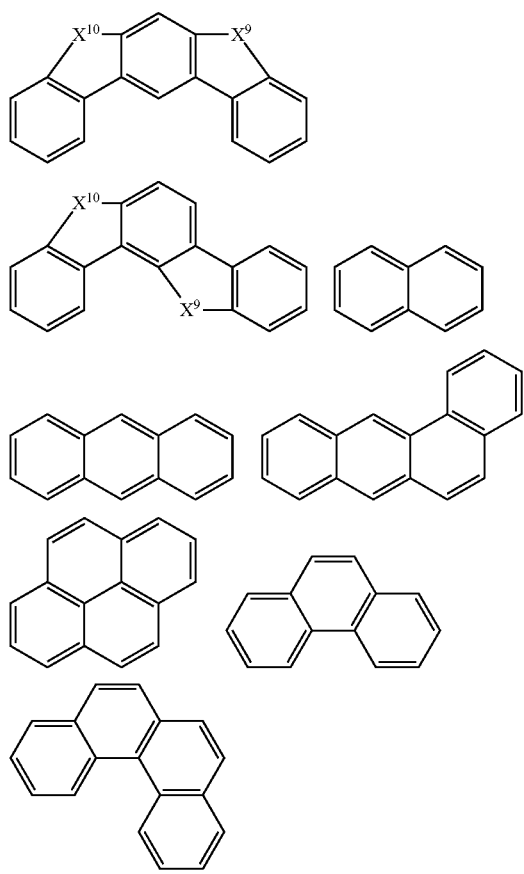

R[1] may be independently selected from the group consisting of hydrogen, alkyl, alkoxy, amino, alkenyl, alkynyl, aralkyl, heteroalkyl, aryl, and heteroaryl. Ar[1] is aryl or heteroaryl and has the same meaning as Ar[1] defined in the HTM above. n is an integer from 0 to 20; $X^1$ to $X^8$ are selected from CH or N; and $X^9$ and $X^{10}$ are selected from $CR^1R^2$ or $NR^1$.

Some examples of anthryl singlet host materials are listed in the following table:

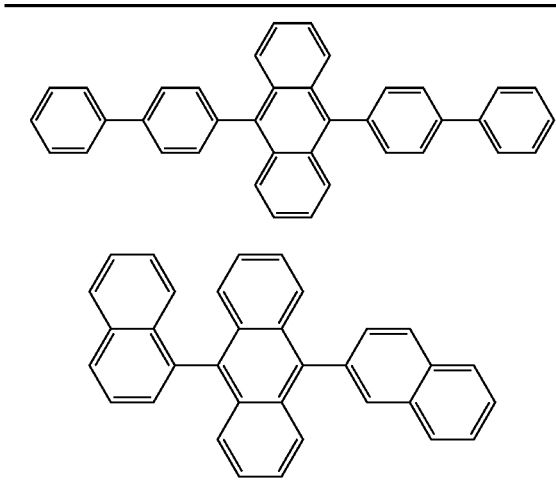

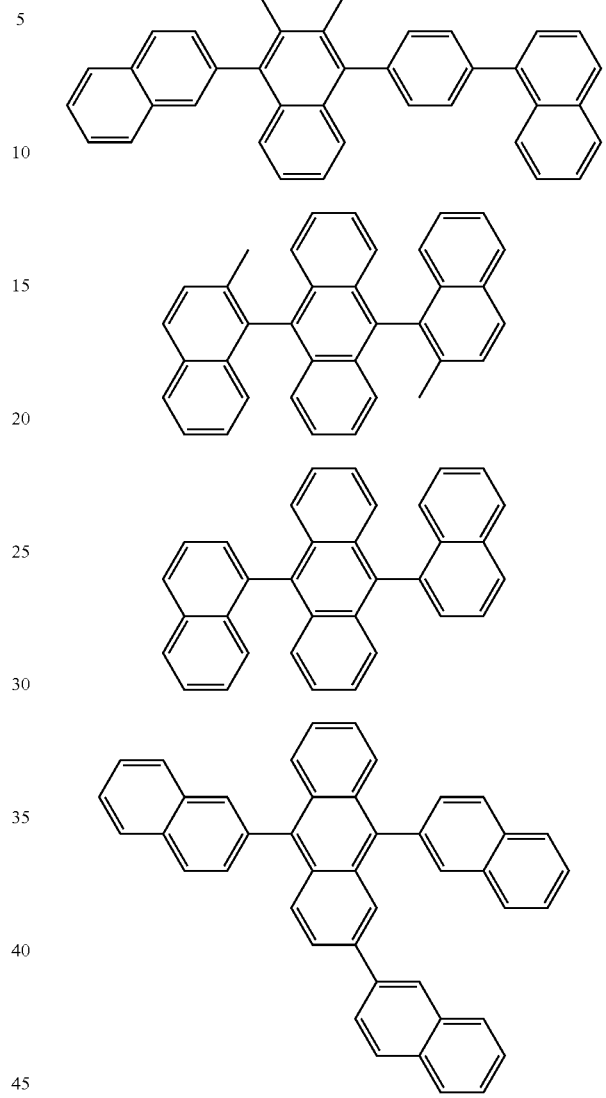

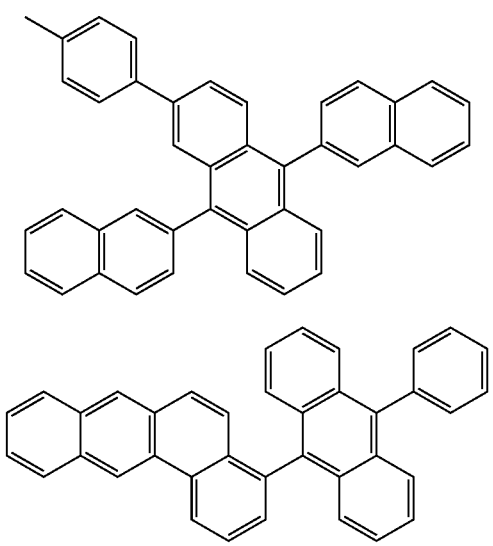

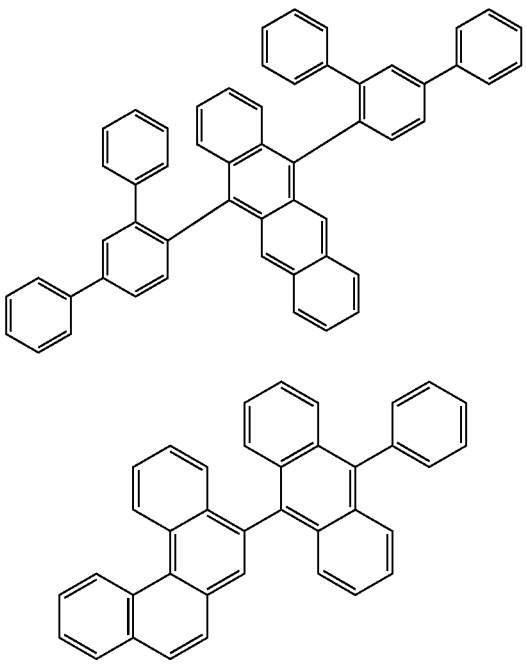

5. Singlet Emitter

The singlet emitters tend to have longer conjugated π-electron systems. To date, there have been many examples, such as styrylamine and its derivatives disclosed in JP2913116B and WO2001021729A1, and indenofluorene and its derivatives disclosed in WO2008/006449 and WO2007/140847.

In one embodiment, the singlet emitter can be selected from the group consisting of monostyrylamines, distyrylamines, tristyrylamines, tetrastyrylamines, styrylphosphines, styryl ethers, and arylamines.

The monostyrylamine refers to a compound which includes one unsubstituted or substituted styryl group and at least one amine. In one embodiment, the amine is an aromatic amine. The distyrylamine refers to a compound which includes two unsubstituted or substituted styryl groups and at least one amine. In one embodiment, the amine is an aromatic amine. The tristyrylamine refers to a compound which includes three unsubstituted or substituted styryl groups and at least one amine. In one embodiment, the amine is an aromatic amine. The tetrastyrylamine refers to a compound which includes four unsubstituted or substituted styryl groups and at least one amine. In one embodiment, the amine is an aromatic amine. In one embodiment, styrene is stilbene, which may be further substituted. The corresponding phosphines and ethers are defined similarly to amines. Aryl amine or aromatic amine refers to a compound containing three unsubstituted or substituted aromatic ring or heterocyclic systems directly attached to nitrogen. In one embodiment, at least one of these aromatic ring or heterocyclic systems is selected from fused ring systems. In another embodiment, at least one of these aromatic ring or heterocyclic systems has at least 14 aryl ring atoms. Examples are aromatic anthramine, aromatic anthradiamine, aromatic pyreneamine, aromatic pyrenediamine, aromatic chryseneamine, and aromatic chrysenediamine. An aromatic anthramine refers to a compound in which one diarylamino group is directly attached to anthracene, particularly at position 9. An aromatic anthradiamine refers to a compound in which two diarylamino groups are directly attached to anthracene, particularly at positions 9, 10. Aromatic pyreneamine, aromatic pyrenediamine, aromatic chryseneamine, and aromatic chrysenediamine are similarly defined, and the diarylamino group is, particularly attached to position 1 or 1 and 6 of pyrene.

Examples of singlet emitters based on vinylamine and arylamine can be found in the following patent documents: WO2006/000388, WO2006/058737, WO2006/000389, WO2007/065549, WO2007/115610, U.S. Pat. No. 7,250, 532B2, DE102005058557A1, CN1583691A, JP08053397A, U.S. Pat. No. 6,251,531B1, US2006/ 210830A, EP1957606A1, and US2008/0113101A1. The patent documents listed above are specially incorporated herein by reference in their entirety.

Examples of singlet emitters based on distyrylbenzene and its derivatives may be found in, for example, U.S. Pat. No. 5,121,029.

In one embodiment, singlet emitters may be selected from indenofluorene-amine and indenofluorene-diamine disclosed in WO 2006/122630; benzoindenofluorene-amine and benzoindenofluorene-diamine disclosed in WO 2008/ 006449, and dibenzoindenofluorene-amine and dibenzoindenofluorene-diamine disclosed in WO 2007/140847.

Other materials useful as singlet emitters include polycyclic aryl compounds, especially one selected from the derivatives of the following compounds: anthracenes such as 9, 10-di-naphthylanthracene, naphthalene, tetraphenyl, phenanthrene, perylene such as 2, 5, 8, 11-tetra-t-butylatedylene, indenoperylene, phenylenes such as 4, 4'-(bis(9-ethyl-3-carbazovinylene)-1, 1'-biphenyl, periflanthene, decacyclene, coronene, fluorene, spirobifluorene, arylpyren (e.g., US20060222886), arylenevinylene (e.g., U.S. Pat. Nos. 5,121,029, 5,130,603), cyclopentadiene such as tetraphenylcyclopentadiene, rubrene, coumarine, rhodamine, quinacridone, pyrane such as 4 (dicyanoethylene)-6-(4-dimethylaminostyryl-2-methyl)-4H-pyrane (DCM), thiapyran, bis (azinyl) imine-boron compounds (US2007/ 0092753A1), bis (azinyl) methene compounds, carbostyryl compounds, oxazone, benzoxazole, benzothiazole, benzimidazole, and diketopyrrolopyrrole. Some singlet emitter materials may be found in the following patent documents: US20070252517A1, U.S. Pat. Nos. 4,769,292, 6,020,078, US2007/0252517A1, and US2007/0252517A1. The patent documents listed above are specially incorporated herein by reference in their entirety.

Examples of suitable singlet emitters are listed in the following table:

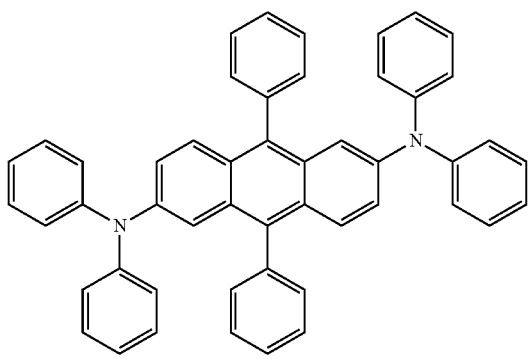 [SMILES: c1ccc(-c2c3ccc(N(c4ccccc4)c4ccccc4)cc3c(-c3ccccc3)c3ccc(N(c4ccccc4)c4ccccc4)cc23)cc1]
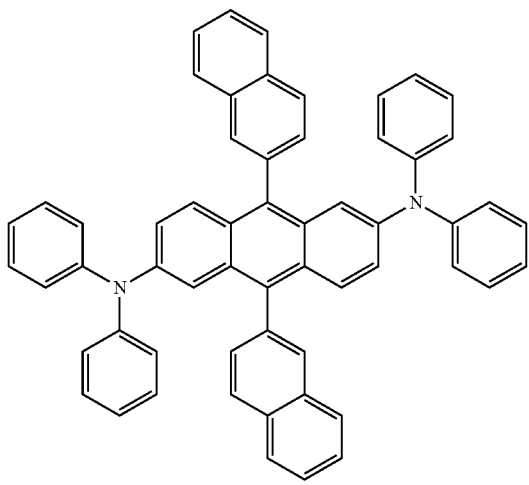 [SMILES: c1ccc(N(c2ccccc2)c2ccc3c(-c4ccc5ccccc5c4)c4cc(N(c5ccccc5)c5ccccc5)ccc4c(-c4ccc5ccccc5c4)c3c2)cc1]
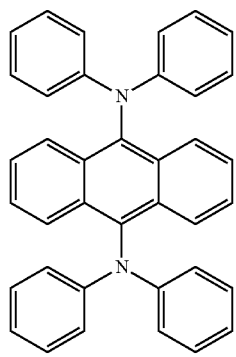 [SMILES: c1ccc(N(c2ccccc2)c2c3ccccc3c(N(c3ccccc3)c3ccccc3)c3ccccc23)cc1]

-continued
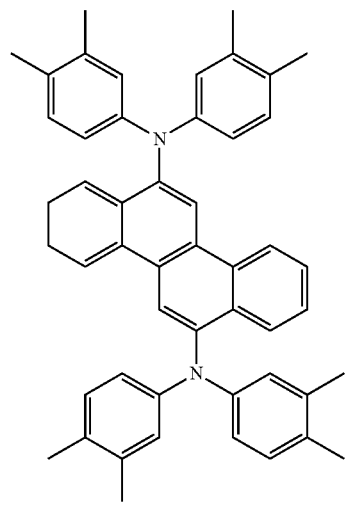
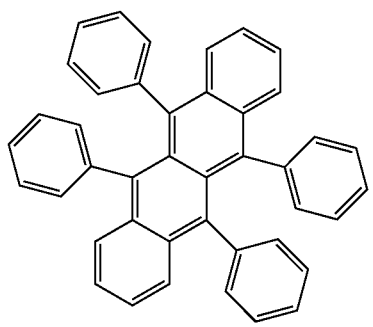 [SMILES: c1ccc(-c2c3ccccc3c(-c3ccccc3)c3c(-c4ccccc4)c4ccccc4c(-c4ccccc4)c23)cc1]
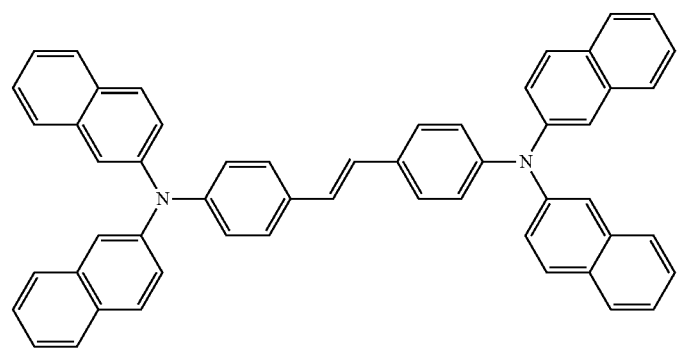 [SMILES: C(=C\c1ccc(N(c2ccc3ccccc3c2)c2ccc3ccccc3c2)cc1)/c1ccc(N(c2ccc3ccccc3c2)c2ccc3ccccc3c2)cc1]

-continued
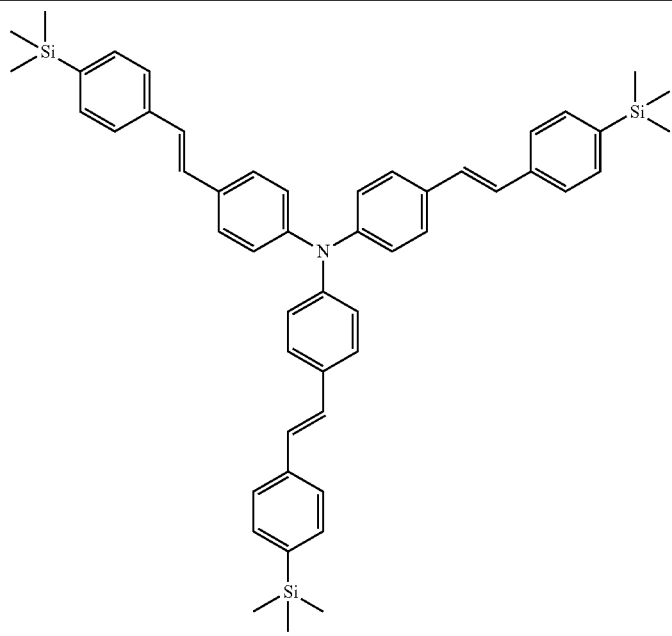
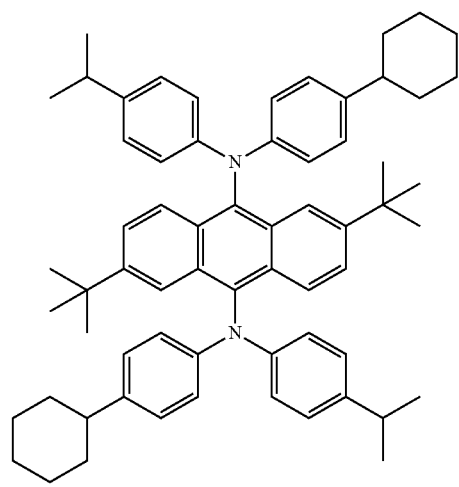 [SMILES: CC(C)c1ccc(N(c2ccc(C3CCCCC3)cc2)c2c3ccc(C(C)(C)C)cc3c(N(c3ccc(C(C)C)cc3)c3ccc(C4CCCCC4)cc3)c3ccc(C(C)(C)C)cc23)cc1]
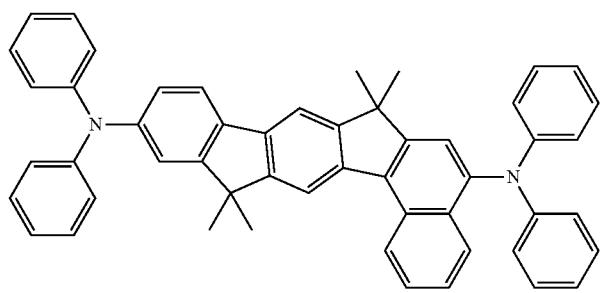 [SMILES: CC1(C)c2cc(N(c3ccccc3)c3ccccc3)ccc2-c2cc3c(cc21)-c1c(cc(N(c2ccccc2)c2ccccc2)c2ccccc12)C3(C)C]

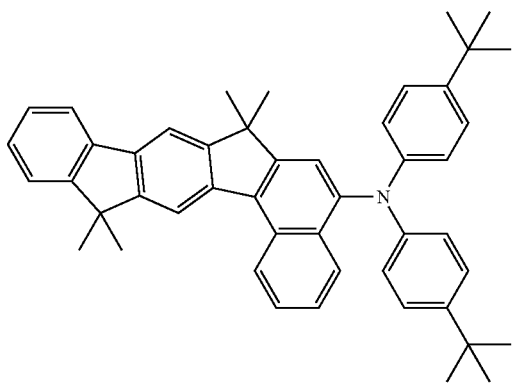 [SMILES: CC(C)(C)c1ccc(N(c2ccc(C(C)(C)C)cc2)c2cc3c(c4ccccc24)-c2cc4c(cc2C3(C)C)-c2ccccc2C4(C)C)cc1]
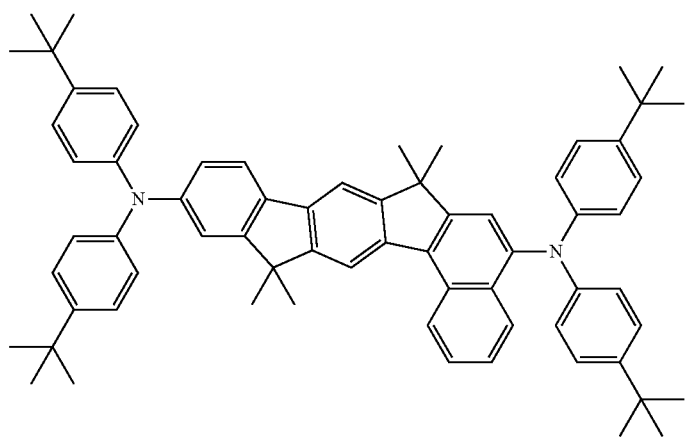 [SMILES: CC(C)(C)c1ccc(N(c2ccc(C(C)(C)C)cc2)c2ccc3c(c2)C(C)(C)c2cc4c(cc2-3)C(C)(C)c2cc(N(c3ccc(C(C)(C)C)cc3)c3ccc(C(C)(C)C)cc3)c3ccccc3c2-4)cc1]
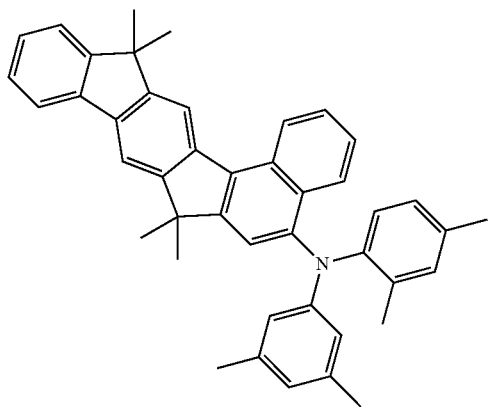 [SMILES: Cc1cc(C)cc(N(c2ccc(C)cc2C)c2cc3c(c4ccccc24)-c2cc4c(cc2C3(C)C)-c2ccccc2C4(C)C)c1]
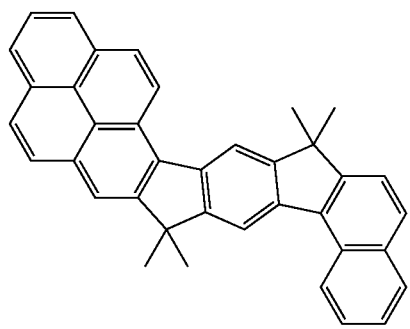 [SMILES: CC1(C)c2cc3c(cc2-c2c1ccc1ccccc21)C(C)(C)c1cc2ccc4cccc5ccc(c1-3)c2c45]

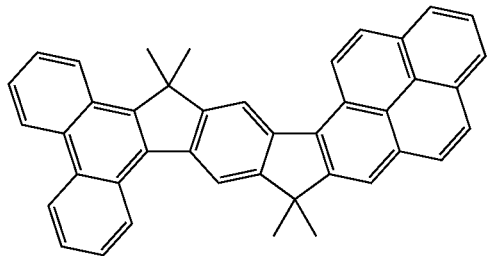 [SMILES: CC1(C)c2cc3c(cc2-c2c1cc1ccc4cccc5ccc2c1c45)C(C)(C)c1c-3c2ccccc2c2ccccc12]

6. Thermally Activated Delayed Fluorescent Material (TADF):

Conventional organic fluorescent materials can only emit light by using 25% singlet excitons formed by electrical excitation, and the internal quantum efficiency of the device is low (up to 25%). The phosphorescent material enhances the intersystem crossing due to the strong spin-orbit coupling of the center of the heavy atom, the singlet excitons and triplet excitons formed by electrical excitation can be effectively utilized to emit light, so that the internal quantum efficiency of the device can reach 100%. However, the problems of expensive phosphorescent materials, poor material stability, and severe roll-off of device efficiency limit their application in OLEDs. The thermally activated delayed fluorescent material is a third-generation organic luminescent material developed after the organic fluorescent materials and the organic phosphorescent materials. Such materials generally have a small singlet-triplet excited state energy level difference (ΔEst), the triplet excitons can be converted into the singlet excitons by reverse intersystem crossing to emit light. This can make full use of the singlet excitons and triplet excitons formed under electrical excitation, and the internal quantum efficiency of the device can reach 100%. In addition, the material has a controllable structure, stable property, and cheap price, no precious metal is required, and the applications in the OLED field is promising.

The TADF material needs to have a small singlet-triplet excited state energy level difference (ΔEst). In one embodiment, ΔEst<0.3 eV. In another embodiment, ΔEst<0.2 eV. In yet another embodiment, ΔEst<0.1 eV. In one embodiment, the TADF material has a relatively small ΔEst, and in another embodiment, TADF has a better fluorescence quantum efficiency. Some TADF luminescent materials can be found in the following patent documents: CN 103483332 (A), TW 201309696(A), TW 201309778(A), TW 201343874(A), TW 201350558(A), US 20120217869(A1), WO 2013133359(A1), WO 2013154064(A1), Adachi, et. al. Adv. Mater., 21, 2009, 4802, Adachi, et. al. Appl. Phys. Lett., 98, 2011, 083302, Adachi, et. al. Appl. Phys. Lett., 101, 2012, 093306, Adachi, et. al Chem. Commun., 48, 2012, 11392, Adachi, et. al. Nature Photonics, 6, 2012, 253, Adachi, et. al. Nature, 492, 2012, 234, Adachi, et. al. J. Am Chem. Soc, 134, 2012, 14706, Adachi, et. al. Angew. Chem. Int. Ed, 51, 2012, 11311, Adachi, et. al. Chem. Commun., 48, 2012, 9580, Adachi, Et. al. Chem. Commun., 48, 2013, 10385, Adachi, et. al. Adv. Mater., 25, 2013, 3319, Adachi, et. al. Adv. Mater., 25, 2013, 3707, Adachi, et. al. Chem. Mater., 25, 2013, 3038, Adachi, et. al. Chem. Mater., 25, 2013, 3766, Adachi, et. al. J. Mater. Chem. C., 1, 2013, 4599, Adachi, et. al. J. Phys. Chem. A., 117, 2013, 5607. The entire contents of the above-listed patents and literature documents are hereby incorporated by reference.

7. Triplet Emitter

The triplet emitter is also called a phosphorescent emitter. In one embodiment, the triplet emitter is a metal complex of the general formula M(L)n, in which M may be a metal atom; L may be the same or different ligand at each occurrence, and may be bonded or coordinated to the metal atom M at one or more positions; n may be an integer greater than 1. In one embodiment, n is selected from 1, 2, 3, 4, 5, or 6. Alternatively, these metal complexes may be attached to a polymer by one or more positions. In one embodiment, these metal complexes are attached to the polymer particularly by an organic ligand.

In one embodiment, the metal atom M may be selected from the group consisting of transition metal elements, lanthanide elements, and actinide elements. In another embodiment, the metal atom M is selected from the group consisting of Ir, Pt, Pd, Au, Rh, Ru, Os, Sm, Eu, Gd, Tb, Dy, Re, Cu, and Ag. In yet another embodiment, the metal atom M is selected from the group consisting of Os, Ir, Ru, Rh, Re, Pd, and Pt.

In one embodiment, the triplet emitter includes a chelating ligand, i.e., a ligand, and is coordinated to the metal by at least two bonding sites. In another embodiment, the triplet emitter includes two or three identical or different bidentate or multidentate ligands. The chelating ligand is beneficial for improving the stability of metal complexes.

Examples of organic ligands may be selected from the group consisting of phenylpyridine derivative, 7, 8-benzoquinoline derivative, 2(2-thienyl) pyridine derivative, 2(1-naphthyl) pyridine derivative, and 2-phenylquinoline derivative. All of these organic ligands may be substituted, for example, by fluoromethyl or trifluoromethyl. The auxiliary ligand may be selected from acetylacetonate or picric acid.

In one embodiment, the metal complex which may be used as the triplet emitter has the following form:

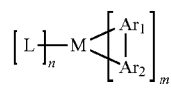

Where M is a metal selected from the group consisting of transition metal elements, lanthanide elements, and actinide elements.

$Ar_1$ may be the same or different cyclic group at each occurrence, which includes at least one donor atom, that is, an atom having a lone pair of electrons, such as nitrogen or phosphorus, through which the cyclic group is coordinated to a metal. $Ar_2$ may be the same or different cyclic group at each occurrence, which includes at least one C atom through which the cyclic group is bonded to the metal. $Ar_1$ and $Ar_2$ are covalently bonded together, and each of $Ar_1$ and $Ar_2$ can have one or more substituents, which may also be linked together by the substituents. L may be the same or different at each occurrence and is an auxiliary ligand. In one embodiment, L is a bidentate chelating ligand. In another embodiment, L is a monoanionic bidentate chelate ligand. m is selected from 1, 2 or 3. In one embodiment, m is 2 or 3. In another embodiment, m is 3. n is selected from 0, 1, or 2. In one embodiment, n is 0 or 1. In another embodiment, n is 0.

Examples of triplet emitter materials and applications thereof may be found in the following patent documents and references: WO200070655, WO200141512, WO200202714, WO200215645, EP1191613, EP1191612, EP1191614, WO2005033244, WO2005019373, US2005/0258742, WO2009146770, WO2010015307, WO2010031485, WO2010054731, WO2010054728, WO2010086089, WO2010099852, WO2010102709, US20070087219A1, US20090061681A1, US20010053462A1, Baldo, Thompson et al. Nature 403, (2000), 750-753, US 20090061681 A1, US 20090061681 A1, Adachi et al. Appl. Phys. Lett. 78 (2001), 1622-1624, J. Kido et al. Appl. Phys. Lett. 65 (1994), 2124, Kido et al. Chem. Lett. 657, 1990, US 2007/0252517 A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, 6,835,469, 6,830,828, US 20010053462 A1, WO2007095118 A1, US2012004407A1, WO 2012007088A1, WO2012007087A1, WO2012007086A1, US2008027220A1, WO2011157339A1, CN102282150A, WO2009118087A1. The entire contents of the above-listed patent documents and literatures are hereby incorporated by reference.

In one embodiment, the organic functional group G is selected from the triplet matrix groups.

In another embodiment, the organic functional group G is selected from the TADF emitter groups.

In yet another embodiment, the organic functional group G is selected from the triplet emitter groups.

In still another embodiment, the organic functional group G is selected from the singlet emitter groups.

In a further embodiment, the organic functional group G includes organic functional groups G1 and G2, and the organic functional group G1 is selected from the triplet matrix groups and the organic functional group G2 is selected from the triplet emitter groups.

In a further embodiment, the organic functional group G includes organic functional groups G1 and G2, and the organic functional group G1 is selected from the hole transport groups and the organic functional group G2 is selected from the electron transport groups.

The present disclosure further provides a first monomer having the following general formula (5),

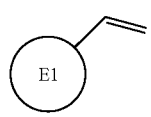

(5)

The E1 group has a (HOMO–(HOMO–1) greater than or equal to 0.3 eV.

In one embodiment, (HOMO–(HOMO–1) of the E1 group is greater than or equal to 0.3 eV. In another embodiment, (HOMO–(HOMO–1) of the E1 group is greater than or equal to 0.35 eV. In yet another embodiment, (HOMO–(HOMO–1) of the E1 group is greater than or equal to 0.4 eV. In still another embodiment, (HOMO–(HOMO–1) of the E1 group is greater than or equal to 0.45 eV. In a further embodiment, (HOMO–(HOMO–1) of the E1 group is greater than or equal to 0.5 eV.

The present disclosure further provides a mixed monomer including the first monomer and a second monomer. The second monomer has the following general formula (6):

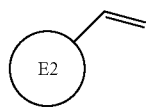

(6)

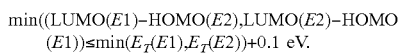

In one embodiment, $\min((LUMO(E1)-HOMO(E2), LUMO(E2)-HOMO(E1))-\min(E_T(E1), E_T(E2))\leq 0$ eV. In another embodiment, $\min((LUMO(E1)-HOMO(E2), LUMO(E2)-HOMO(E1))-\min(E_T(E1), E_T(E2))\leq 0.05$ eV. In yet another embodiment, $\min((LUMO(E1)-HOMO(E2), LUMO(E2)-HOMO(E1))-\min(E_T(E1), E_T(E2))\leq 0.10$ eV. In still another embodiment, $\min((LUMO(E1)-HOMO(E2), LUMO(E2)-HOMO(E1))-\min(E_T(E1), E_T(E2))\leq 0.15$ eV. In a further embodiment, $\min((LUMO(E1)-HOMO(E2), LUMO(E2)-HOMO(E1))-\min(E_T(E1), E_T(E2))\leq 0.20$ eV.

The E1 group in the first monomer and the E2 group in the second monomer are the same meaning as the E1 group and the E2 group in the polymer, respectively, and are not described herein again.

Examples of suitable first monomers are listed below:

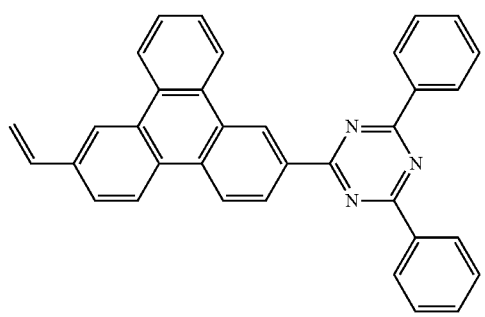

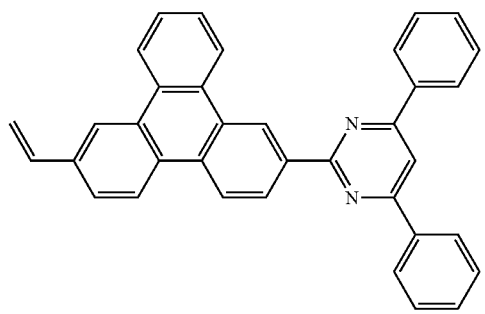

-continued
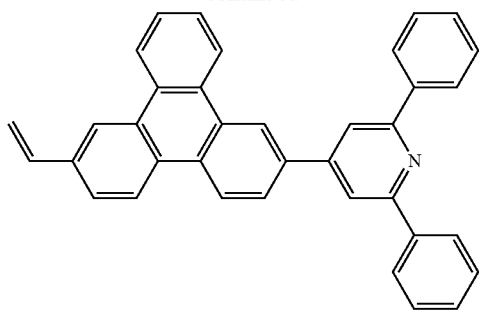
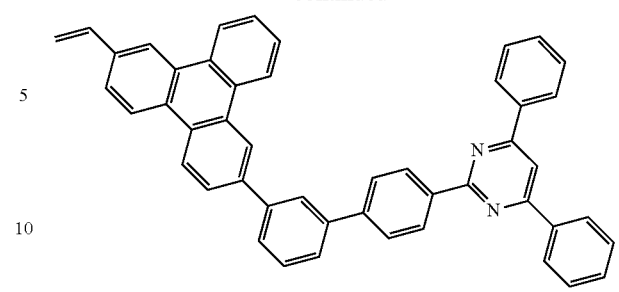
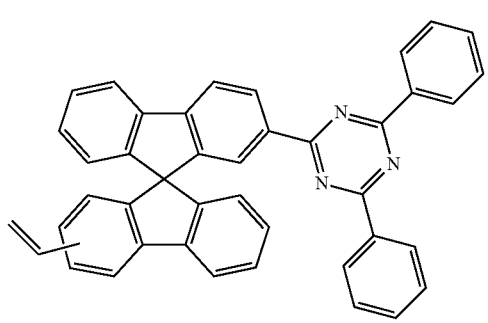
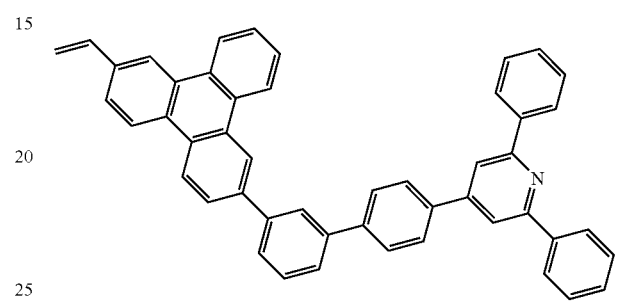
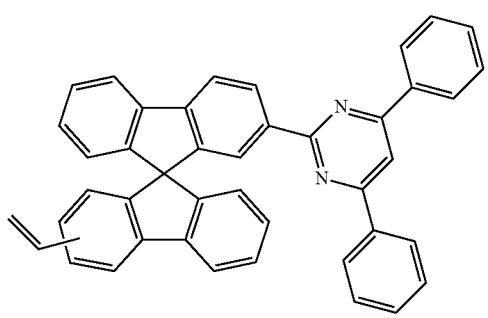
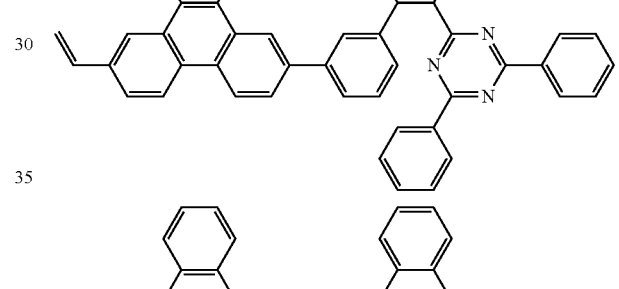
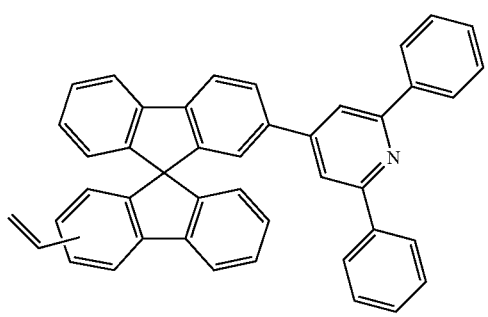
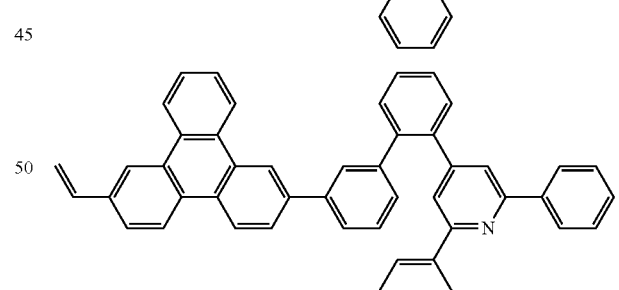
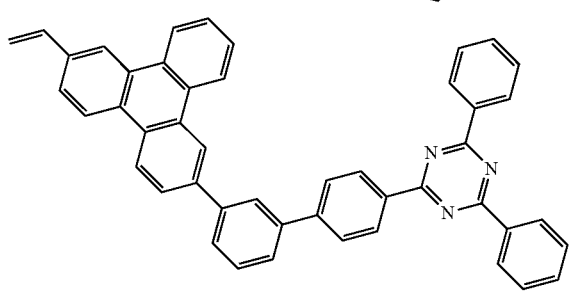
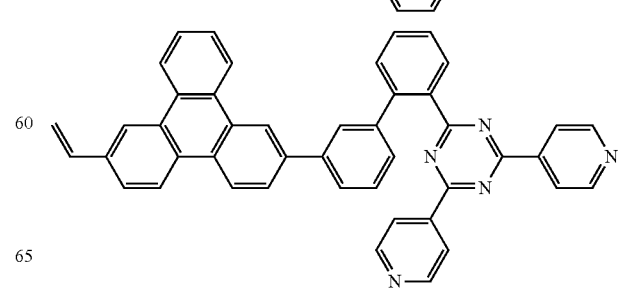

81
-continued
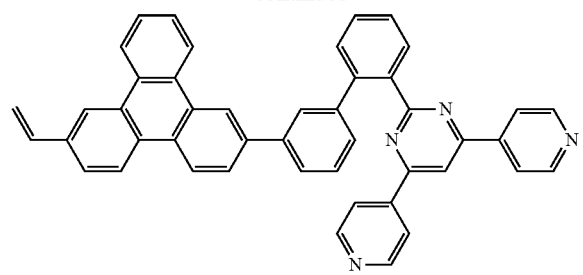
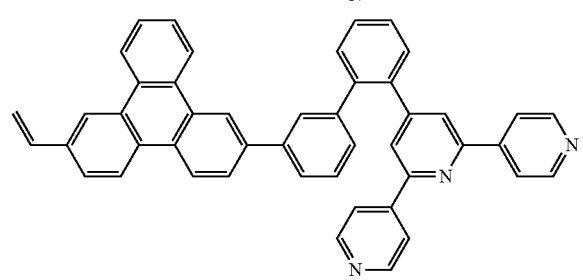
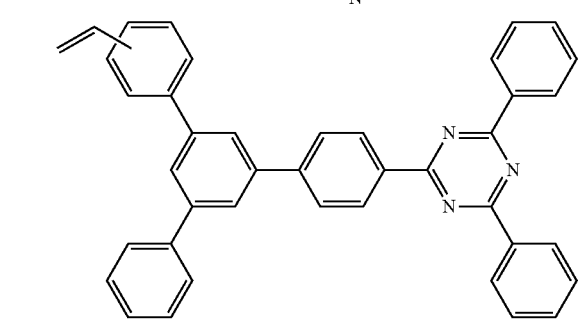
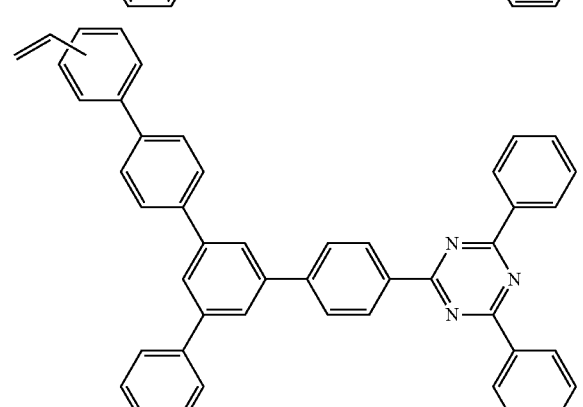
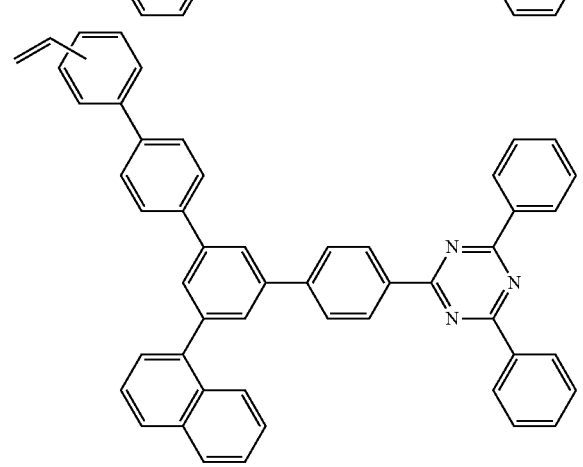
82
-continued
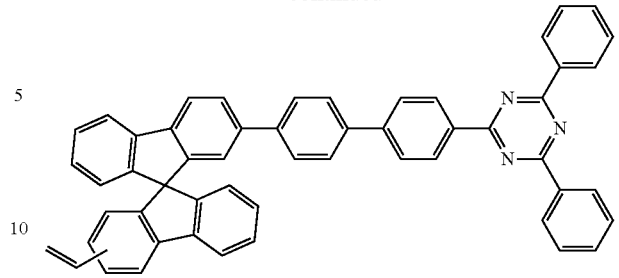
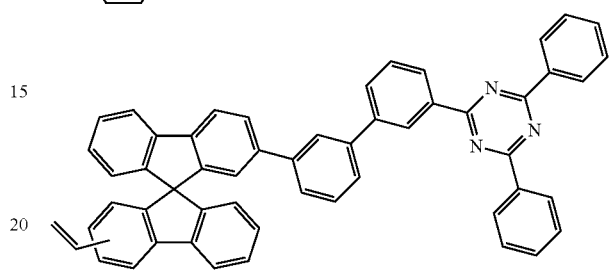
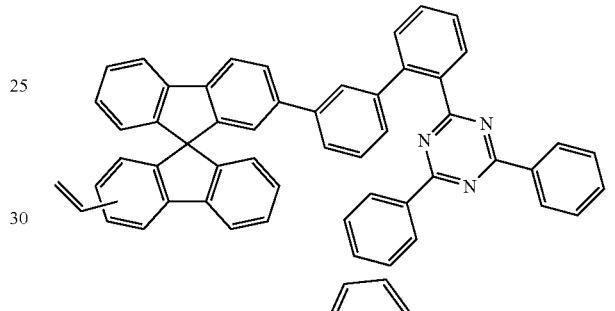
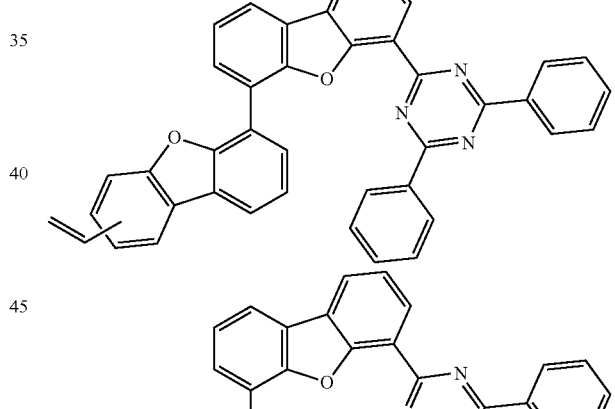
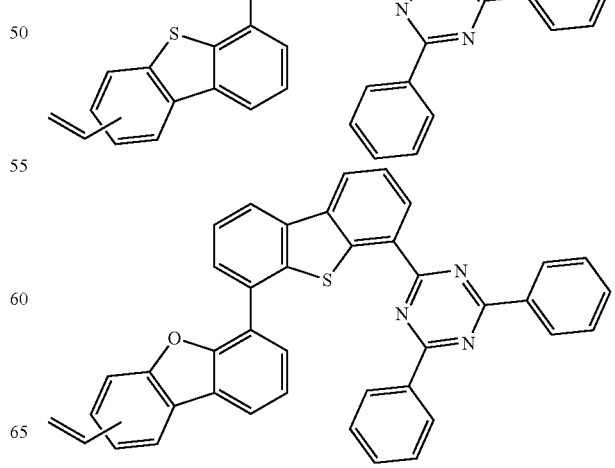

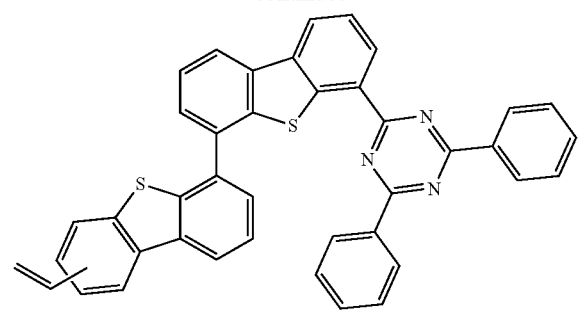
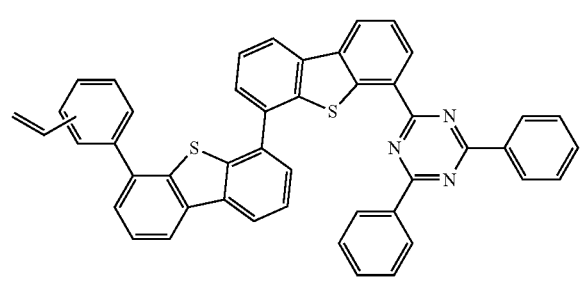
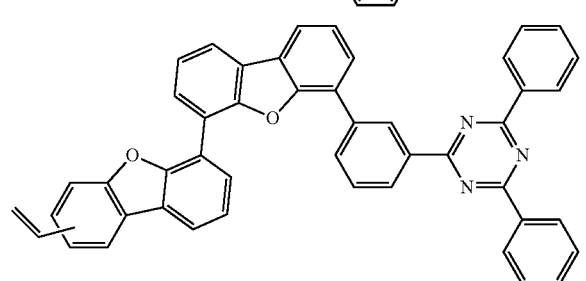
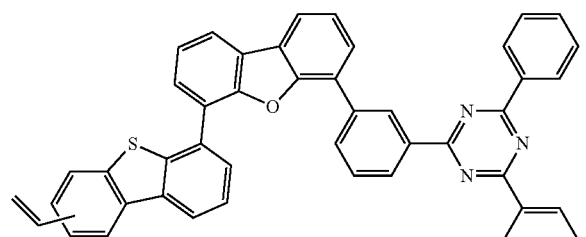
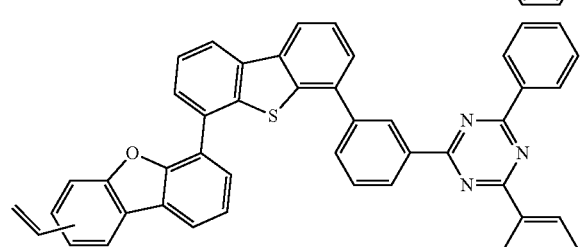
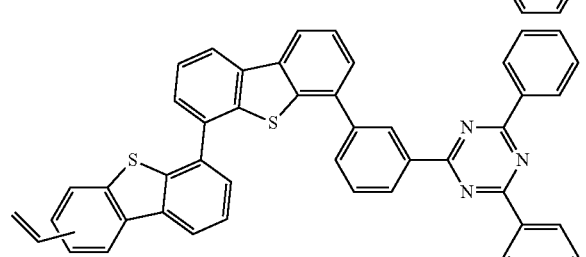
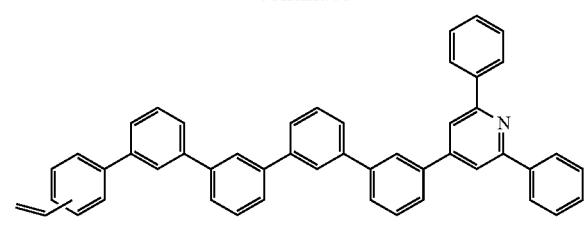
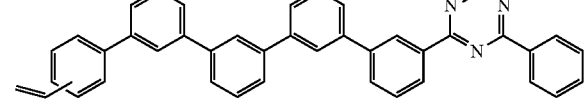
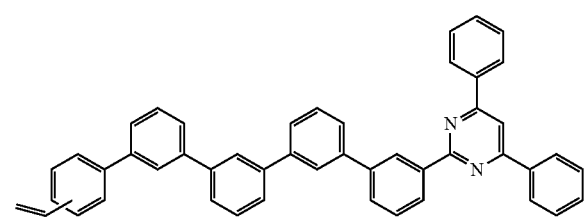
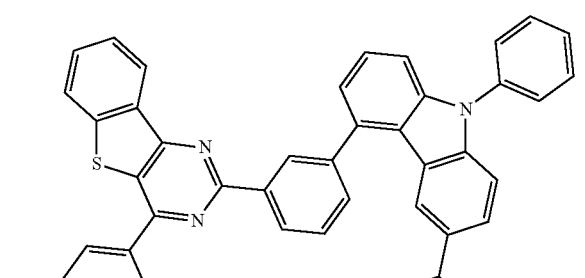
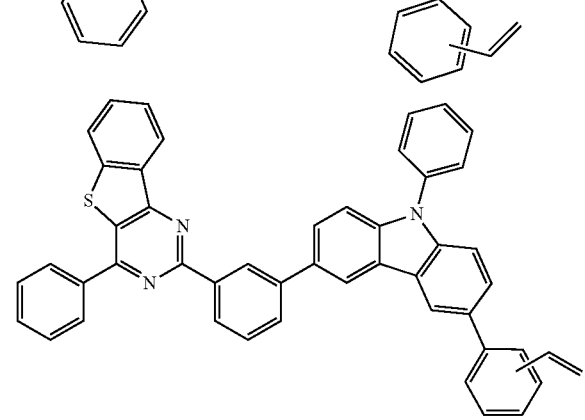
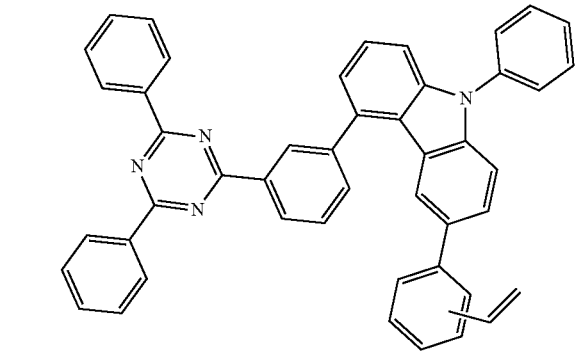

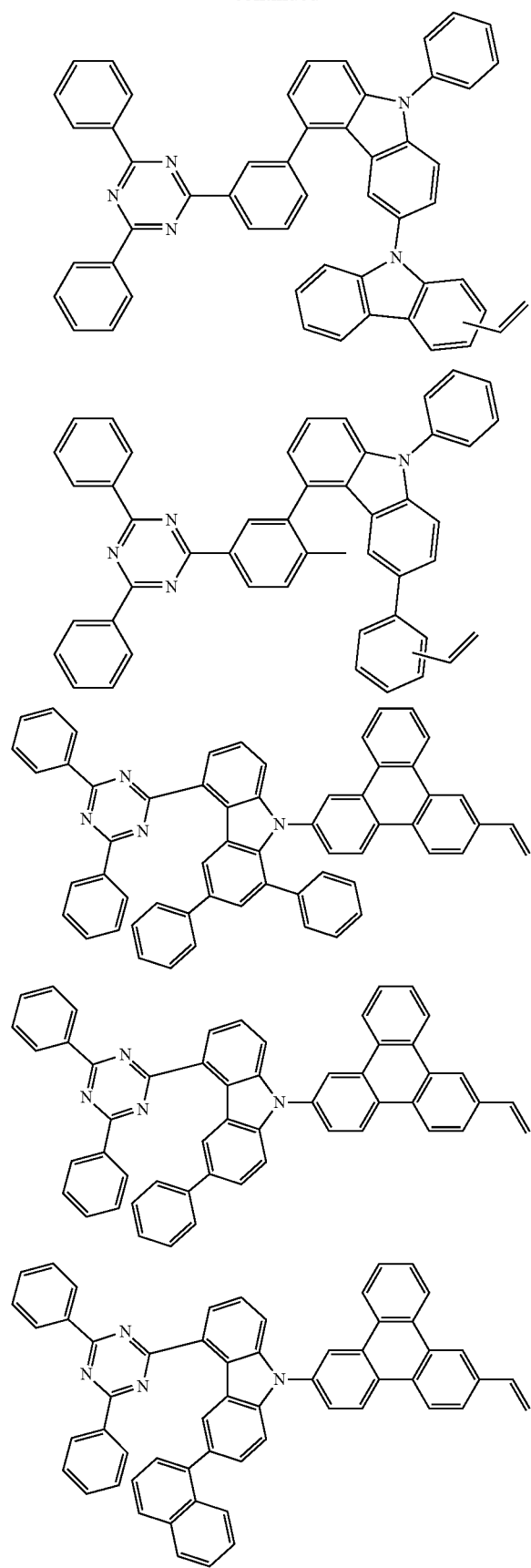
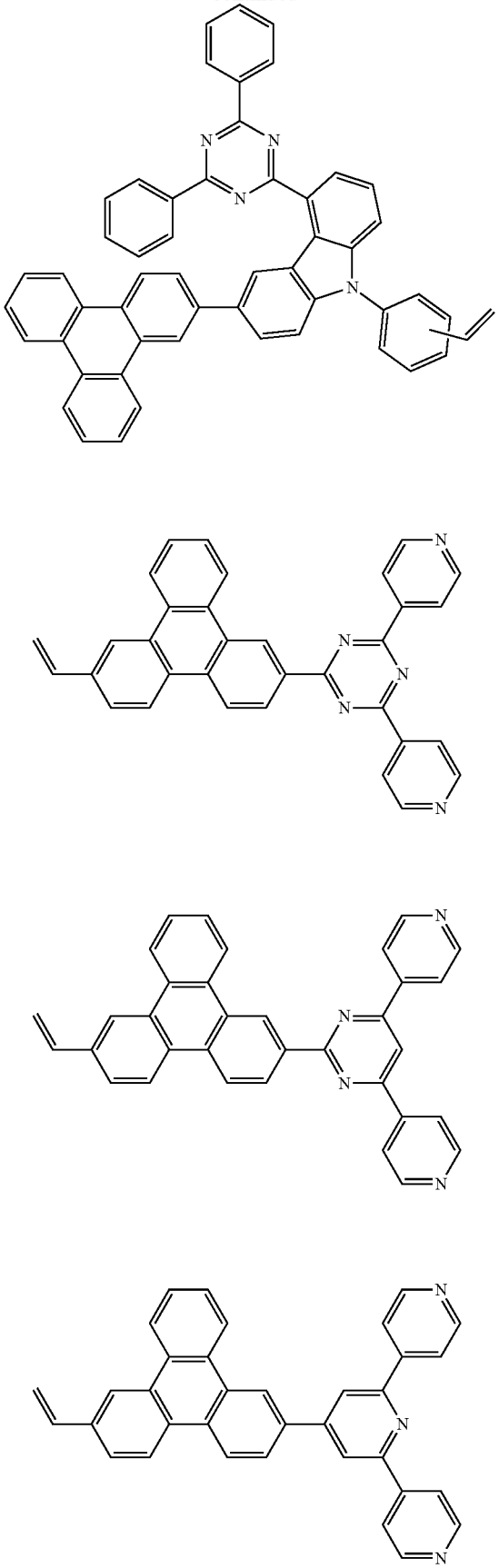

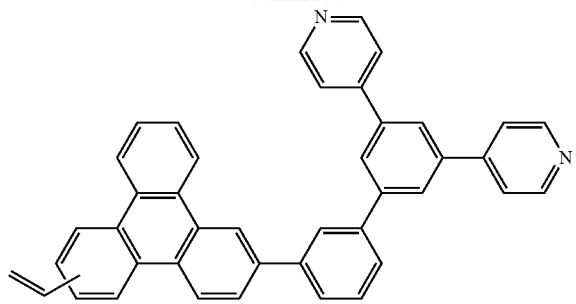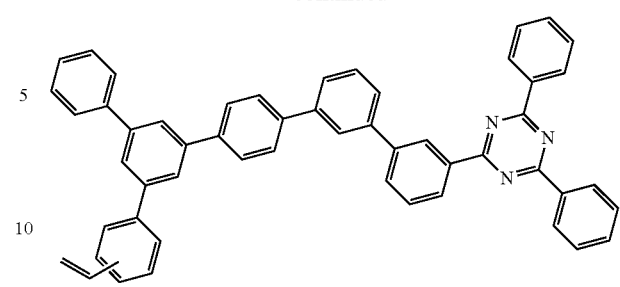

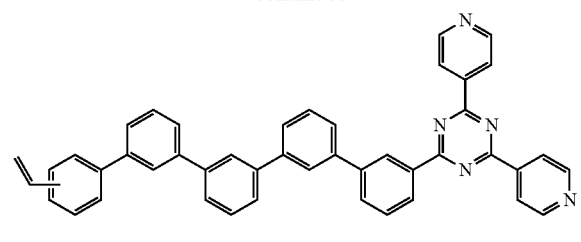
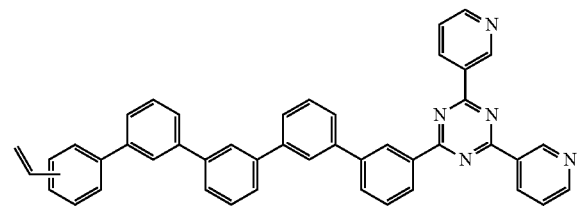
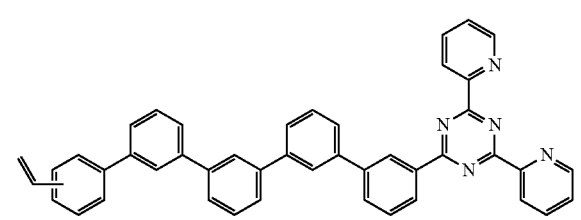
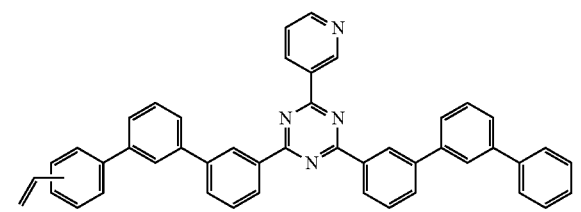
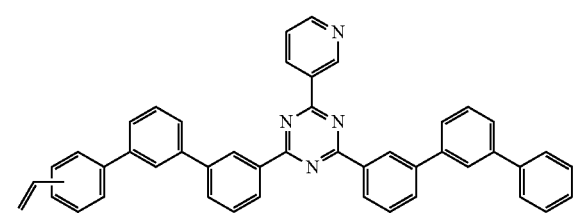
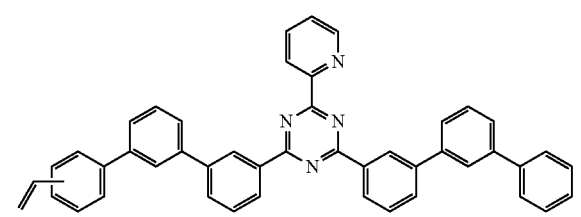
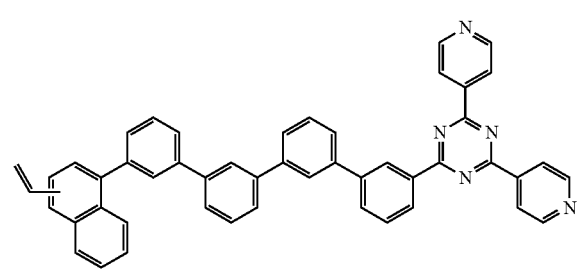
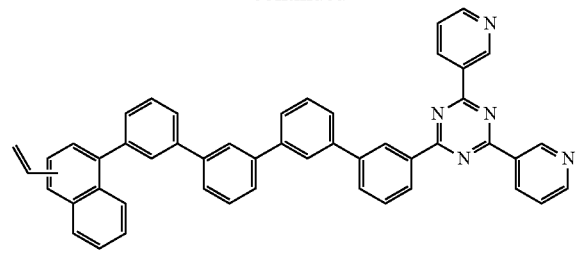
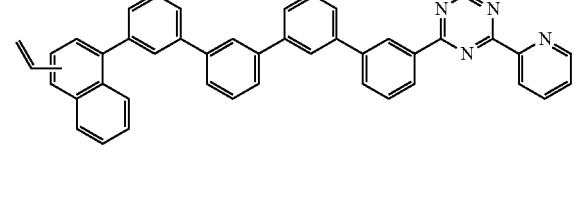
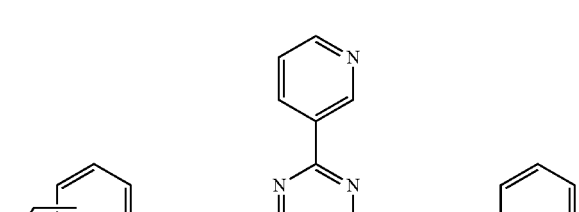
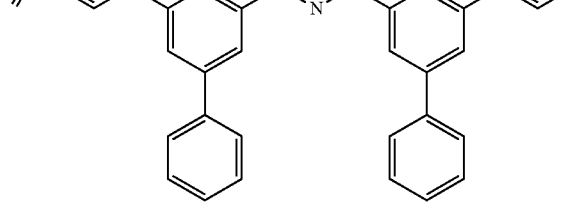
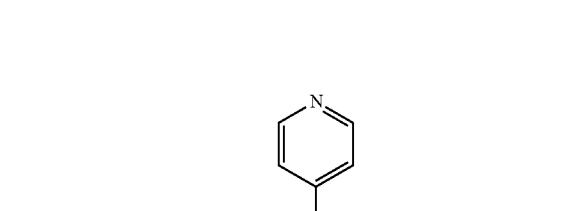
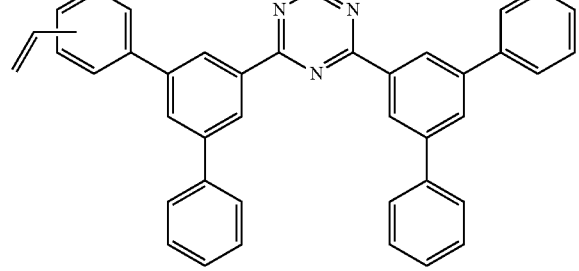

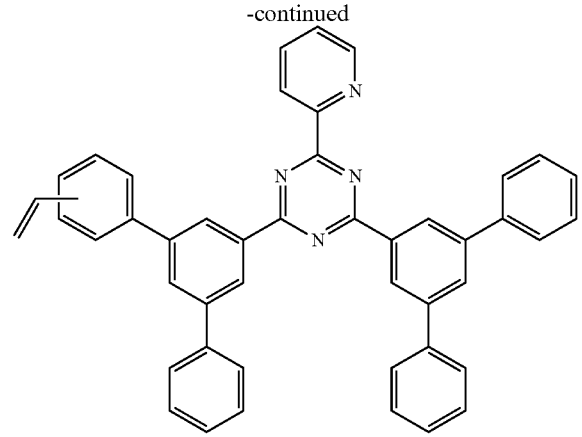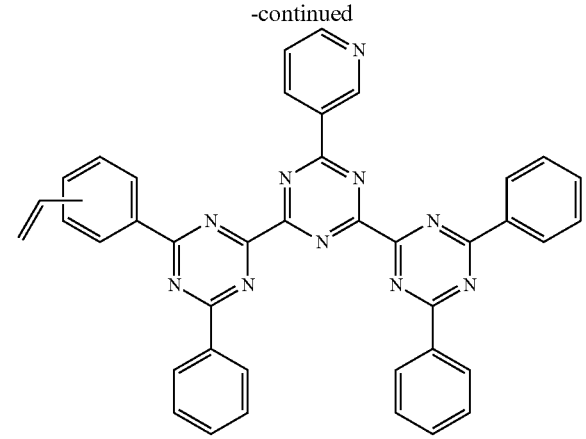

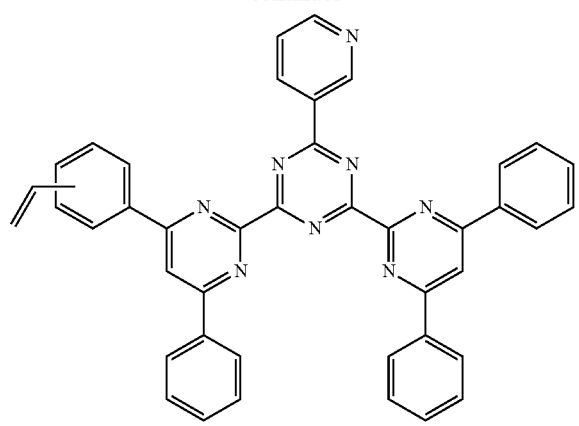
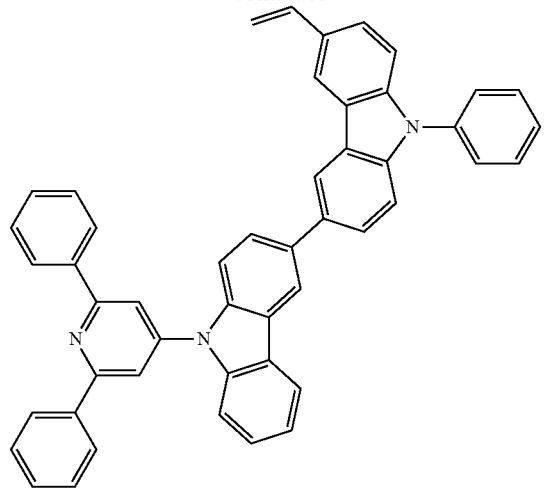
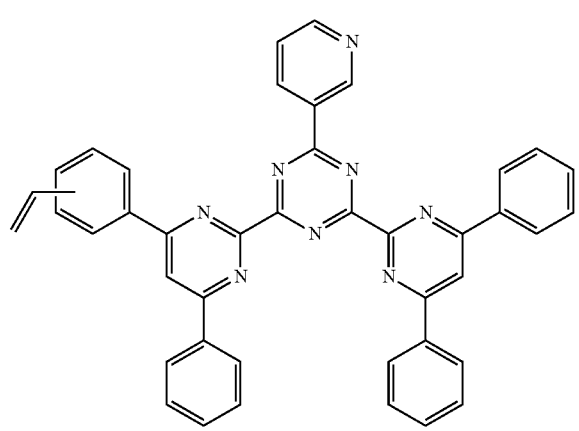
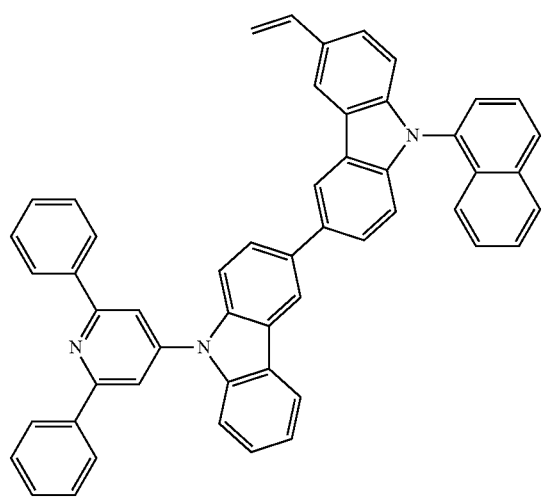
Examples of suitable second monomers are listed below:
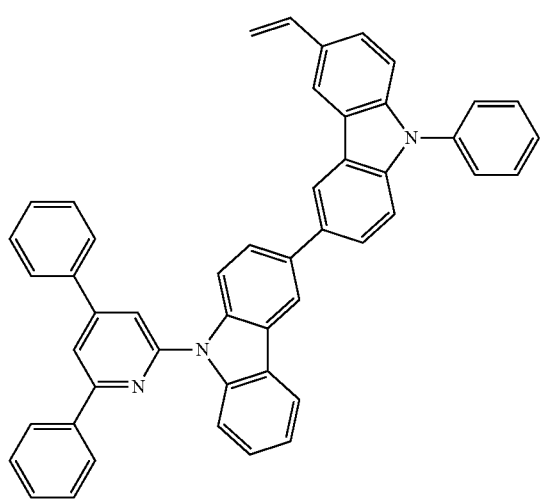
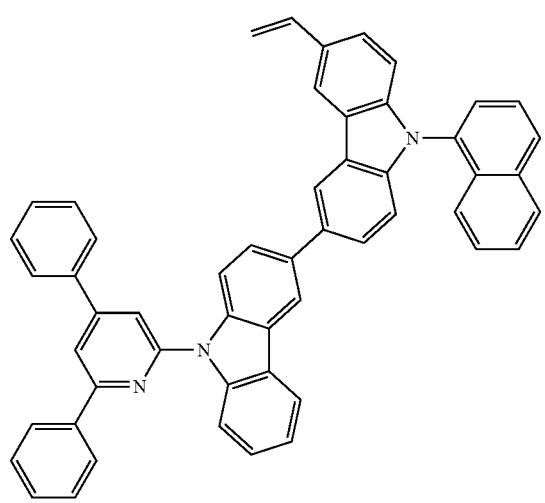

95
-continued
96
-continued
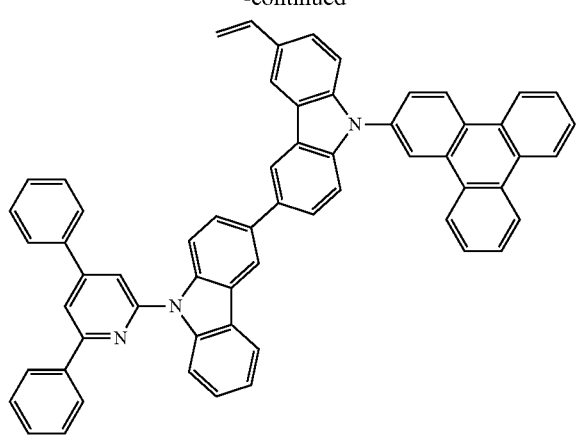
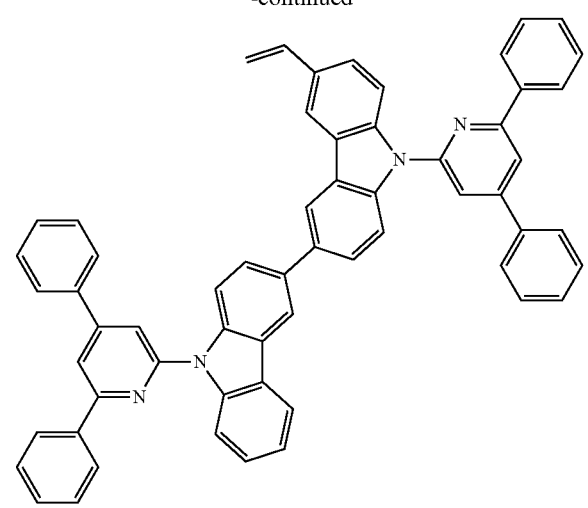

-continued
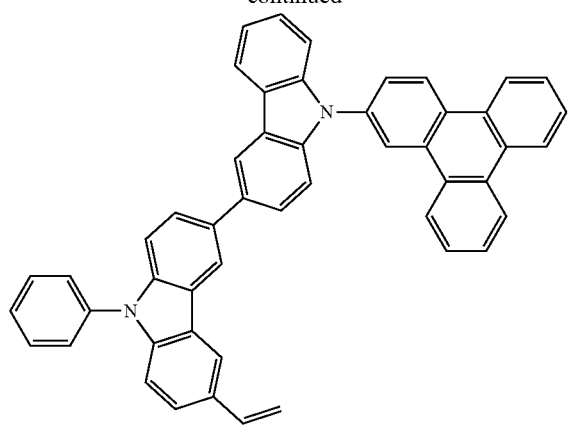
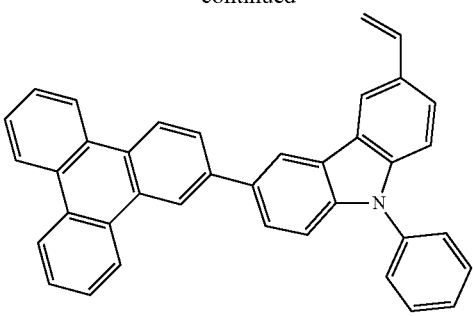
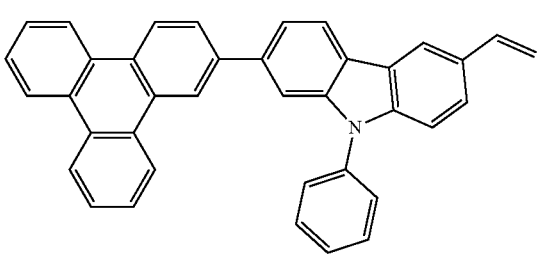
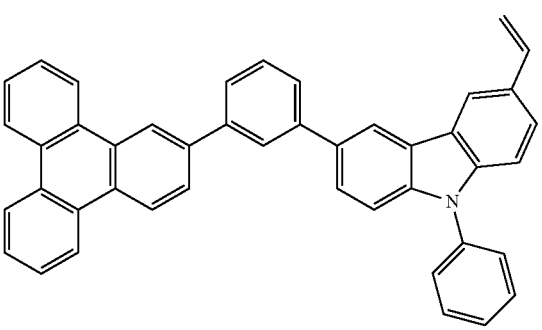
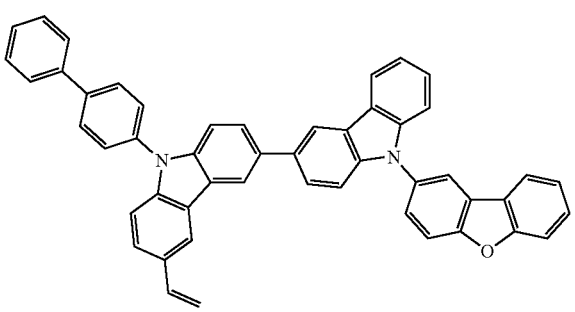
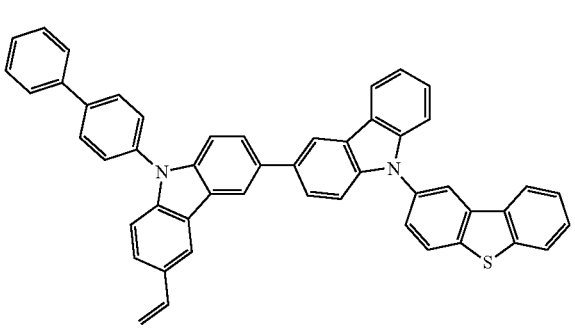

99
-continued
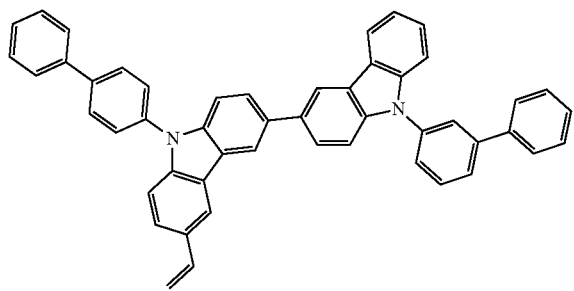
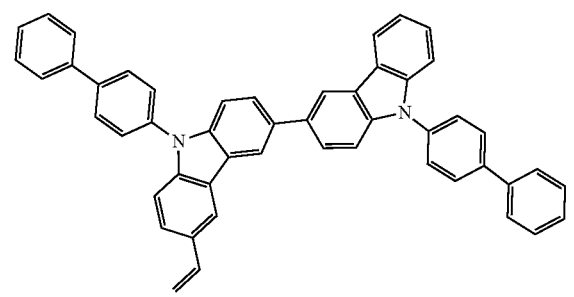
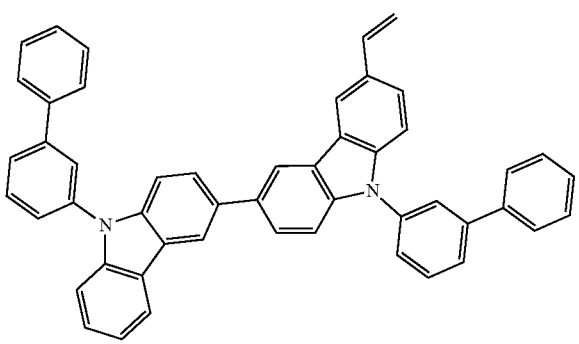
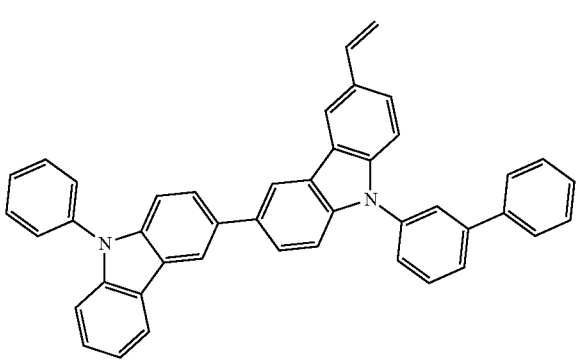
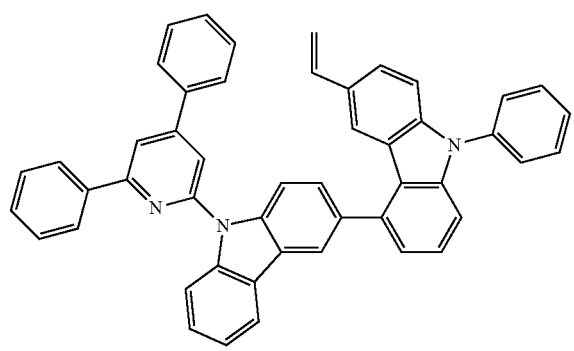
100
-continued
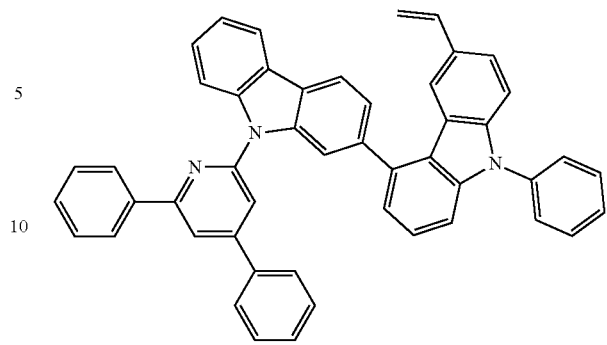
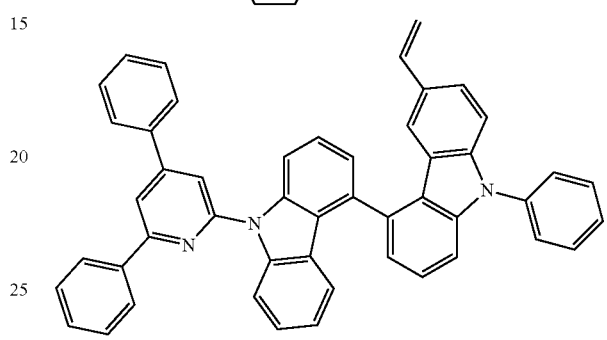
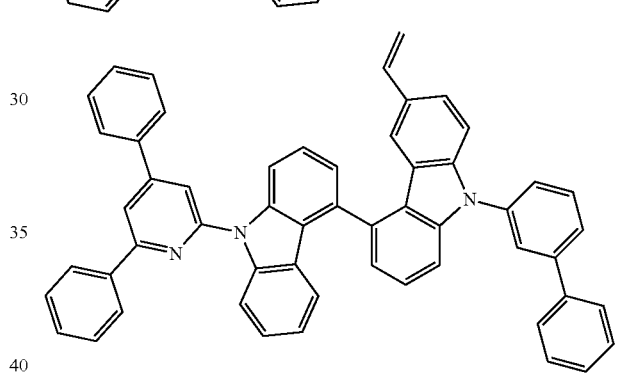
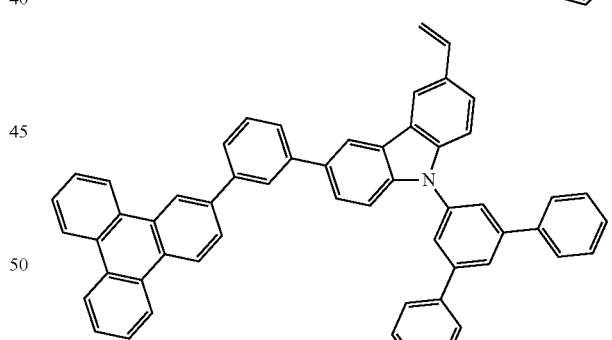
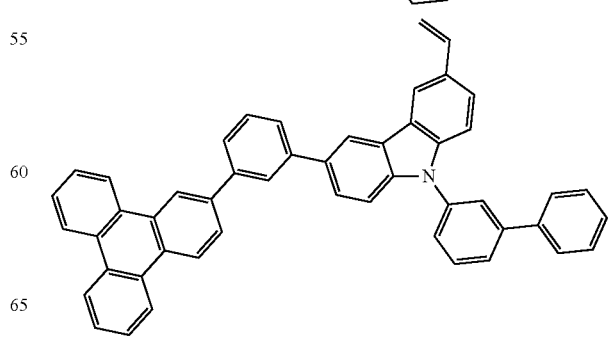

101
-continued
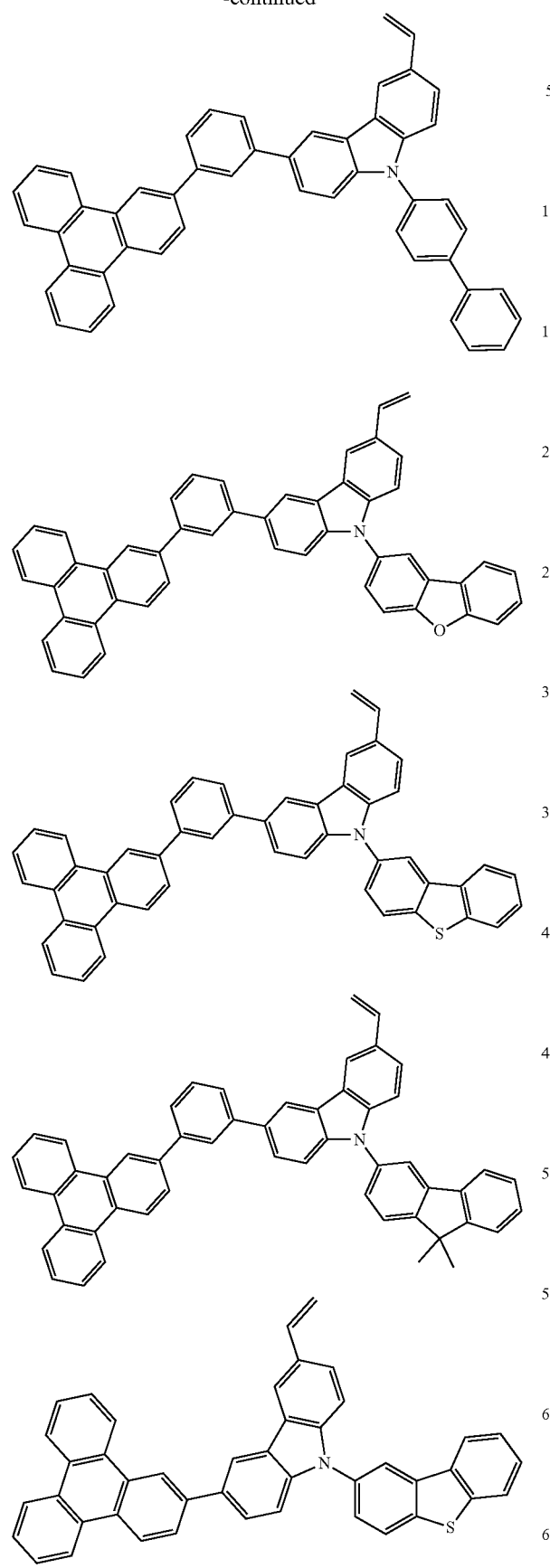
102
-continued
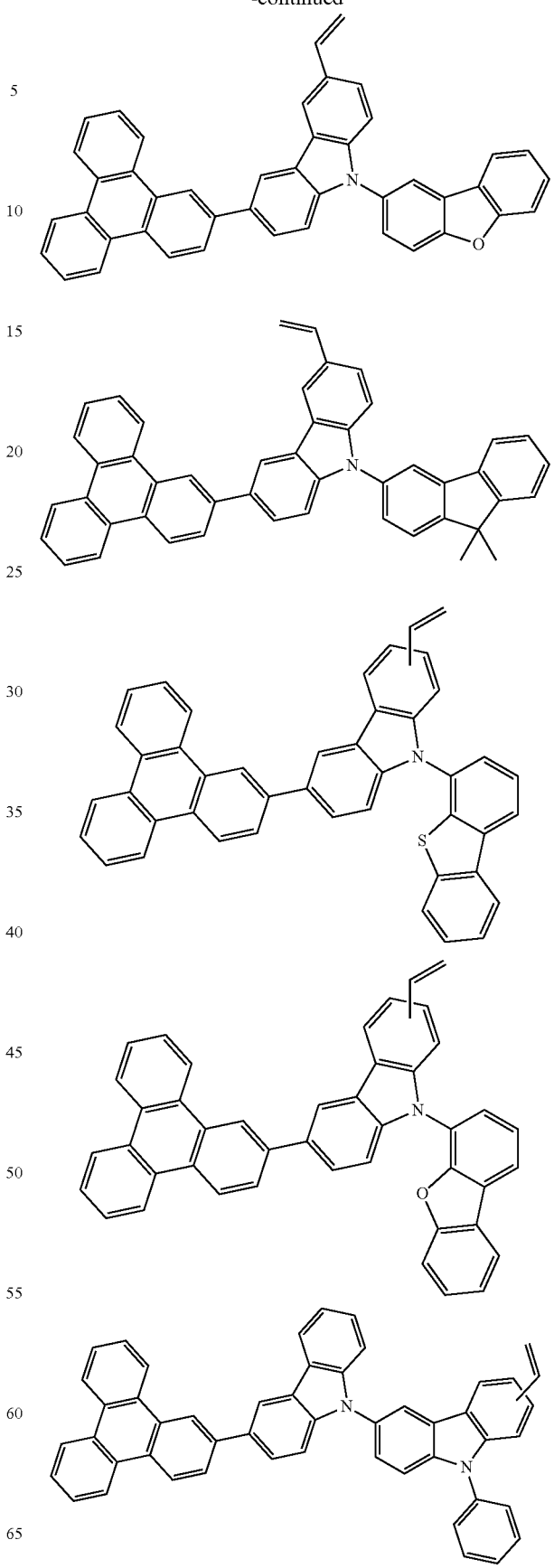

103
-continued
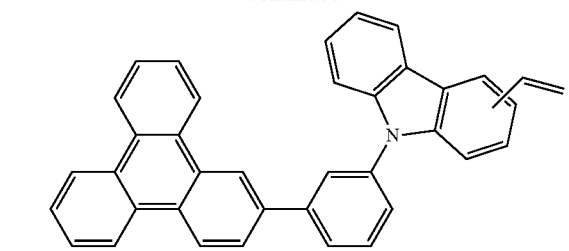
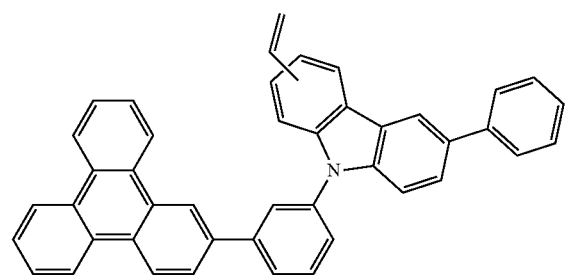
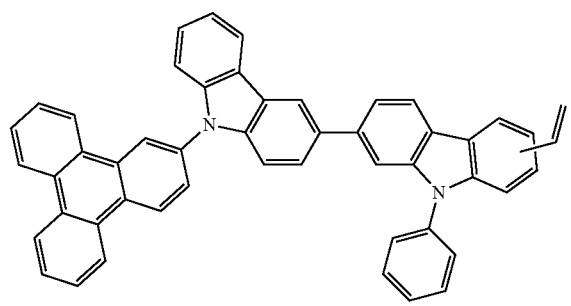
104
-continued
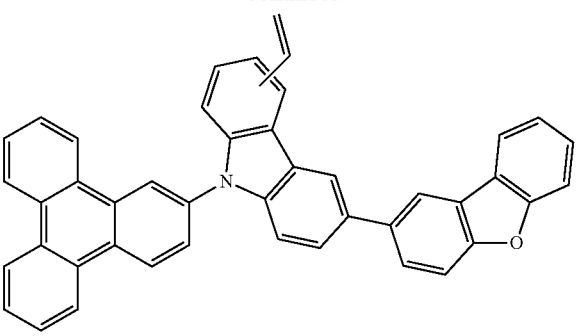
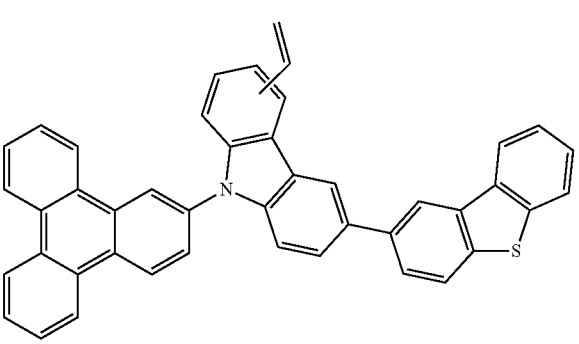
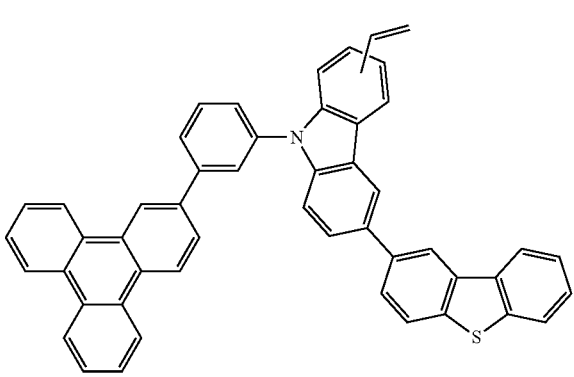
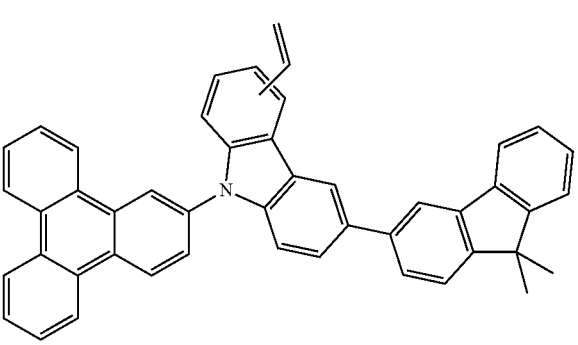
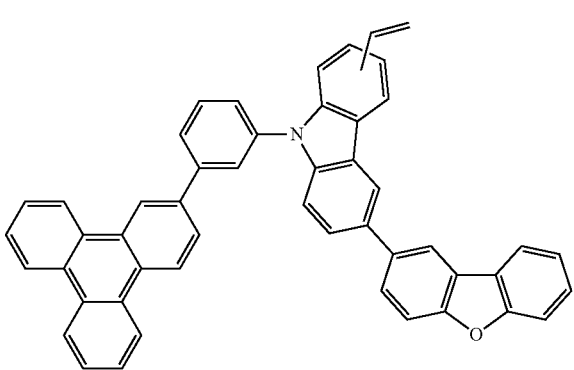

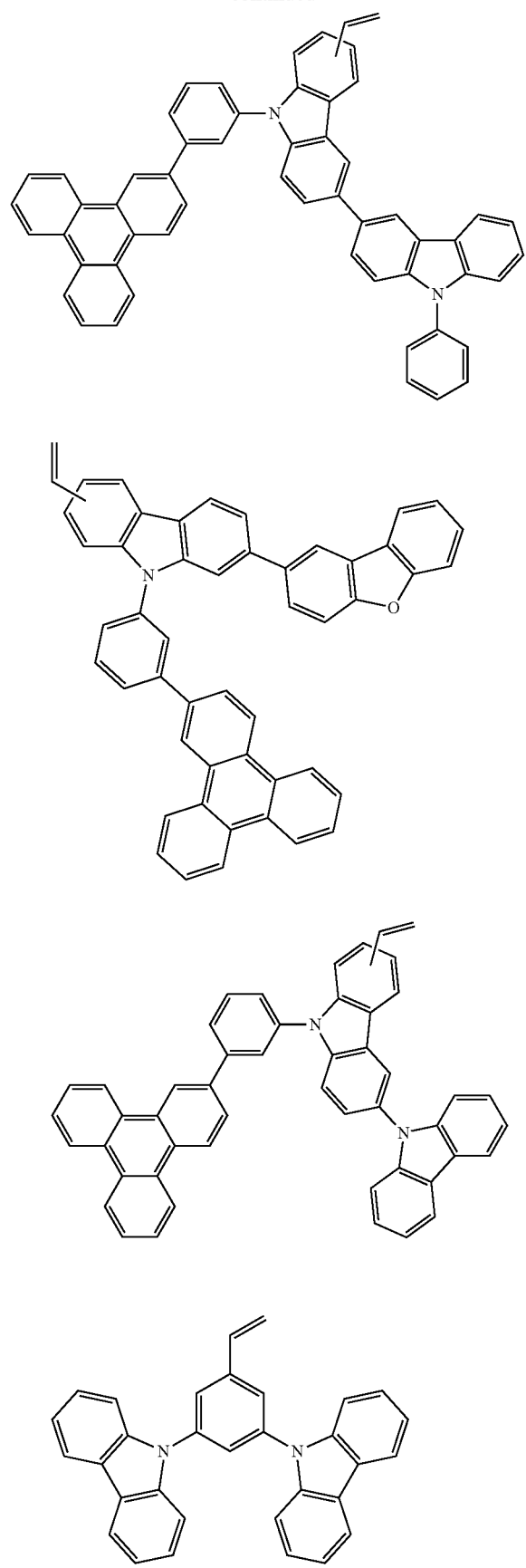
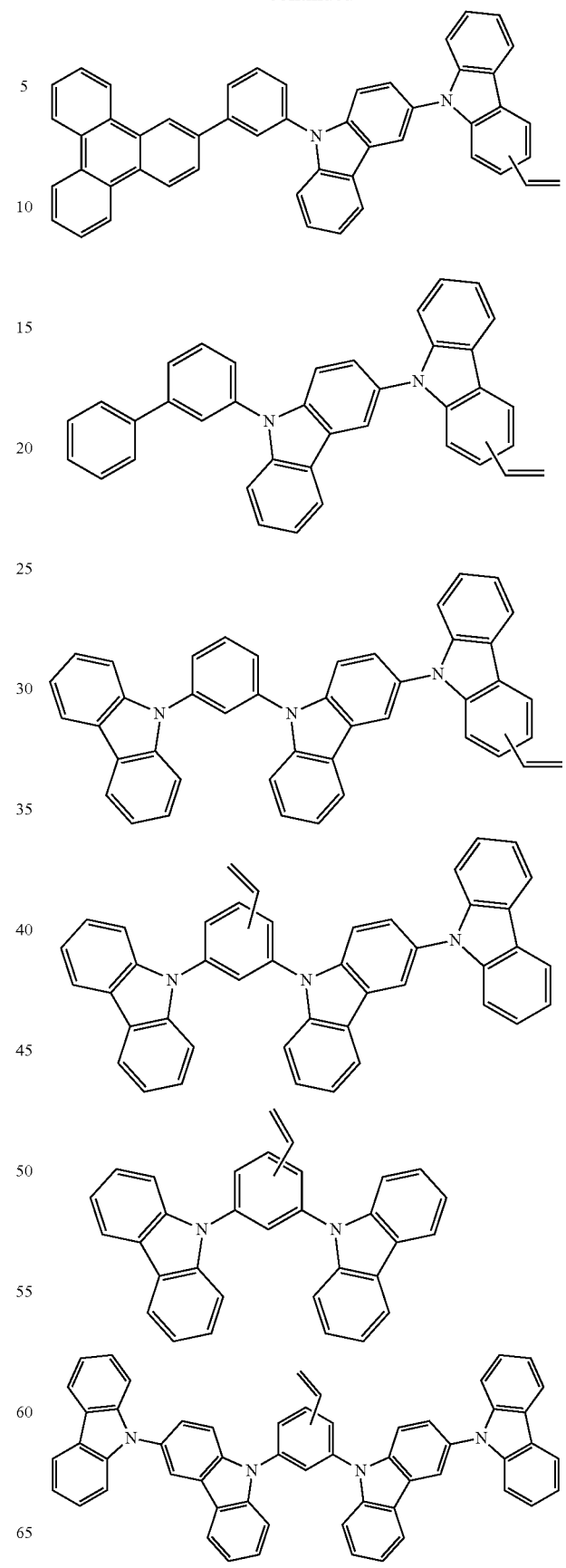

107

-continued

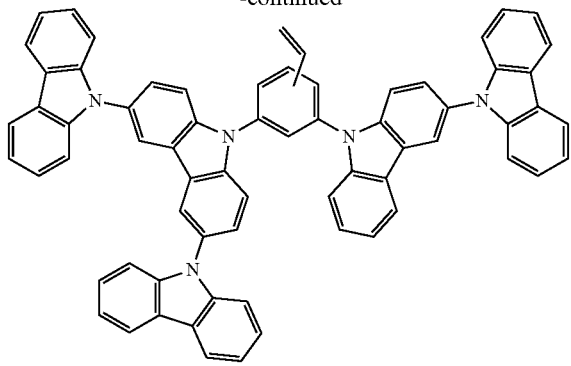

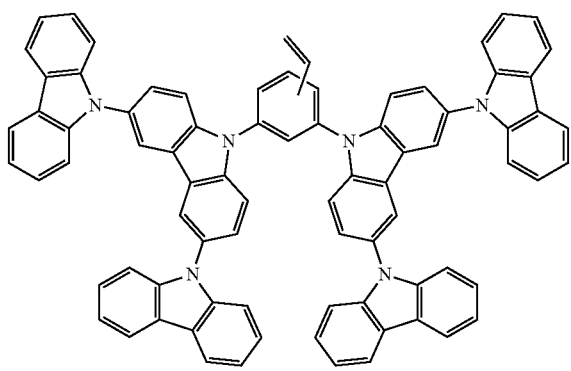

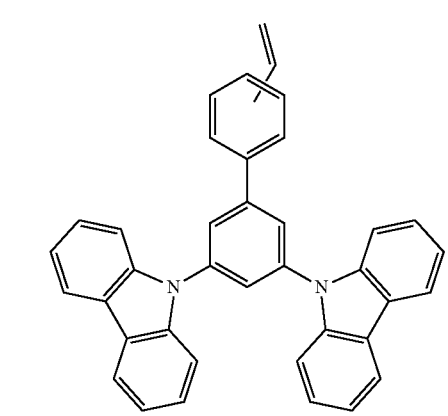

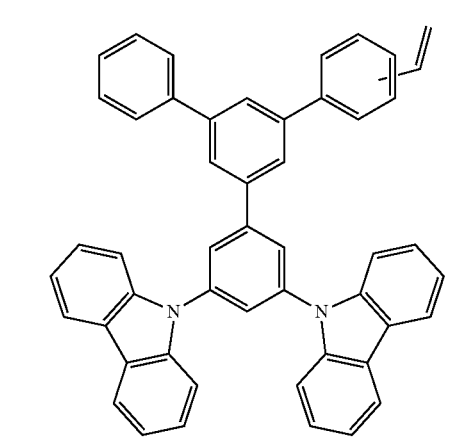

108

-continued

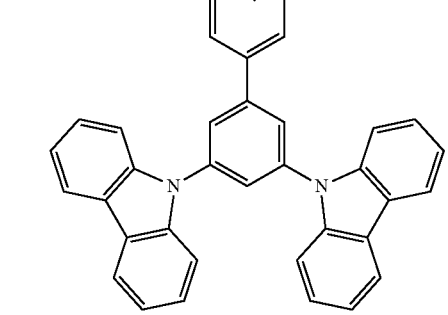

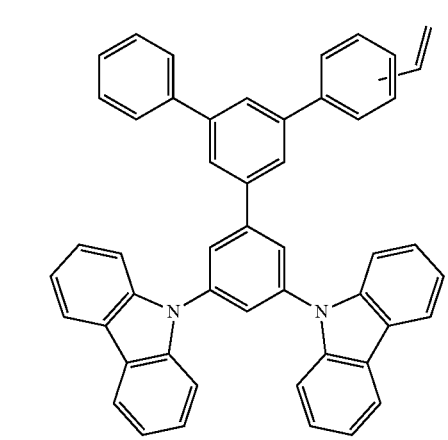

The present disclosure further relates to a polymer represented by the following general formula (4), and n is an integer greater than or equal to 1:

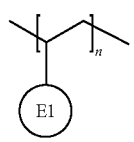

(4)

(HOMO−(HOMO−1)) of the E1 group is greater than or equal to 0.3 eV; and when n is greater than 1, E1 may be selected from different groups as long as (HOMO−(HOMO−1)) of each E1 is greater than or equal to 0.3 eV.

In some embodiments, ((HOMO−(HOMO−1)) of the E1 group in the general formula (4) is greater than or equal to 0.35 eV. In another embodiment, ((HOMO−(HOMO−1)) of the E1 group is greater than or equal to 0.4 eV. In yet another embodiment, ((HOMO−(HOMO−1)) of the E1 group is greater than or equal to 0.45 eV. In still another embodiment, ((HOMO−(HOMO−1)) of the E1 group is greater than or equal to 0.5 eV.

In one embodiment, the E1 group in the general formula (4) contains a structural unit represented by one of the general formulas (2) to (5) as described above.

In another embodiment, the E1 group in the general formula (4) contains the following structural units:

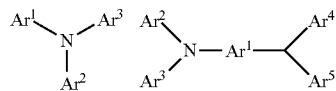

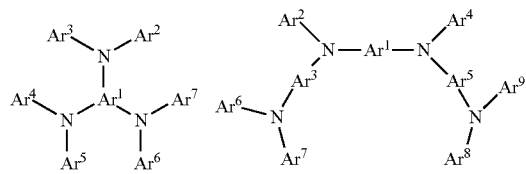

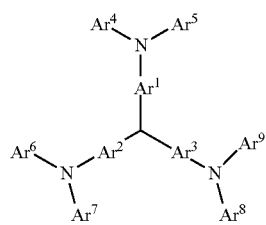

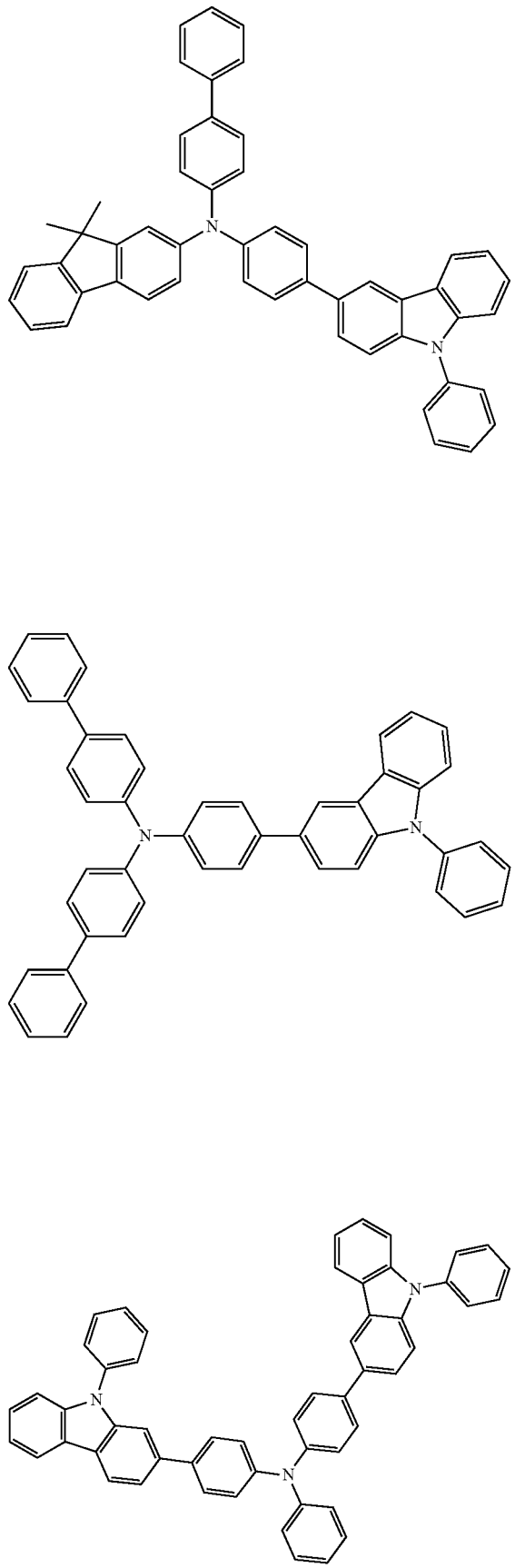

Each of $Ar^1$ to $Ar^8$ may be independently selected from the group consisting of cyclic aromatic hydrocarbon compounds, such as benzene, biphenyl, triphenyl, benzo, naphthalene, anthracene, phenalene, phenanthrene, fluorene, pyrene, chrysene, perylene, azulene; and aromatic heterocyclic compounds such as dibenzothiophene, dibenzofuran, furan, thiophene, benzofuran, benzothiophene, carbazole, pyrazole, imidazole, triazole, isoxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indoxazine, bisbenzoxazole, isoxazole, benzothiazole, quinoline, isoquinoline, cinnoline, quinazoline, quinoxaline, naphthalene, phthalein, pteridine, xanthene, acridine, phenazine, phenothiazine, phenoxazine, dibenzoselenophene, benzoselenophene, benzofuropyridine, indolocarbazole, pyridylindole, pyrrolodipyridine, furodipyridine, benzothienopyridine, thienodipyridine, benzoselenophenopyridine and selenophenodipyridine; and groups containing 2 to 10 ring structures, which may be the same or different types of cyclic aryl or aromatic heterocyclic groups, and are linked to each other directly or through at least one of the following groups, such as an oxygen atom, a nitrogen atom, a sulfur atom, a silicon atom, a phosphorus atom, a boron atom, a chain structural unit, and an aliphatic ring group. Each Ar may be further substituted, and the substituents may be selected from the group consisting of hydrogen, alkyl, alkoxy, amino, alkene, alkyne, aralkyl, heteroalkyl, aryl, and heteroaryl.

In one embodiment, according to the polymer of the general formula (4), the E1 group may contain one or more of the following structural units:

111
-continued
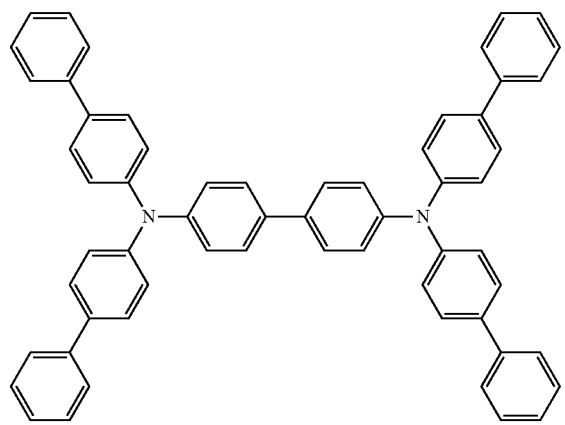
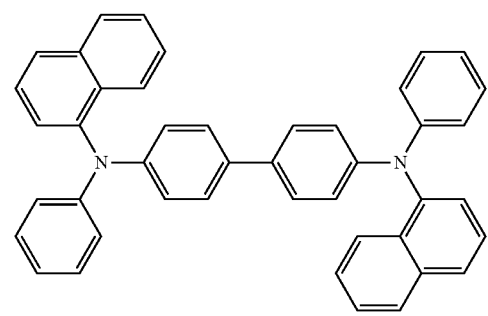
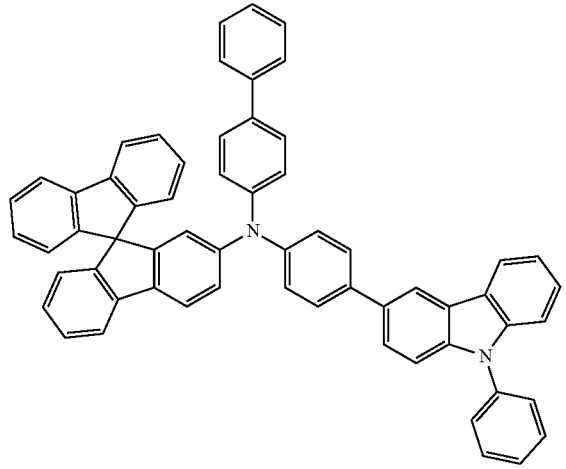
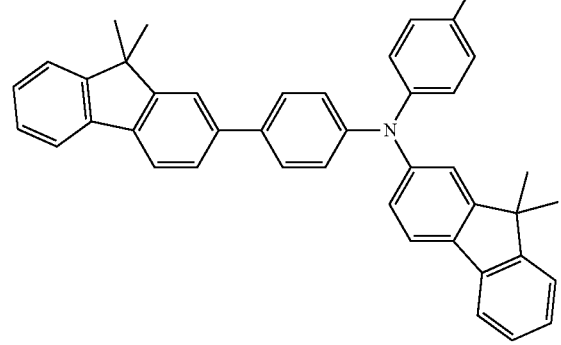
112
-continued
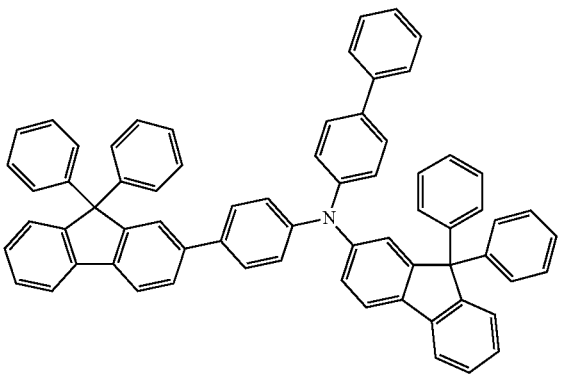
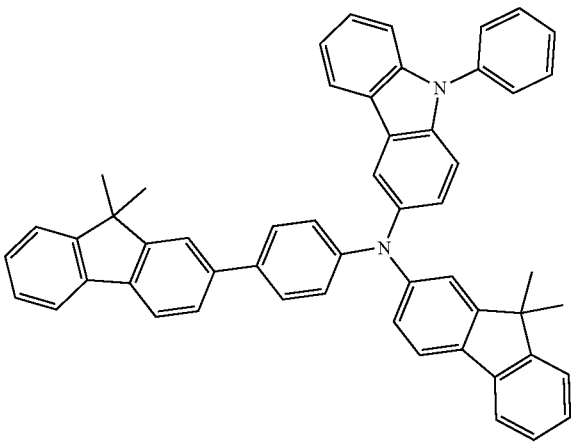
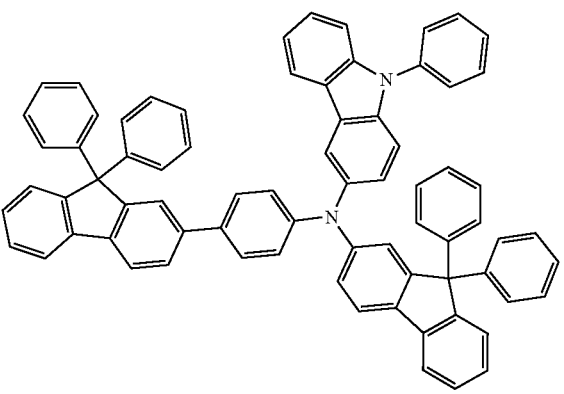
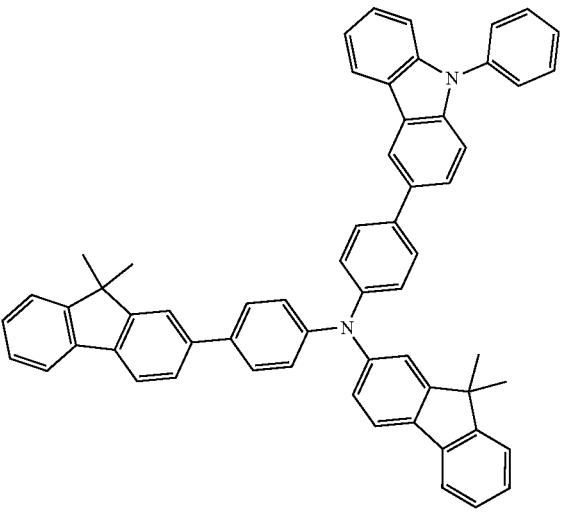

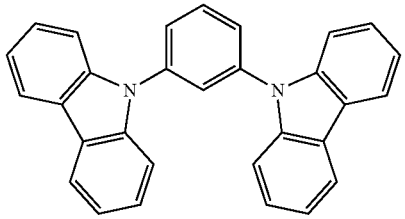 [SMILES: c1cc(-n2c3ccccc3c3ccccc32)cc(-n2c3ccccc3c3ccccc32)c1]

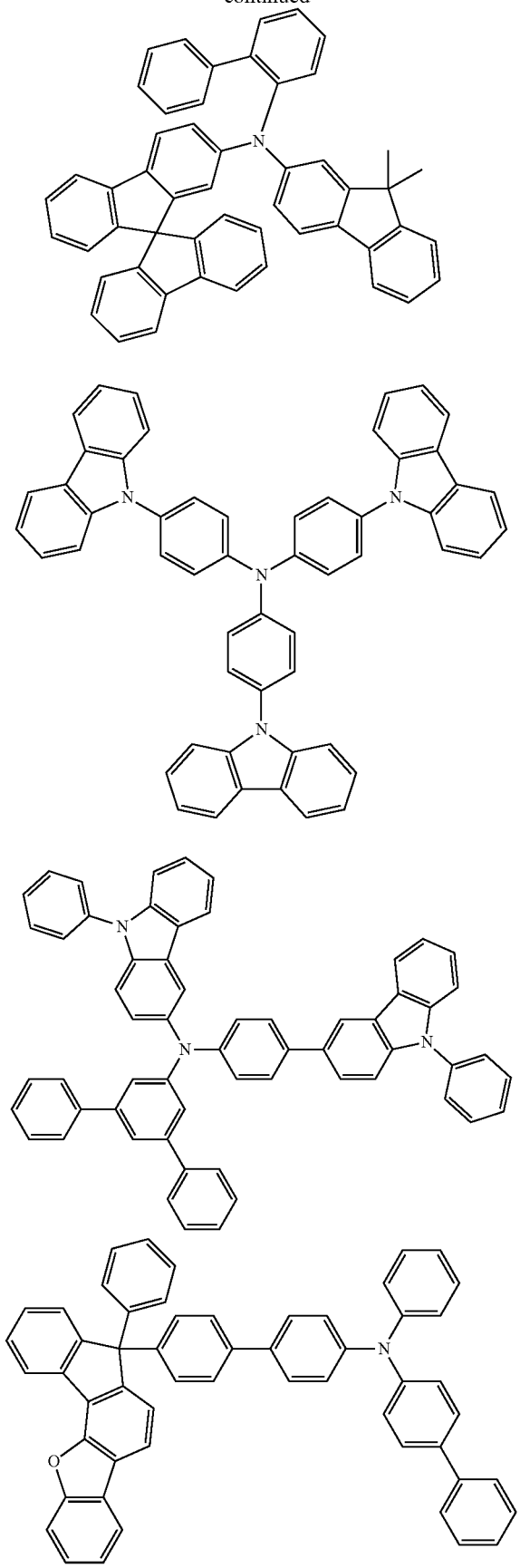

The present disclosure further provides a mixture including one of the polymers represented by the general formulas (1) to (4) and another organic functional material. The organic functional material may be selected from the group consisting of a hole (also called an electron hole) injection or transport material (HIM/HTM), a hole blocking material (HBM), an electron injection or transport material (EIM/ETM), an electron blocking material (EBM), an organic host material (Host), a singlet emitter (fluorescent emitter), a triplet emitter (phosphorescent emitter), and a TADF material. These functional materials have been previously described. In one embodiment, the organic functional material is a fluorescent emitter. In another embodiment, the organic functional material is a phosphorescent emitter. In yet another embodiment, the organic functional material is a TADF material.

The present disclosure further relates to a formulation including one of the polymers represented by the general formulas (1) to (4) and an organic solvent. Examples of the organic solvents include, but are not limited to, methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxahexane, acetone, methyl ethyl ketone, 1,2-dichloroethane, 3-phenoxytoluene, 1, 1, 1-trichloroethane, 1, 1, 2, 2-tetrachloroethane, ethyl acetate, butyl acetate, dimethylformamide, dimethylacetamide, dimethyl sulfoxide, tetrahydronaphthalene, decalin, indene and/or their combination.

In one embodiment, the formulation according to the present disclosure is a solution.

In another embodiment, the formulation according to the present disclosure is a suspension.

In the embodiments of the present disclosure, the polymer in the formulation has a weight percent range from 0.01 wt % to 20 wt %. In one embodiment, the polymer in the formulation has a weight percent range from 0.1 wt % to 15 wt %. In one embodiment, the polymer in the formulation has a weight percent range from 0.2 wt % to 10 wt %. In one embodiment, the polymer in the formulation has a weight percent range from 0.25 wt % to 5 wt %.

The present disclosure also relates to the use of the formulation as a coating or printing ink in the preparation of organic electronic devices, particularly by printing or coating.

Suitable printing or coating techniques include, but are not limited to, inkjet printing, typography printing, screen printing, dip coating, spin coating, blade coating, roller printing, torsion printing, lithography, flexographic printing, rotary printing, spraying, brushing or pad printing, or slit-type extrusion coating and so on. In one embodiment, the printing or coating techniques are gravure printing, screen printing, and inkjet printing. The solution or suspension may additionally include one or more components such as surfactants, lubricants, wetting agents, dispersing agents, hydrophobic agents, binders and so on, for adjusting the viscosity and film forming properties, and improving adhesion. Detailed information relevant to printing technology and related requirements for related solutions, such as solvent, concentration, viscosity, and the like, may be referred to Handbook of Print Media: Technologies and Production Methods, Helmut Kipphan, ISBN 3-540-67326-1.

Based on the above polymer, the present disclosure further provides an application of the polymer as described above, that is, the application of the polymer to an organic electronic device. The organic electronic device may be selected from, but not limited to, an organic light-emitting-diode (OLED), an organic photovoltaic cell (OPV), an organic light-emitting electrochemical cell (OLEEC), an organic field effect transistor (OFET), an organic light-emitting field effect transistor, an organic laser, an organic spin electronic device, an organic sensor, and an organic plasmon emitting diode, especially an OLED. In embodiments of the present disclosure, the organic compound is particularly used in the light-emitting layer of the OLED device.

In one embodiment, the polymer represented by the general formula (1) is used in the light-emitting layer of the OLED device.

In another embodiment, the polymer represented by the general formula (4) is used in the hole transport layer of the OLED device.

The present disclosure further provides an organic electronic device including at least one of the polymers as described above. Generally, such an organic electronic device includes at least a cathode, an anode, and a functional layer between the cathode and the anode, and the functional layer includes at least one of the polymers as described above. The organic electronic device may be selected from, but not limited to, an organic light-emitting-diode (OLED), an organic photovoltaic cell (OPV), an organic light-emitting electrochemical cell (OLEEC), an organic field effect transistor (OFET), an organic light-emitting field effect transistor, an organic laser, an organic spin electronic device, an organic sensor, and an organic plasmon emitting diode.

In a particularly embodiment, the organic electronic device is an OLED including a substrate, an anode, at least one light-emitting layer, and a cathode.

The substrate may be opaque or transparent. A transparent substrate can be used to manufacture a transparent light-emitting component. See, for example, Bulovic et al., Nature 1996, 380, p 29, and Gu et al., Appl. Phys. Lett. 1996, 68, p 2606. The substrate may be rigid or flexible. The substrate can be plastic, metal, semiconductor wafer, or glass. In one embodiment, the substrate has a smooth surface. The substrates without surface defects are particularly desirable. In one embodiment, the substrate is flexible and may be selected from polymer films or plastic having a glass transition temperature Tg greater than 150° C. In another embodiment, the glass transition temperature Tg is greater than 200° C. In yet another embodiment, the glass transition temperature Tg is greater than 250° C. In a further embodiment, the glass transition temperature Tg is greater than 300° C. Examples of suitable flexible substrates are poly(ethylene terephthalate) (PET) and polyethylene glycol (2, 6-naphthalene) (PEN).

The anode can include a conductive metal or a metal oxide, or a conductive polymer. The anode can easily inject holes into the hole injection layer (HIL) or the hole transport layer (HTL) or the light-emitting layer. In one embodiment, the absolute value of the difference between the work function of the anode and the HOMO energy level or the valence band energy level of the emitter in the light-emitting layer or of the p-type semiconductor material as the HIL or HTL or electron blocking layer (EBL) is less than 0.5 eV, further less than 0.3 eV, and still further less than 0.2 eV. Examples of the anode materials include, but are not limited to, Al, Cu, Au, Ag, Mg, Fe, Co, Ni, Mn, Pd, Pt, ITO, aluminum-doped zinc oxide (AZO), and the like. Other suitable anode materials are already known, and may be readily selected for use by one of ordinary skill in the art. The anode material can be deposited using any suitable technique, such as suitable physical vapor deposition process, including radio frequency magnetron sputtering, vacuum thermal evaporation, electron beam (e-beam), and the like. In some embodiments, the anode is patterned. A patterned ITO conductive substrate is commercially available and can be used to fabricate the device according to the present disclosure.

The cathode can include a conductive metal or a metal oxide. The cathode can easily inject electrons into the EIL or ETL or directly into the light-emitting layer. In one embodiment, the absolute value of the difference between the work function of the cathode and the LUMO energy level or the conduction band energy level of the emitter in the light-emitting layer or of the n-type semiconductor material as the electron injection layer (EIL) or the electron transport layer (ETL) or the hole blocking layer (HBL) is less than 0.5 eV, further less than 0.3 eV, and still further less than 0.2 eV. In principle, all the materials that can be used as the cathode of the OLED can serve as the cathode material for the device of the present disclosure. Examples of the cathode material include, but are not limited to, Al, Au, Ag, Ca, Ba, Mg, LiF/Al, MgAg alloy, $BaF_2$/Al, Cu, Fe, Co, Ni, Mn, Pd, Pt, ITO, and the like. The cathode material can be deposited using any suitable technique, such as suitable physical vapor deposition process, including radio frequency magnetron sputtering, vacuum thermal evaporation, and electron beam (e-beam), and the like.

OLEDs may further include other functional layers such as a hole injection layer (HIL), a hole transport layer (HTL), an electron blocking layer (EBL), an electron injection layer (EIL), an electronic transport layer (ETL), and a hole blocking layer (HBL). Suitable materials for these functional layers are described in WO2010135519A1, US20090134784A1, and WO2011110277A1 in detail above. The three patent documents are specially incorporated herein by reference in their entirety.

In one embodiment, in the light-emitting device according to the present disclosure, the light-emitting layer thereof contains the polymer represented by the general formula (1) of the present disclosure.

In another embodiment, in the light-emitting device according to the present disclosure, the hole transport layer thereof contains the polymer represented by the general formula (4) of the present disclosure.

The light-emitting device according to the present disclosure has a light emission wavelength between 300 nm and 1000 nm. In one embodiment, the light emission wavelength is between 350 and 900 nm. In another embodiment, the light emission wavelength is between 400 and 800 nm.

The present disclosure also relates to the application of the organic electronic device according to the present disclosure in various electronic devices including, but not limited to, display equipments, lighting equipments, light sources, sensors, and the like.

The present disclosure also relates to an electronic equipment including the organic electronic device according to the present disclosure. The electronic equipment includes, but not limited to, display equipments, lighting equipments, light sources, sensors, and the like.

The disclosure will now be described with reference to the aforementioned embodiments, but the disclosure is not to be construed as being limited to the following examples. It is to be understood that the appended claims are intended to cover the scope of the disclosure. Those skilled in the art will understand that modifications can be made to various embodiments of the disclosure with the teaching of the present disclosure, which will be covered by the spirit and scope of the claims of the disclosure.

SPECIFIC EXAMPLES

1. Synthesis of Monomers

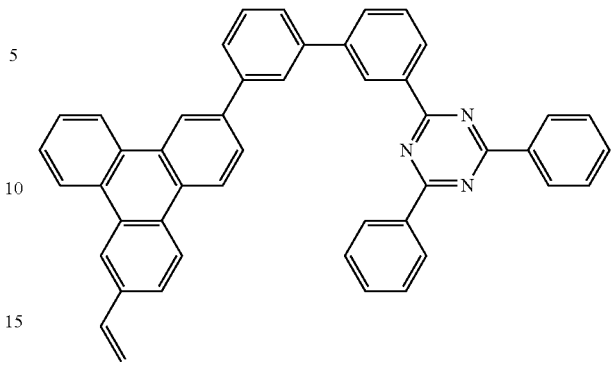

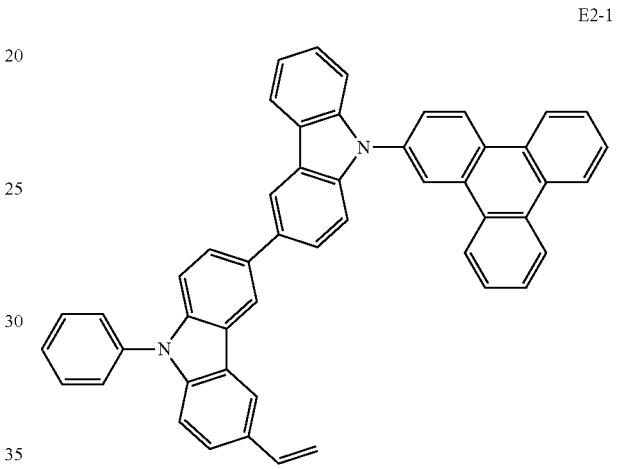

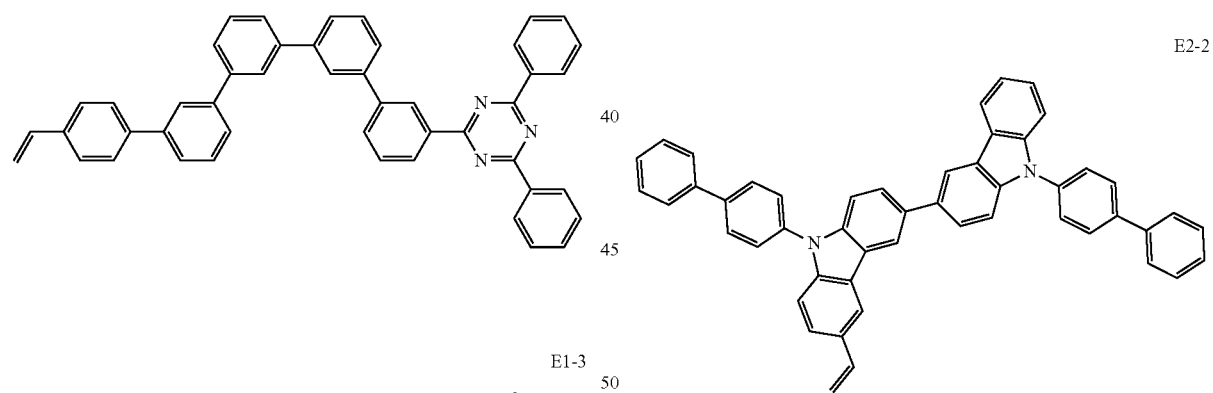

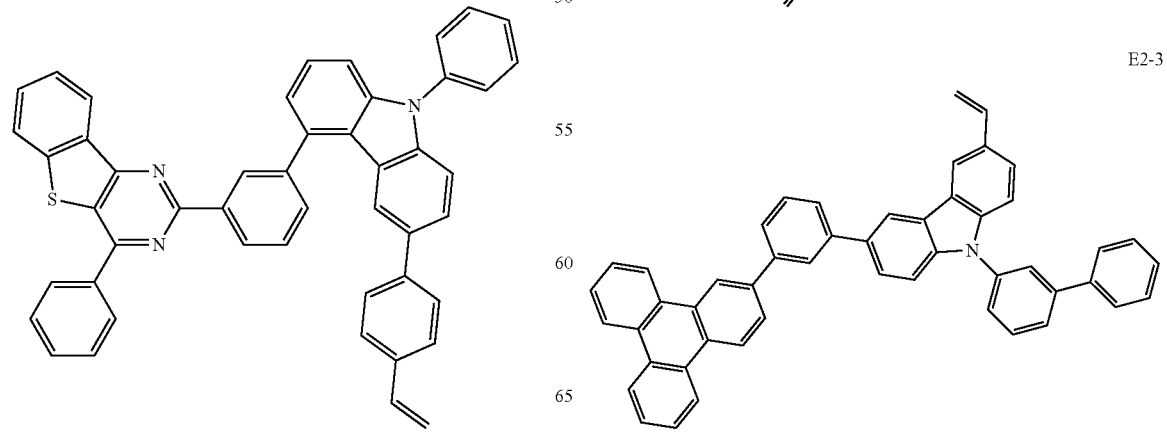

-continued

E2-4

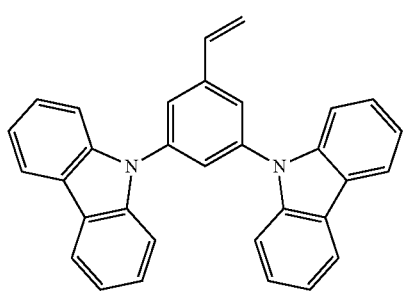

(1) Synthesis of Monomer E1-1

An Experimental Synthetic Route is Shown as Below:

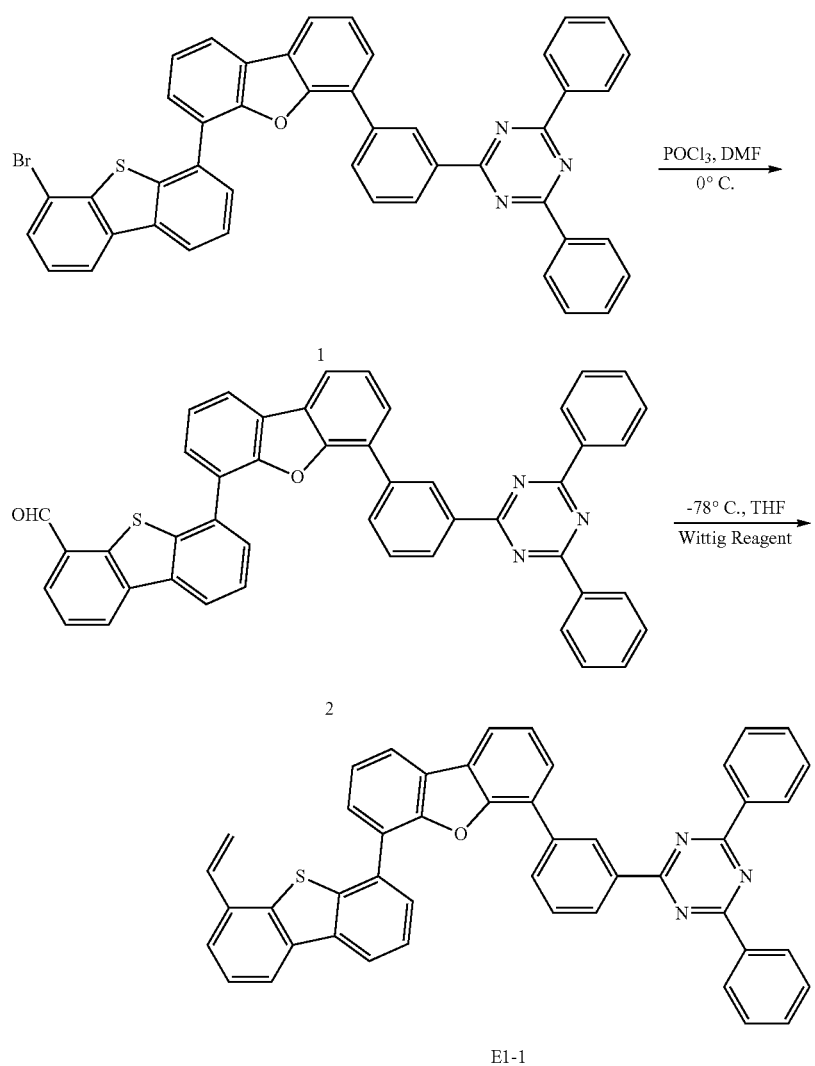

Synthesis Steps are as Follows:

a. 10 mmol of compound 1 was dissolved in 250 ml of dry DMF solution under a nitrogen atmosphere, the resulting reaction solution was placed in an ice bath and stirred, and 11.0 mmol of phosphorus oxychloride (POCl$_3$) solution was added dropwise. After the dropwise addition is completed, the reaction was continued for 30 minutes, allowed to gradually warm up to room temperature and reacted for 2 hours. The reaction was quenched with water, the reaction solution was extracted with dichloromethane, and washed with water. The organic phase was combined, dried with anhydrous sodium sulfate, and filtered. The organic solvent was distilled off to give a crude product of compound 2. The crude product was recrystallized with dichloromethane and n-hexane to obtain 8 mmol of a product, which was dried under vacuum for use. MS (ASAP)=685.2.

b. 5.0 mmol of the compound 2 obtained above was dissolved in 200 ml of dry tetrahydrofuran (THF) solution. The reaction solution was placed at a temperature of −78° C. and stirred under a nitrogen atmosphere, and 8.0 mmol of methylene triphenyl phosphorate (Wittig reagent) was added dropwise. After the addition is completed, the reaction solution was allowed to gradually warm up to room temperature and continued to stir overnight at room temperature. The reaction was quenched with water. All the reaction solution was extracted with dichloromethane. The organic phase was washed with water, and finally the organic phase was combined, dried with anhydrous sodium sulfate, and filtered. The organic solvent was distilled off. The resulting product was purified by silica gel column with mobile phase being dichloromethane: petroleum ether=1:2, finally obtaining 4.1 mmol of monomer E1-1, which was dried under vacuum for use. MS (ASAP)=683.2.

(2) Synthesis of Monomer E1-2

An experimental synthetic route is shown as below:

was distilled off to give a crude product of compound 4. The crude product was recrystallized with dichloromethane and n-hexane to obtain 8.4 mmol of a product, which was dried under vacuum for use. MS (ASAP)=641.3.

b. 5.0 mmol of the compound 4 obtained above was dissolved in 200 ml of dry tetrahydrofuran (THF) solution. The reaction solution was placed at a temperature of −78° C. and stirred under a nitrogen atmosphere, and 8.0 mmol of methylene triphenyl phosphorate (Wittig reagent) was added dropwise. After the addition is completed, the reaction

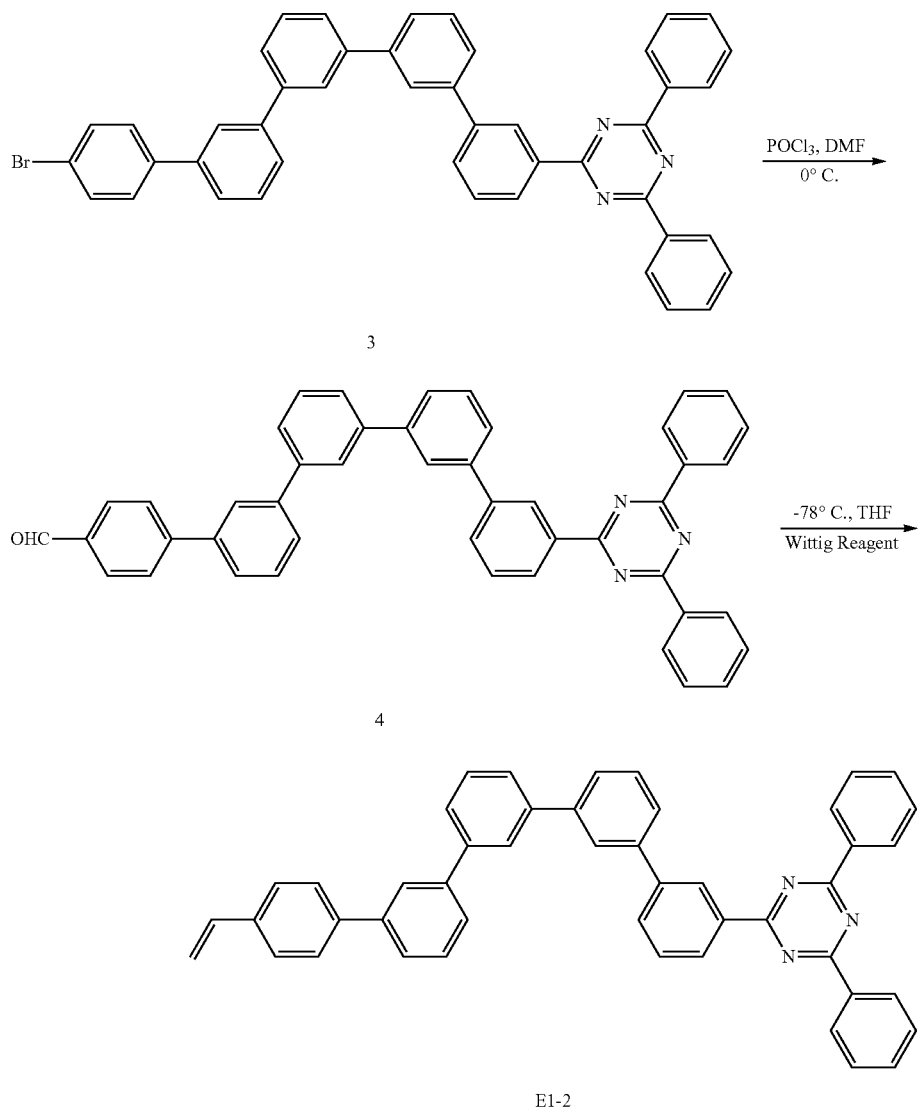

Synthesis steps are as follows:

a. 10 mmol of compound 3 was dissolved in 250 ml of dry DMF solution under a nitrogen atmosphere, the resulting reaction solution was placed in an ice bath and stirred, and 11.0 mmol of phosphorus oxychloride (POCl₃) solution was added dropwise. After the dropwise addition is completed, the reaction was continued for 30 minutes, allowed to gradually warm up to room temperature and reacted for 2 hours. The reaction was quenched with water, the reaction solution was extracted with dichloromethane, and washed with water. The organic phase was combined, dried with anhydrous sodium sulfate, and filtered. The organic solvent solution was allowed to gradually warm up to room temperature and continued to stir overnight at room temperature. The reaction was quenched with water. All the reaction solution was extracted with dichloromethane. The organic phase was washed with water, and finally the organic phase was combined, dried with anhydrous sodium sulfate, and filtered. The organic solvent was distilled off. The resulting product was purified by silica gel column with mobile phase being dichloromethane: petroleum ether=4:1, finally obtaining 4.5 mmol of monomer E1-2, which was dried under vacuum for use. MS (ASAP)=639.4.

(3) Synthesis of Monomer E1-3

An experimental synthetic route is shown as below:

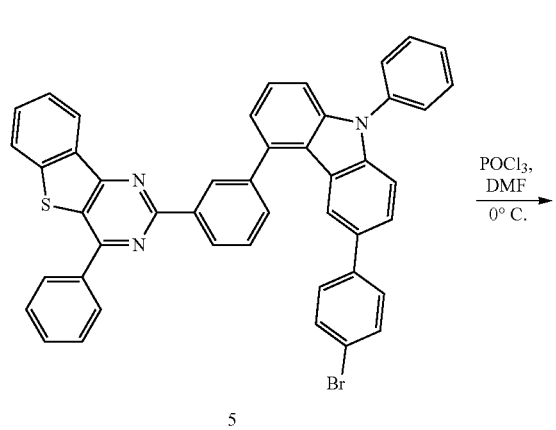

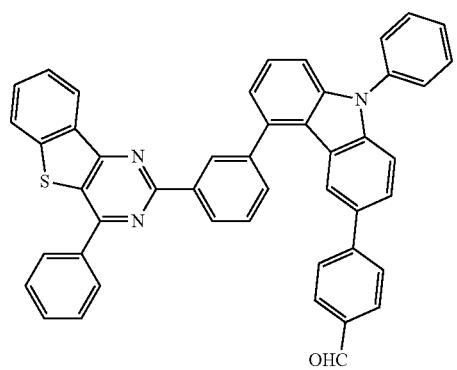

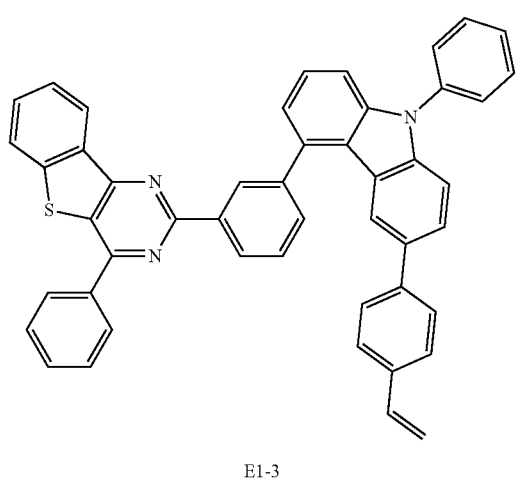

The synthesis steps of monomer E1-3 are similar to the synthesis steps of monomer E1-2, except that compound 5 was used in the first step, and the subsequently resulting aldehyde-containing intermediate was compound 6. Finally, a monomer E1-3 was obtained as a white solid powder. MS (ASAP)=681.2.

(4) Synthesis of Monomer E1-4

An experimental synthetic route is shown as below:

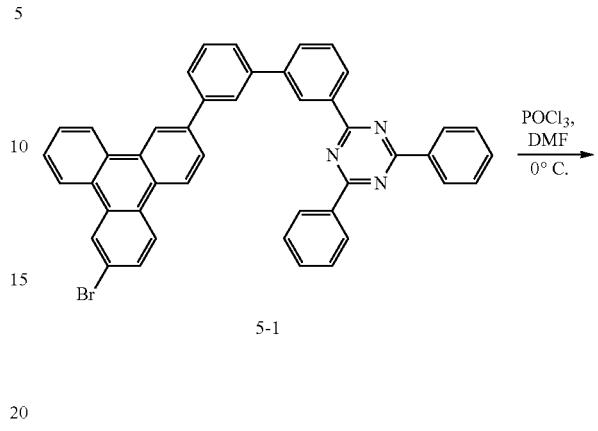

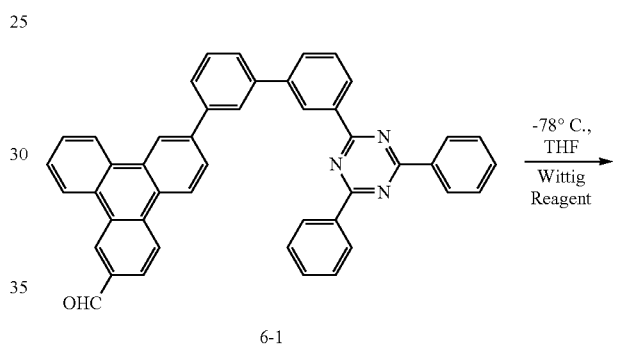

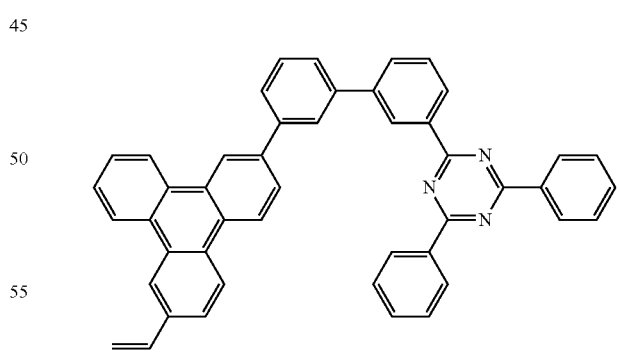

The synthesis steps of monomer E1-4 are similar to the synthesis steps of monomer E1-2, except that compound 5-1 was used in the first step, and the subsequently resulting aldehyde-containing intermediate was compound 6-1. Finally, a monomer E1-4 was obtained as a white solid powder. MS (ASAP)=637.2.

(5) Synthesis of Monomer E2-1

An experimental synthetic route is shown as below:

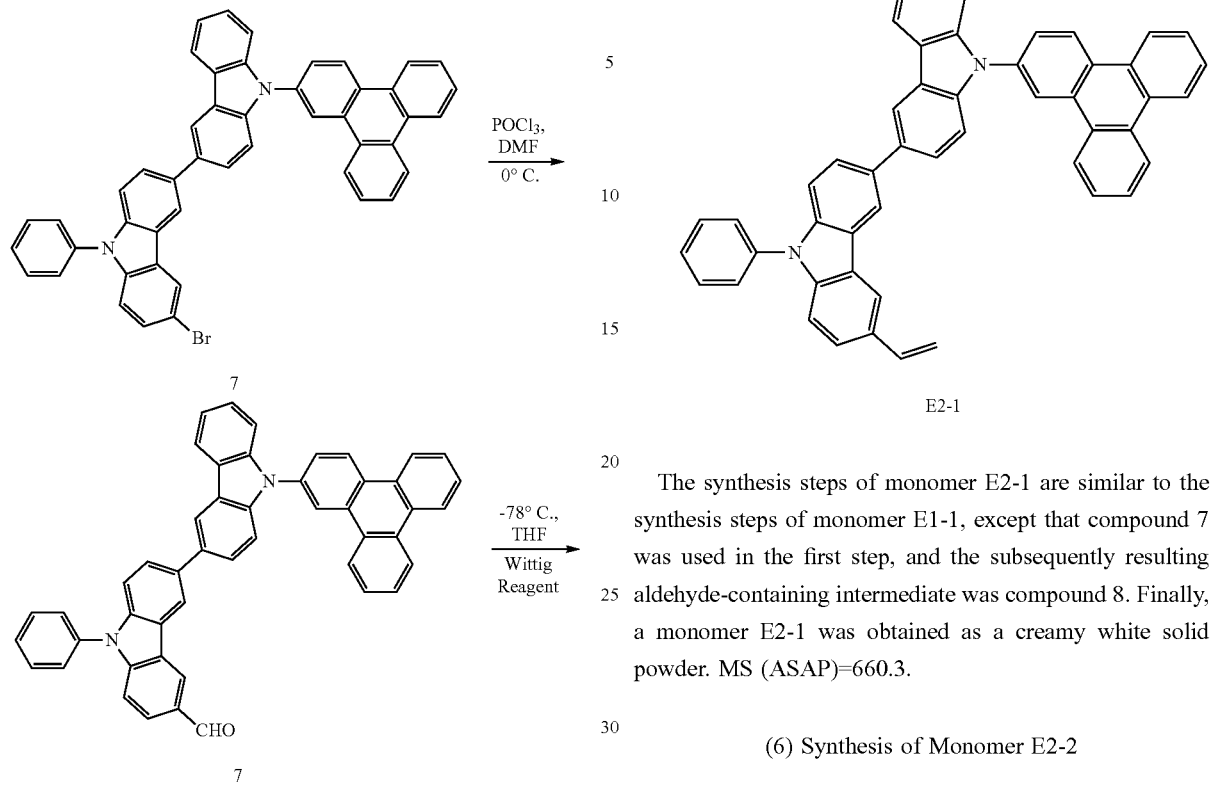

E2-1

The synthesis steps of monomer E2-1 are similar to the synthesis steps of monomer E1-1, except that compound 7 was used in the first step, and the subsequently resulting aldehyde-containing intermediate was compound 8. Finally, a monomer E2-1 was obtained as a creamy white solid powder. MS (ASAP)=660.3.

(6) Synthesis of Monomer E2-2

An experimental synthetic route is shown as below:

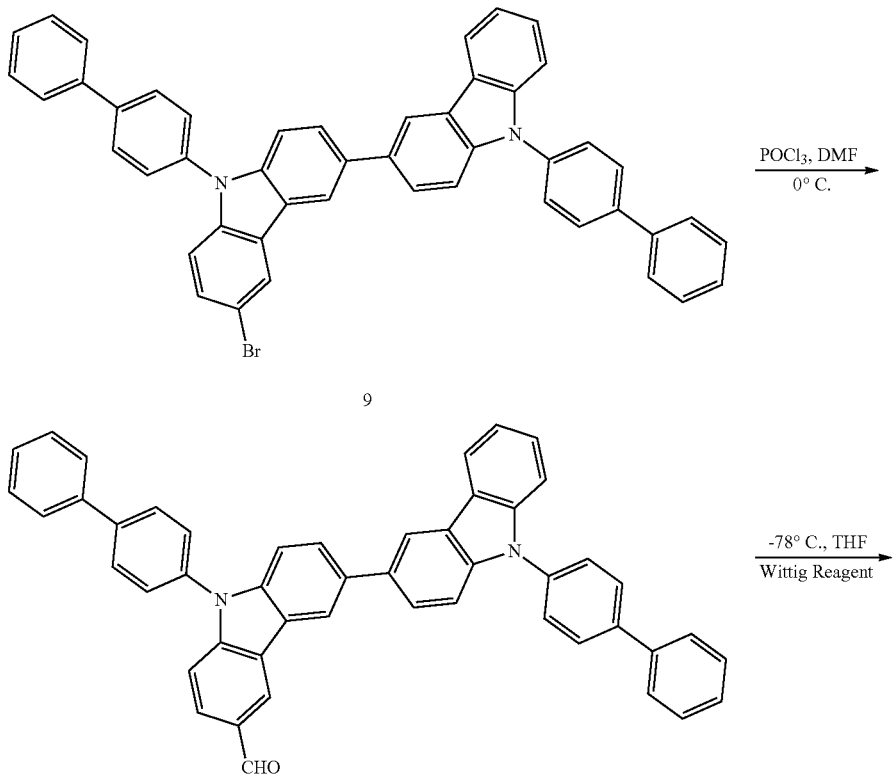

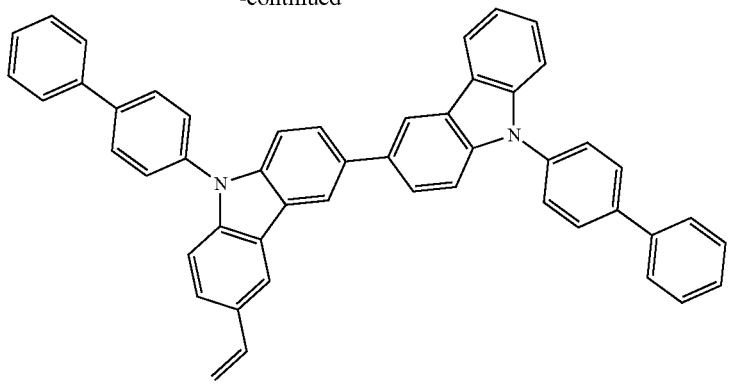
E2-2
The synthesis steps of monomer E2-2 are similar to the synthesis steps of monomer E1-1, except that compound 9 was used in the first step, and the subsequently resulting aldehyde-containing intermediate was compound 10. Finally, a monomer E2-2 was obtained as a creamy white solid powder. MS (ASAP)=662.3.
(7) Synthesis of Monomer E2-3
An experimental synthetic route is shown as below:
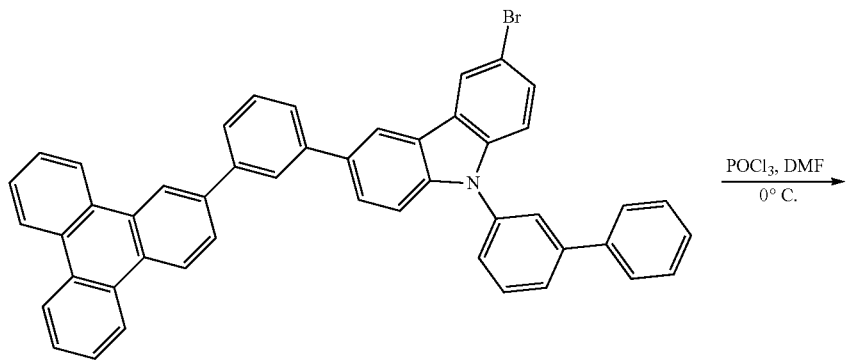
11
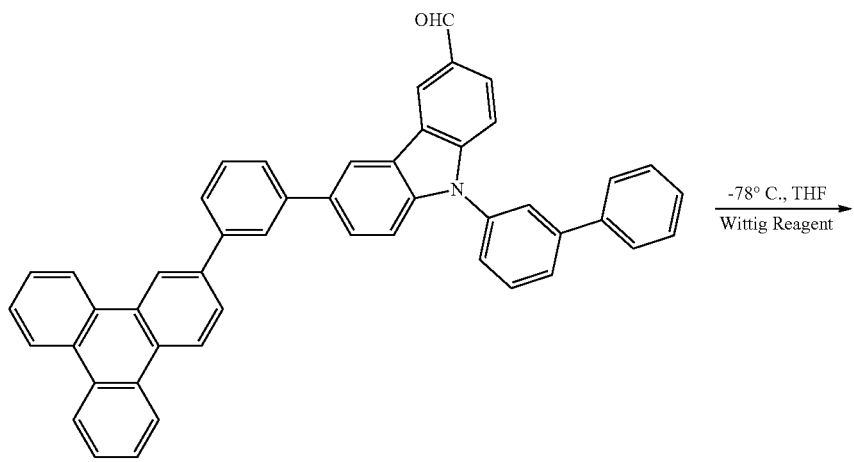
12

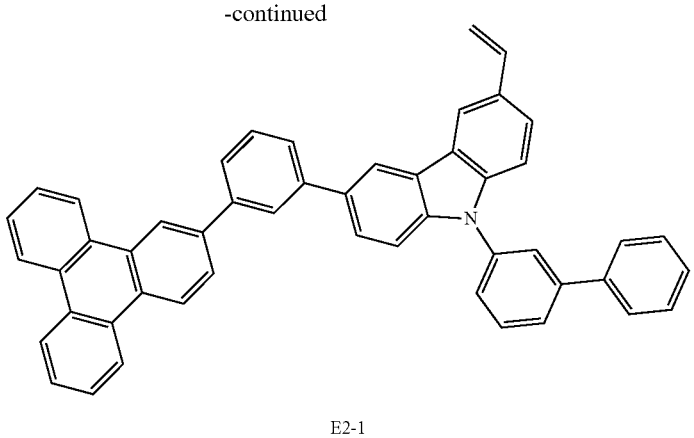

E2-1

The synthesis steps of monomer E2-3 are similar to the synthesis steps of monomer E1-1, except that compound 11 was used in the first step, and the subsequently resulting aldehyde-containing intermediate was compound 12. Finally, a monomer E2-3 was obtained as a creamy white solid powder. MS (ASAP)=647.3.

(8) Synthesis of Monomer E2-4

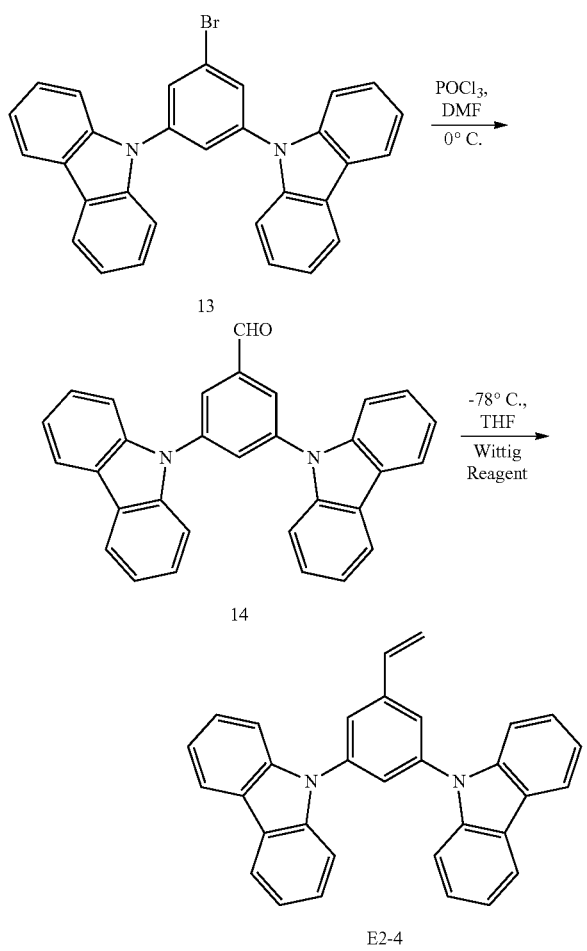

The synthesis steps of monomer E2-4 are similar to the synthesis steps of monomer E1-1, except that compound 13 was used in the first step, and the subsequently resulting aldehyde-containing intermediate was compound 14. Finally, a monomer E2-4 was obtained as a creamy white solid powder. MS (ASAP)=434.4.

2. Energy Structure of Monomers The energy level of the organic repeating structural unit can be calculated by quantum, for example, by using TD-DFT (time-dependent density functional theory) by Gaussian03W (Gaussian Inc.), and specific simulation methods can be found in WO2011141110. Firstly, the molecular geometry is optimized by semi-empirical method "Ground State/Semi-empirical/Default Spin/AM1" (Charge 0/Spin Singlet). Then, the energy structure of organic molecules is determined by TD-DFT (time-density functional theory) Calculate "TD-SCF/DFT/Default Spin/B3PW91" and the base group "6-31G (d)" (Charge 0/Spin Singlet). The HOMO and LUMO energy levels are calculated using the following calibration formula: S1 and T1 are used directly.

$HOMO(eV)=((HOMO(G)\times 27.212)-0.9899)/1.1206$ $LUMO(eV)=((LUMO(G)\times 27.212)-2.0041)/1.385$ Wherein HOMO (G) and LUMO (G) are the direct results of Gaussian 03W, in units of Hartree.

The results are shown in Table 1, in which $\Delta HOMO=HOMO-(HOMO-1)$:

TABLE 1

| Structural Unit | HOMO [eV] | LUMO [eV] | S1 [eV] | T1 [eV] | ΔHOMO [eV] |
|---|---|---|---|---|---|
| E1-1 | −5.99 | −2.79 | 3.25 | 2.80 | 0.32 |
| E1-2 | −6.25 | −2.76 | 3.27 | 2.87 | 0.09 |
| E1-3 | −5.58 | −2.76 | 3.10 | 2.86 | 0.48 |
| E1-4 | −6.06 | −2.80 | 3.31 | 2.71 | 0.18 |
| E2-1 | −5.44 | −2.36 | 3.17 | 2.69 | 0.42 |
| E2-2 | −5.43 | −2.24 | 3.11 | 2.90 | 0.41 |
| E2-3 | −5.70 | −2.33 | 3.22 | 2.71 | 0.34 |
| E2-4 | −5.82 | −2.12 | 3.39 | 3.11 | 0.38 |

3. Synthesis of Polymer

The main synthesis steps for the synthesis of polymers are as follows: taking the synthesis of P1 polymer for example, monomers of 0.5 mmol of E1-1 and 0.50 mmol of E2-1 were dissolved in toluene solvent under the protection of nitrogen while 0.01 mmol of 2, 2-azobisisobutyronitrile (AIBN initiator) was added by a syringe; the reaction solution was sealed and reacted at 60° C. for 4 hours. After the reaction, the reaction solution was cooled to room temperature and the polymer was precipitated out with methanol. The precipitate was dissolved in tetrahydrofuran (THF) and precipitated with methanol again. This was repeated for 3 to 5 times and the product was dried under vacuum to obtain a solid of polymer P1.

The synthesis steps for P2 to P17 are similar to those of P1, except for containing different proportions of vinyl monomer. The monomers and proportions contained in P2 to P17 are shown in the following table:

| Polymer | E1-1 | E1-2 | E1-3 | E1-4 | E2-1 | E2-2 | E2-3 | E2-4 |
|---|---|---|---|---|---|---|---|---|
| P1  | 50  |     |     |     | 50  |     |     |     |
| P2  |     | 40  |     |     |     | 60  |     |     |
| P3  |     |     | 70  |     |     |     | 30  |     |
| P4  | 50  |     |     |     |     | 50  |     |     |
| P5  |     | 50  |     |     | 50  |     |     |     |
| P6  | 15  |     | 30  |     |     | 55  |     |     |
| P7  |     | 60  |     |     |     |     | 40  |     |
| P8  |     |     | 50  |     | 50  |     |     |     |
| P9  |     |     |     | 50  |     |     |     | 50  |
| P10 | 100 |     |     |     |     |     |     |     |
| P11 |     | 100 |     |     |     |     |     |     |
| P12 |     |     | 100 |     |     |     |     |     |
| P13 |     |     |     | 100 |     |     |     |     |
| P14 |     |     |     |     | 100 |     |     |     |
| P15 |     |     |     |     |     | 100 |     |     |
| P16 |     |     |     |     |     |     | 50  | 50  |
| P17 |     |     |     |     |     |     | 50  | 50  |

Where P1 to P9 are polymers represented by the general formula (1) in the present disclosure, and P10 to P17 are polymers represented by the general formula (4) in the present disclosure.

4. Preparation and Measurement of OLED Devices

The preparation process of the OLED devices above will be described in detail with reference to specific examples below. The structure of the OLED devices is as follows: ITO/HIL/HTL/EML/ETL/cathode. The preparation steps are as follows:

a. cleaning of ITO (indium tin oxide) conductive glass substrate: washing with the use of various solvents (such as one or more of chloroform, acetone, or isopropyl alcohol) and then treating with UV and ozone;

b. HIL (hole injection layer, 60 nm): 60 nm PEDOT (polyethylenedioxythiophene, Clevios™ AI4083) was obtained by spin-coating as an HIL in an ultra clean chamber, and treated on a hot plate at 180° C. for 10 minutes;

c. HTL (hole transport layer, 20 nm): 20 nm TFB or PVK (Sigma Aldrich, having an average Mn of 25,000 to 50,000) was obtained by spin-coating in a nitrogen glove box, and the solution used was TFB or PVK (Sigma Aldrich) added into a toluene solvent, with a solubility of solution of 5 mg/ml, followed by a treatment on a hot plate at 180° C. for 60 minutes;

TFB (H.W. SandsCorp.) is a hole transport material for HTL, and its structure is as follows:

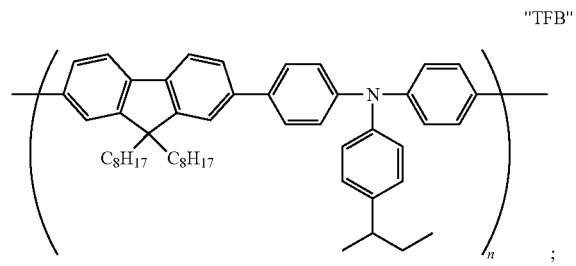

d. EML (organic light-emitting layer): EML was formed by spin-coating in a nitrogen glove box and the solution used was the polymer (P1 to P10) added into a toluene solvent and a certain amount of Ir(PPy)$_3$, with a solubility of solution of 10 mg/ml, followed by a treatment on a hot plate at 180° C. for 10 minutes. The component and thickness of EML of the devices are listed in Table 2.

TABLE 2

| OLED device | HTL | Component and thichness of EML |
|---|---|---|
| OLED1 | PVK | P1: (15%)Ir(ppy)$_3$(80 nm) |
| OLED2 | PVK | P2: (15%)Ir(ppy)$_3$(65 nm) |
| OLED3 | TFB | P3: (15%)Ir(ppy)$_3$(80 nm) |
| OLED4 | TFB | P4: (15%)Ir(ppy)$_3$(80 nm) |
| OLED5 | TFB | P5: (15%)Ir(ppy)$_3$(80 nm) |
| OLED6 | PVK | P6: (15%)Ir(ppy)$_3$(65 nm) |
| OLED7 | PVK | P7: (15%)Ir(ppy)$_3$(65 nm) |
| OLED8 | TFB | P8: (15%)Ir(ppy)$_3$(65 nm) |
| OLED9 | TFB | P9: (15%)Ir(ppy)$_3$(65 nm) | e. cathode: Ba/Al(2 nm/100 nm) was deposited in high vacuum ($1\times10^{-6}$ mbar) by the thermal evaporation;

f. encapsulation: the device was encapsulated in the nitrogen glove box with UV curing resin. The current-voltage and luminescence (IVL) characteristics of each OLED device are characterized by characterization equipment, while recording important parameters such as efficiency, lifetime, and driving voltage. The performance of OLED devices is summarized in Table 3.

TABLE 3

| OLED device | Colour | V@1 knits [V] | Current efficiency @ 1 knits [cd/A] |
|---|---|---|---|
| OLED1 | green | 8.5 | 43 |
| OLED2 | green | 8.3 | 44 |
| OLED3 | green | 7.5 | 44 |
| OLED4 | green | 7.8 | 39 |
| OLED5 | green | 6.4 | 42 |
| OLED6 | green | 7.6 | 45 |
| OLED7 | green | 7.7 | 46 |
| OLED8 | green | 6.7 | 48 |
| OLED9 | green | 6.5 | 50 |

Similarly, P10 to P17 can be used as a HTL for OLEDs instead of TFB or PVK.

The polymers represented by the general formulas (1) to (3) of the present disclosure tend to easily form an exciplex, which, when used for a phosphorescent host, can improve the efficiency of the device, while providing a better material solution for printing OLEDs due to better solubility in an organic solvent and good film forming performance. The polymers represented by the general formula (4) of the present disclosure have high stability and are easy to be solution processed.

What is claimed is:

1. A polymer comprising a repeating unit represented by general formula (1):

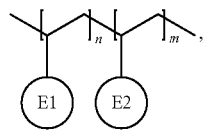

general formula (1)

wherein n and m are integers greater than or equal to 1, and a ratio of n:m ranges from 3:7 to 7:3;

min((LUMO(E1)−HOMO(E2), LUMO(E2)−HOMO(E1)) min($E_T$(E1), $E_T$(E2))+0.1 eV, wherein LUMO(E1), HOMO(E1), and $E_T$(E1) are energy levels of a lowest unoccupied molecular orbital, a highest occupied molecular orbital, and a triplet excited state of E1 group, respectively; LUMO(E2), HOMO(E2), and $E_T$(E2) are energy levels of a lowest unoccupied molecular orbital, a highest occupied molecular orbital, and a triplet excited state of E2 group, respectively, wherein the E1 group comprises at least one of structural units containing the following structural formulas:

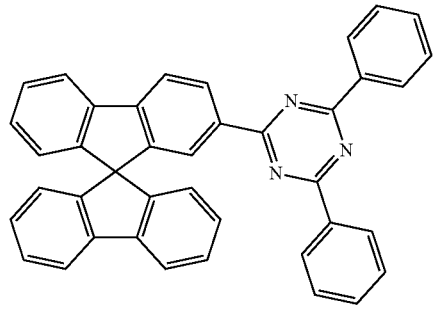

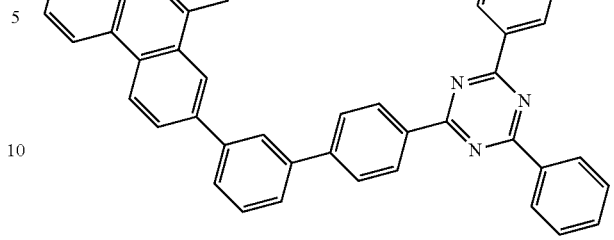

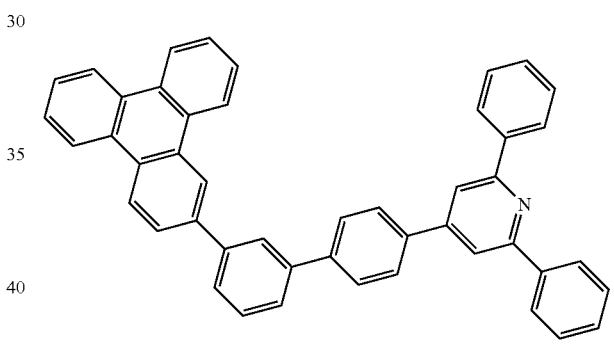

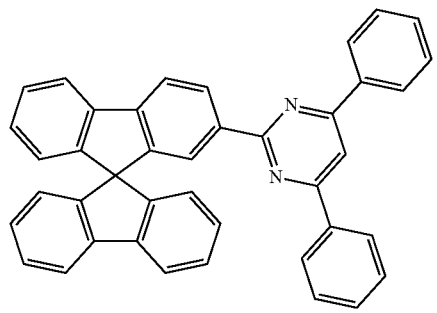

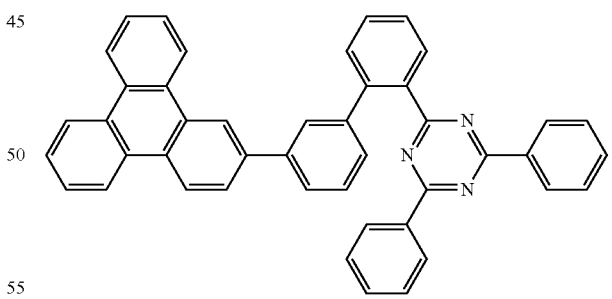

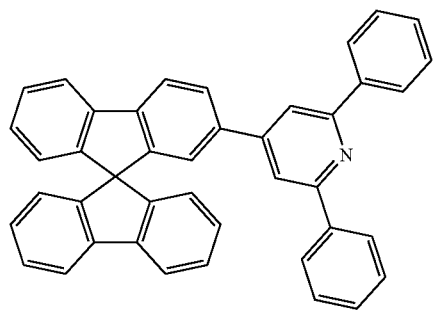

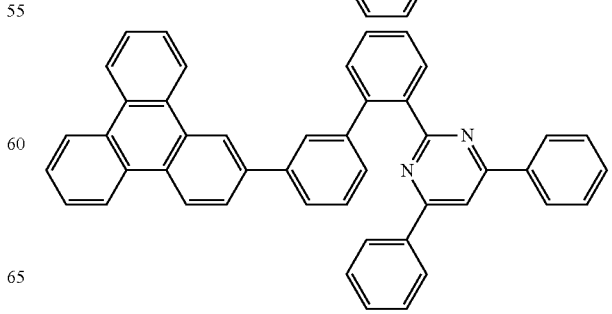

135
-continued
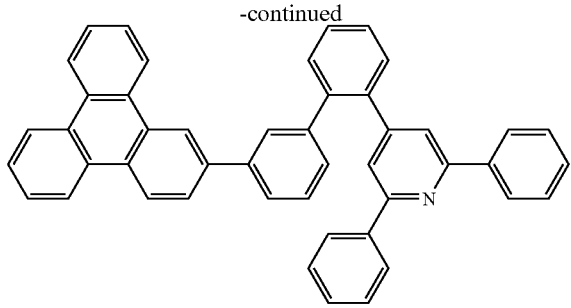
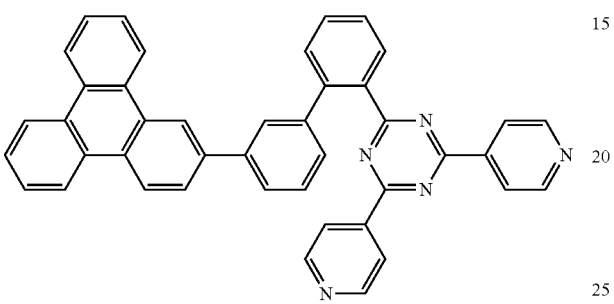
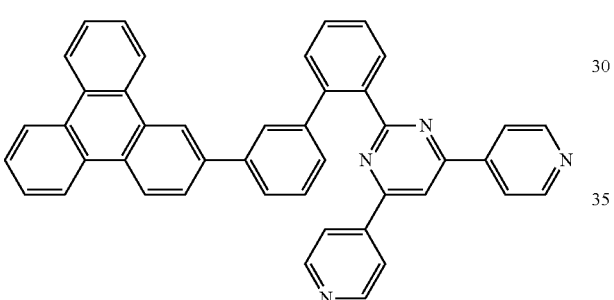
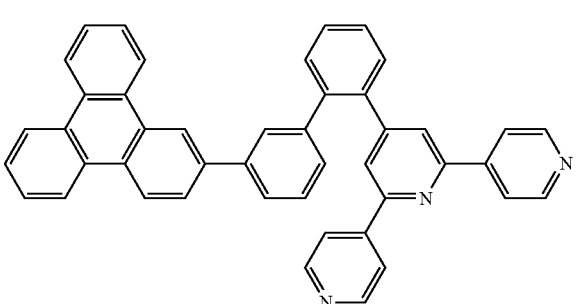
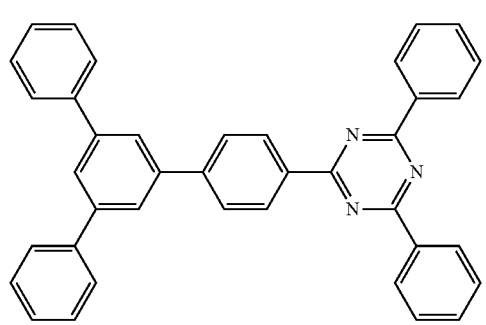
136
-continued
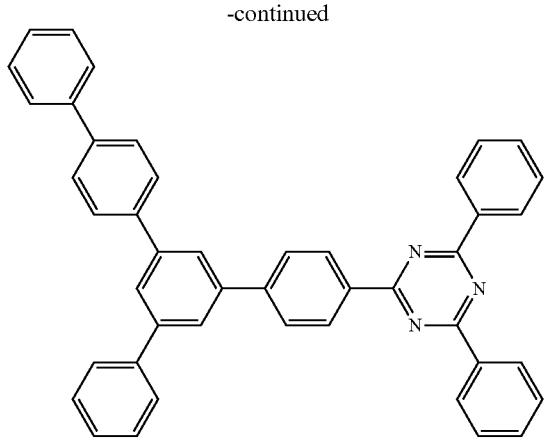
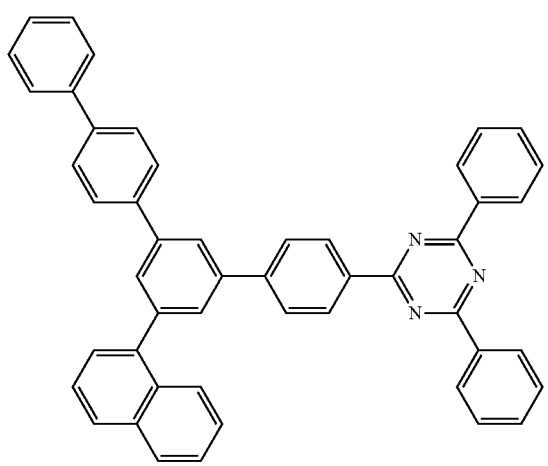
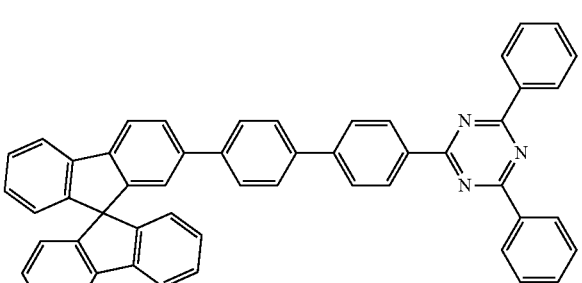
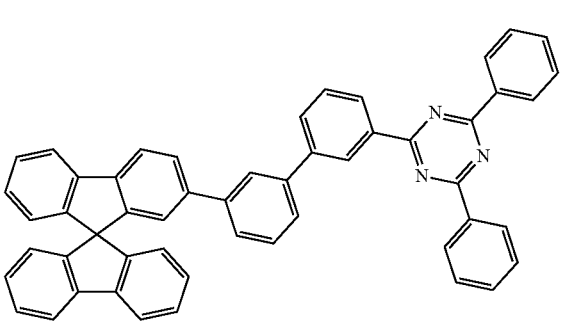

137
-continued
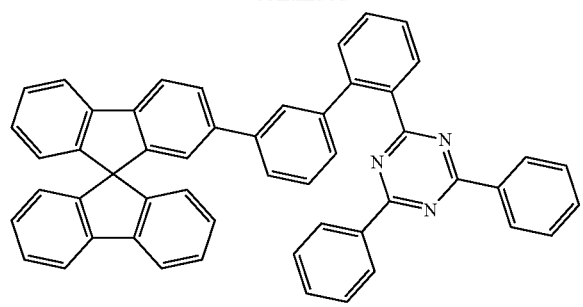
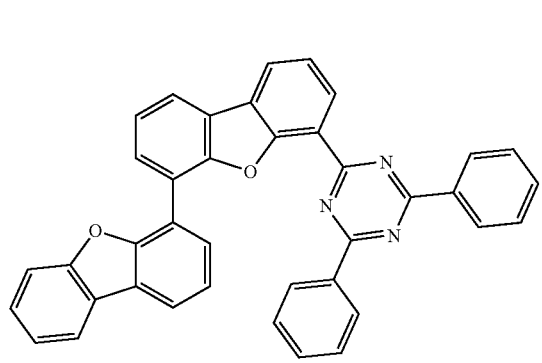
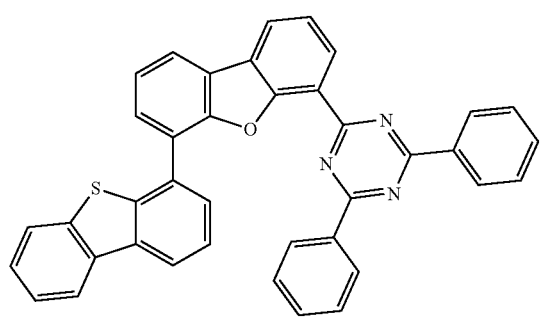
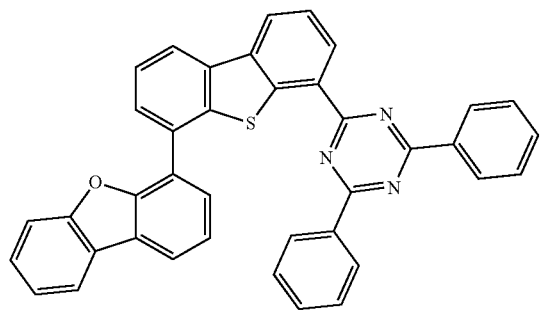
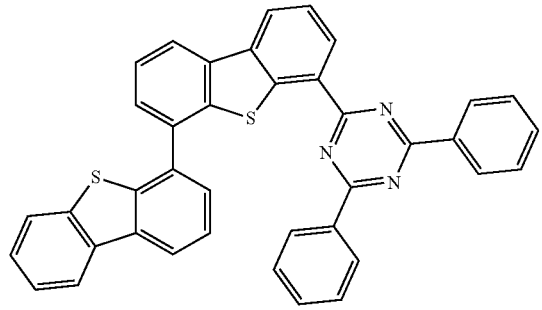
138
-continued
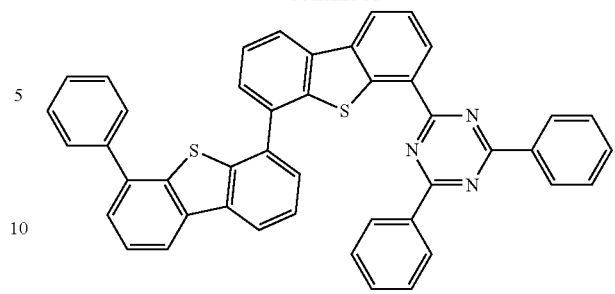
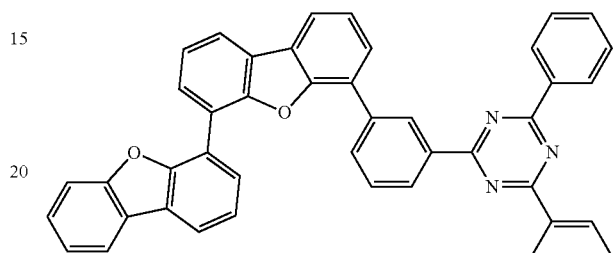
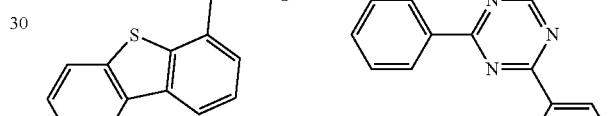
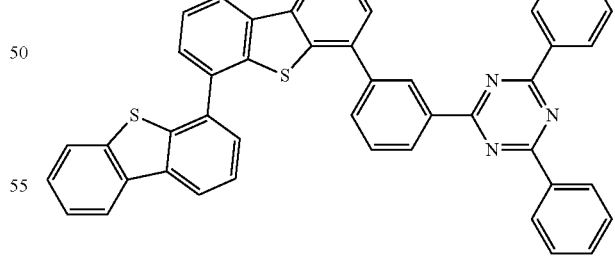
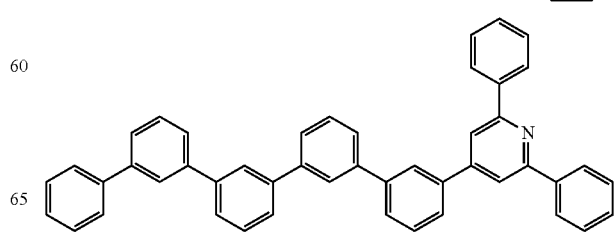

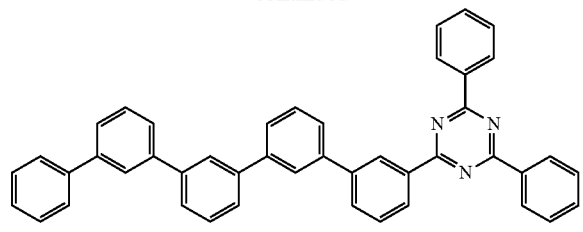

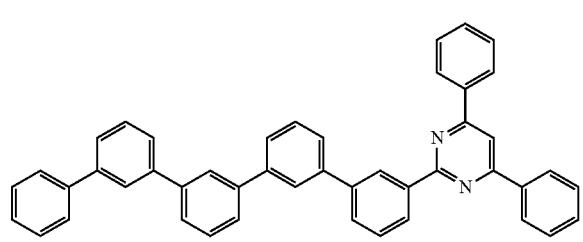

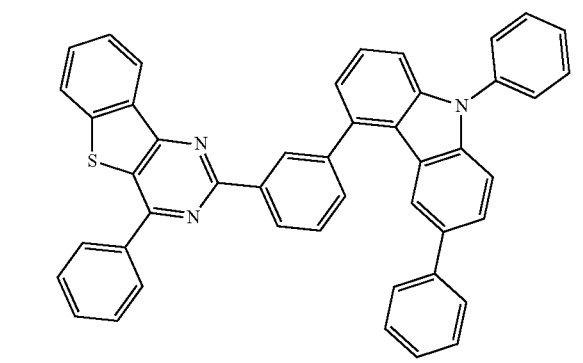

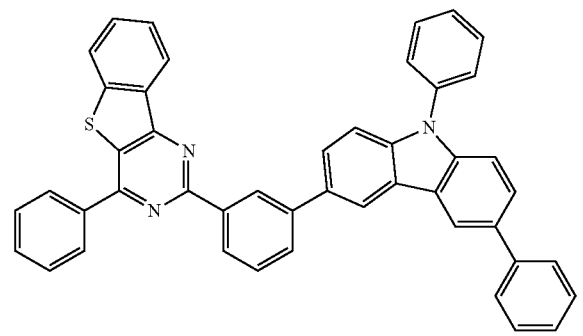

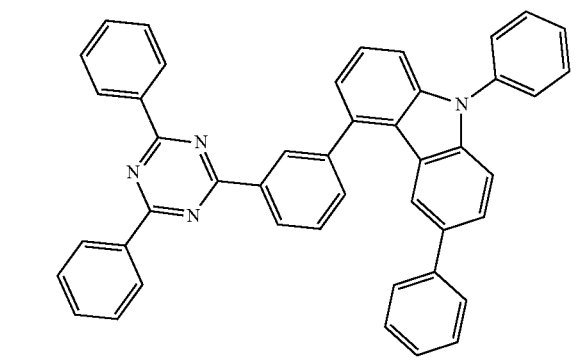

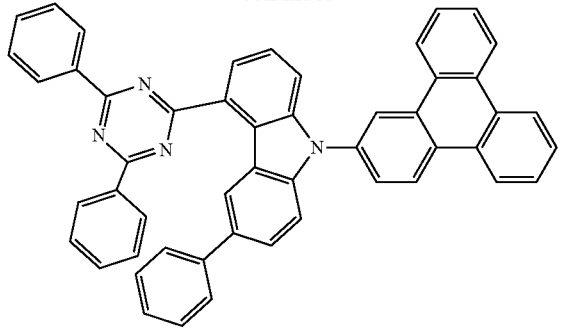

2. The polymer of claim 1, wherein HOMO(E1)–(HOMO−1)(E1) 0.3 eV and/or HOMO(E2)–(HOMO−1)(E2) 0.3 eV, wherein (HOMO−1)(E1) is an energy level of a second highest occupied molecular orbital of the E1 group, (HOMO−1)(E2) is an energy level of a second highest occupied molecular orbital of the E2 group.

3. The polymer of claim 1, comprising a repeating unit represented by general formula (2):

general formula (2)

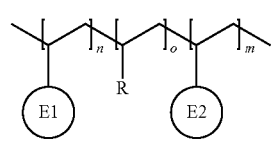

wherein R is at least one selected from the group consisting of a linear alkane containing 1 to 15 carbon atoms, a branched alkane containing 1 to 15 carbon atoms, an aromatic ring system containing 2 to 20 carbon atoms, a heteroaromatic ring system containing 2 to 20 carbon atoms, and a non-aromatic ring system containing 2 to 20 carbon atoms; o is an integer greater than or equal to 0.

4. The polymer of claim 1, wherein the E2 group comprises an electron-accepting group A.

5. The polymer of claim 1, wherein the E2 group comprises a structural unit represented by general formula (II):

wherein Ar is an aromatic or heteroaromatic structural unit, the electron-accepting group A is the same or different in multiple occurrences, r is an integer between 1 and 6, and s is 0 or 1.

6. The polymer of claim 5, wherein the electron-accepting group A is selected from F or a cyano group, in which s is equal to 1; or the electron-accepting group A comprises at least one of substituted or unsubstituted structure units as follows:

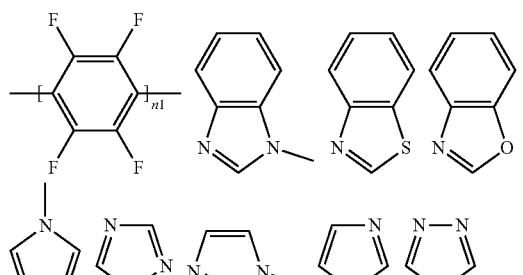
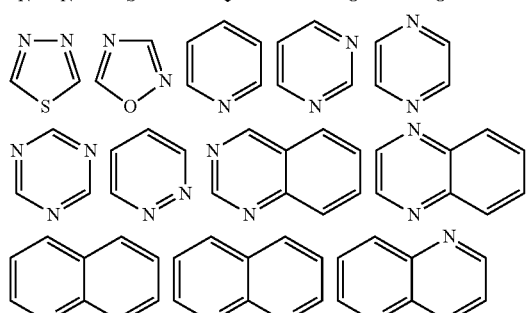
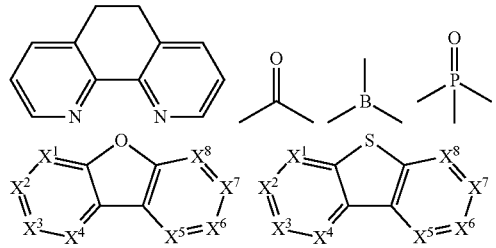
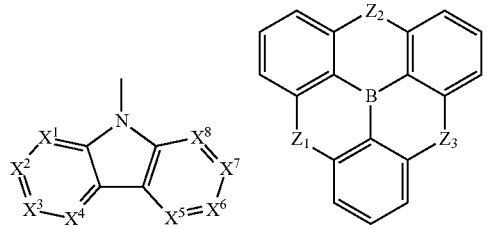
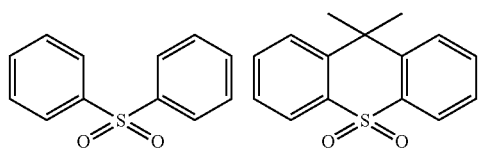
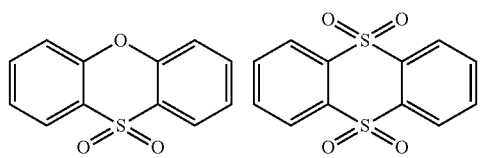

wherein n1 is an integer from 1 to 3; $X^1$ to $X^8$ are selected from $CR^{12}$ or N, and at least one of $X^1$ to $X^8$ is N, wherein $R^{12}$ is hydrogen, alkyl, alkoxy, amino, alkenyl, alkynyl, aralkyl, heteroalkyl, aryl, or heteroaryl; $Z_i$ to $Z_3$ are a single bond, $C(R^{12})_2$, O, or S.

7. The polymer of claim 1, wherein the E2 group comprises at least one of structural units containing the following structural formulas:

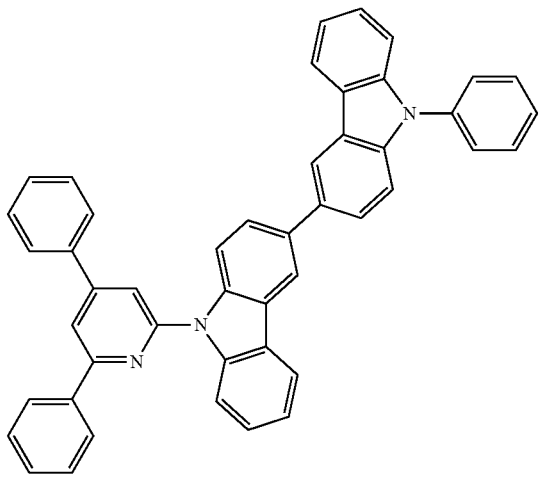
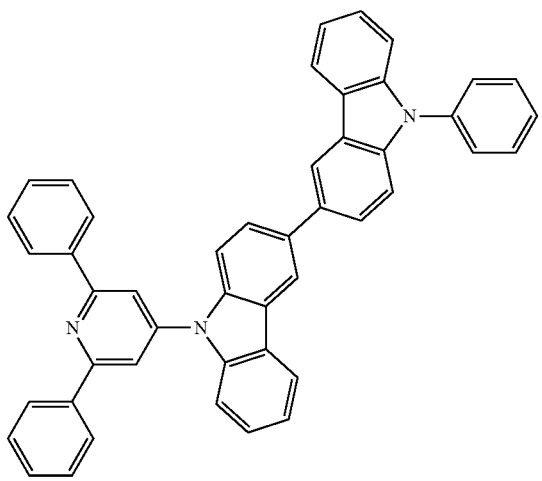

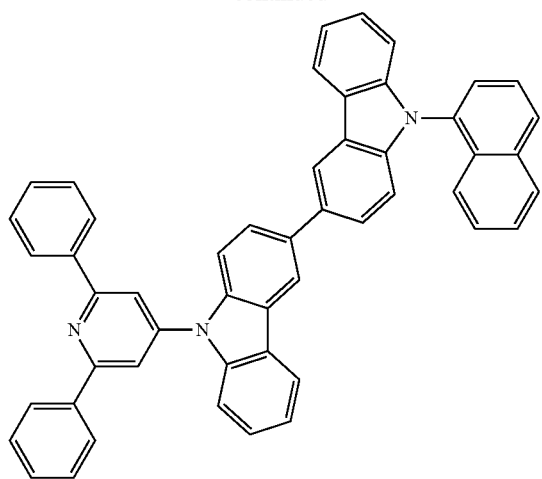
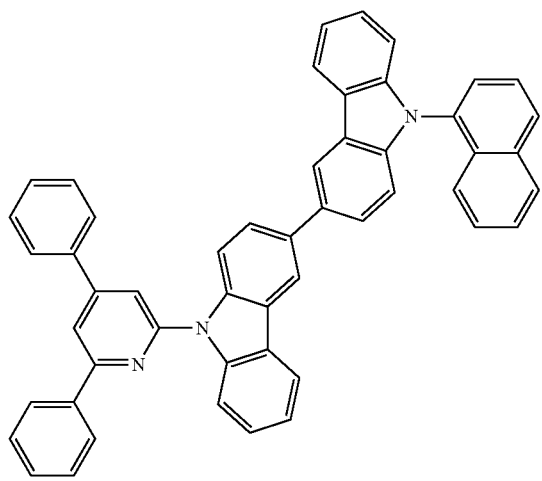
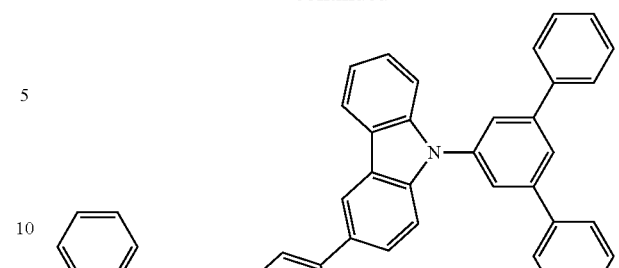
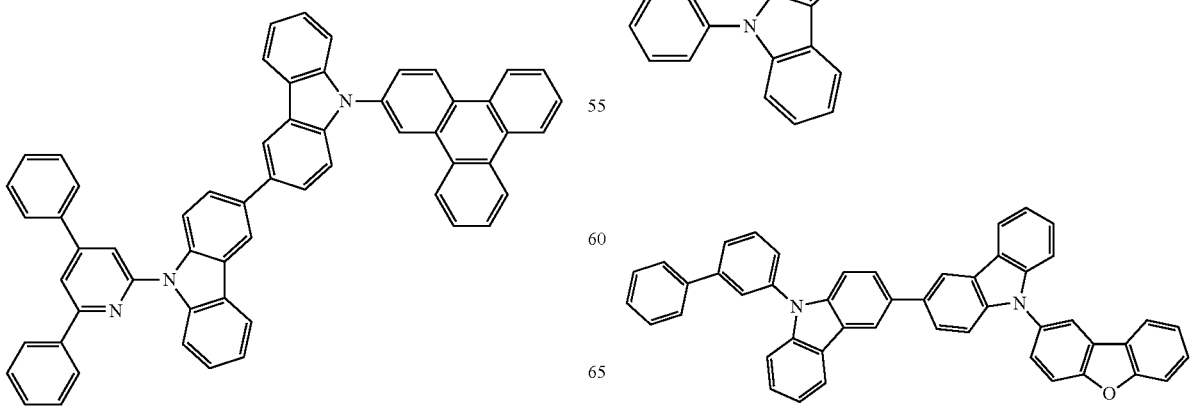

145
-continued
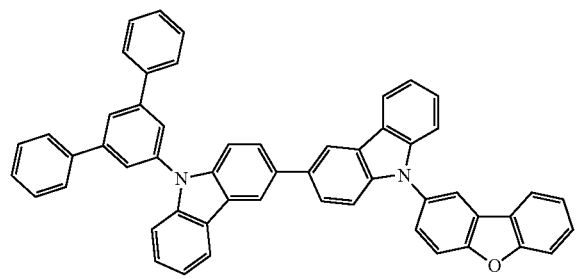
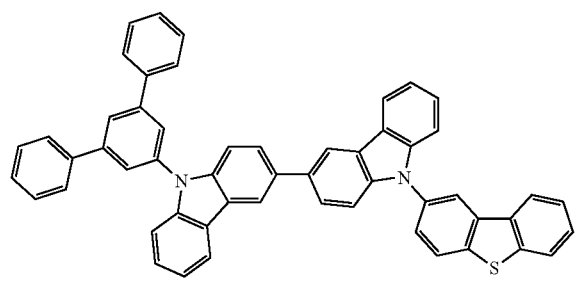
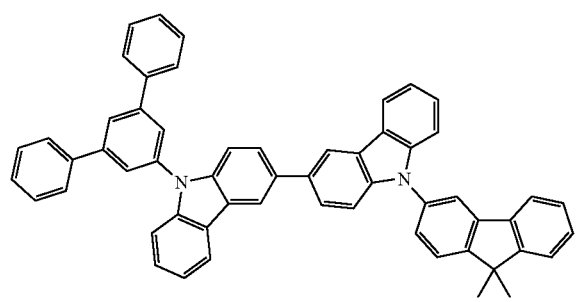
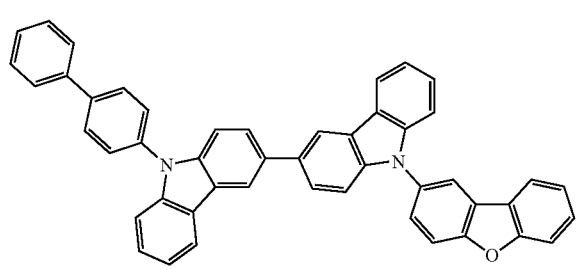
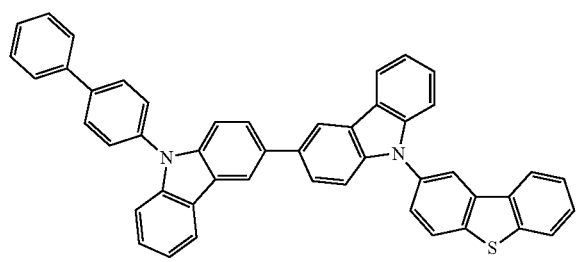
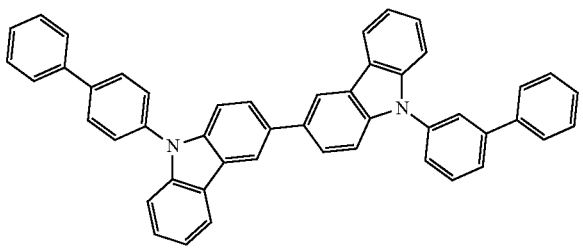
146
-continued
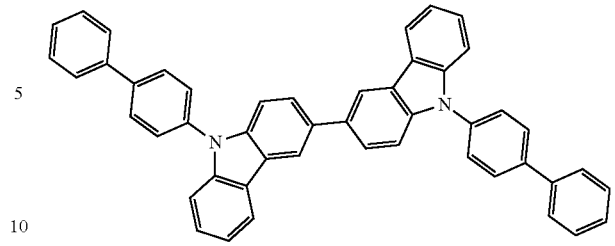
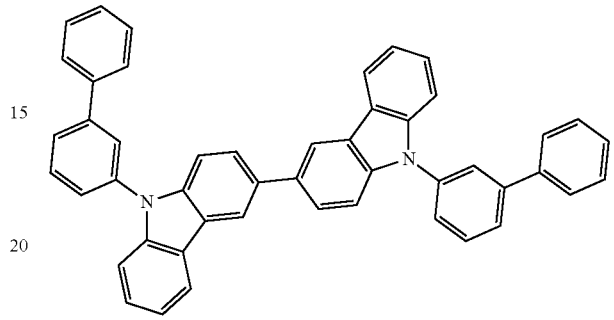
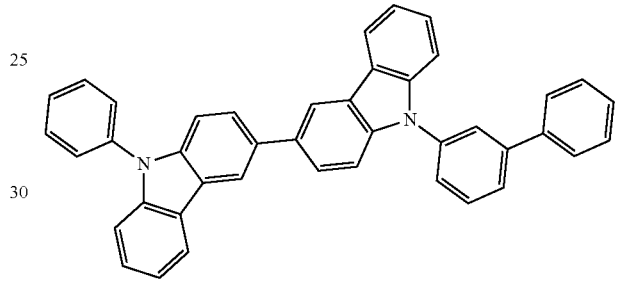
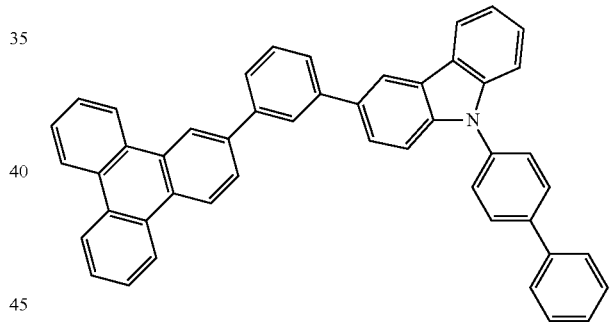
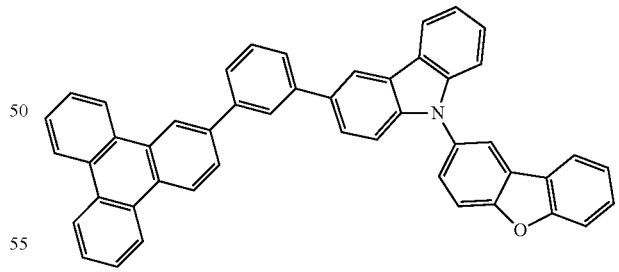
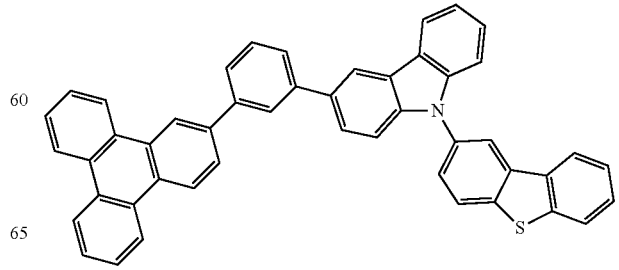

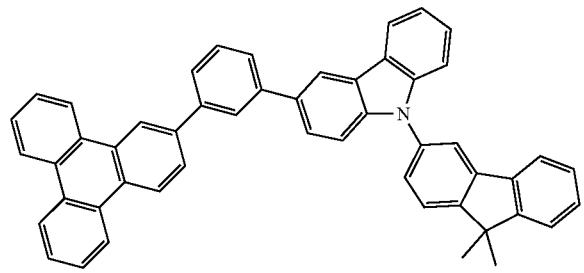
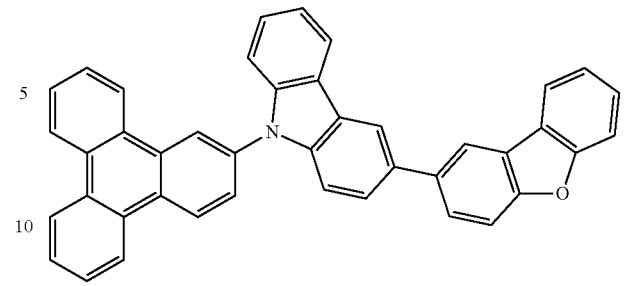
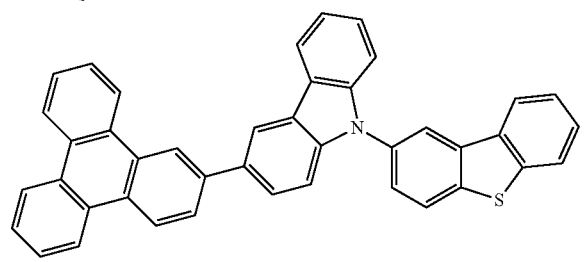
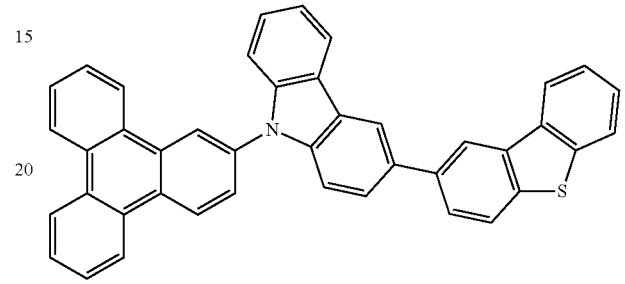
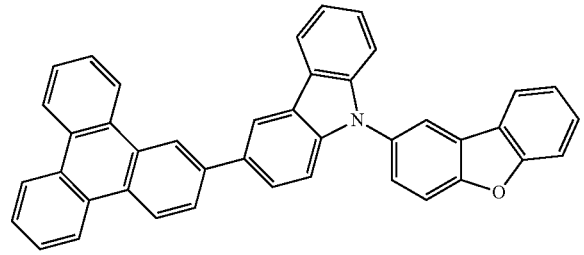
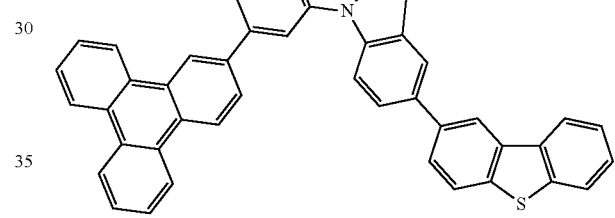
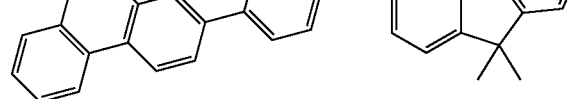
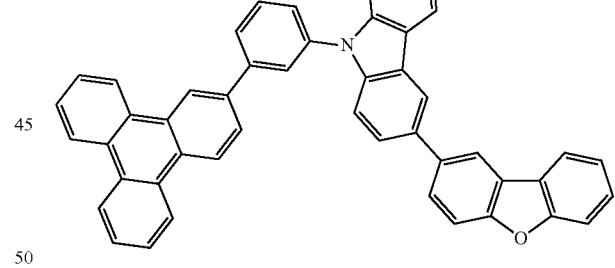
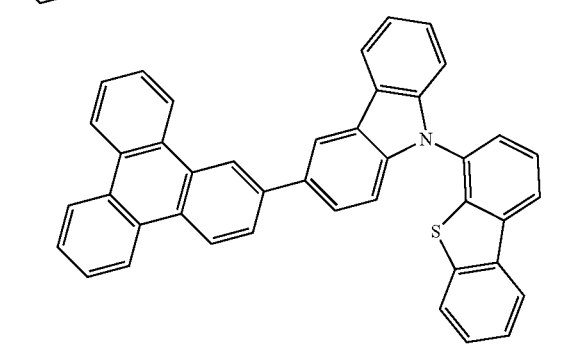
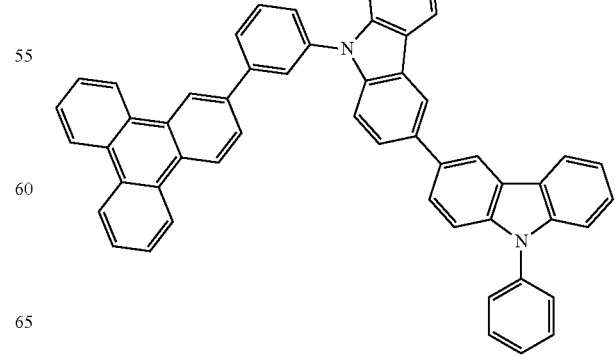

-continued

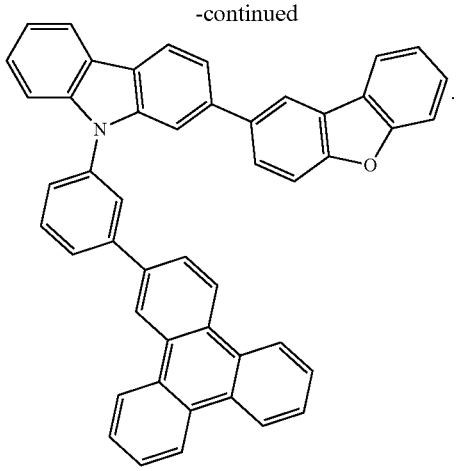

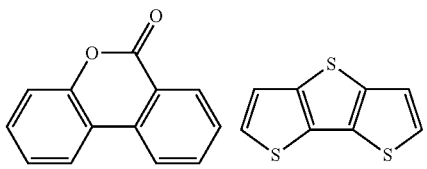

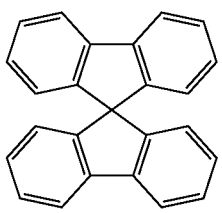

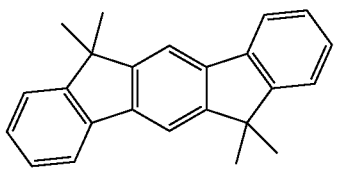

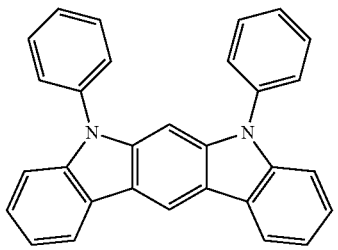

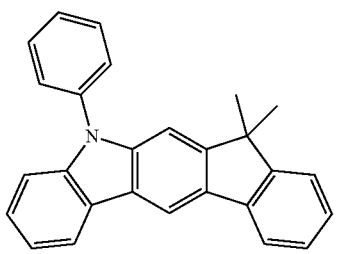

8. The polymer of claim 1, further comprising at least one of a hole injection or transport group, a hole blocking group, an electron injection or transport group, an electron blocking group, an organic host group, a singlet emitter group, a triplet emitter group, and a thermally activated delayed fluorescent emitter group on a side chain thereof.

9. A mixture comprising a polymer of claim 1, and further comprising an organic solvent or at least one of a hole injection or transport material, a hole blocking material, an electron injection or transport material, an electron blocking material, an organic host material, a singlet emitter, a triplet emitter, and a TADF emitter.

10. The polymer of claim 1, wherein HOMO(E1)–(HOMO−1)(E1) 0.3 eV and HOMO(E2)–(HOMO−1)(E2) 0.3 eV, wherein (HOMO−1)(E1) is an energy level of a second highest occupied molecular orbital of the E1 group, (HOMO−1)(E2) is an energy level of a second highest occupied molecular orbital of the E2 group.

11. The polymer of claim 5, wherein Ar comprises at least one of structural units as follows:

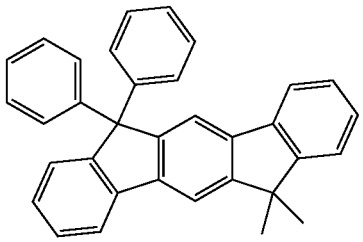

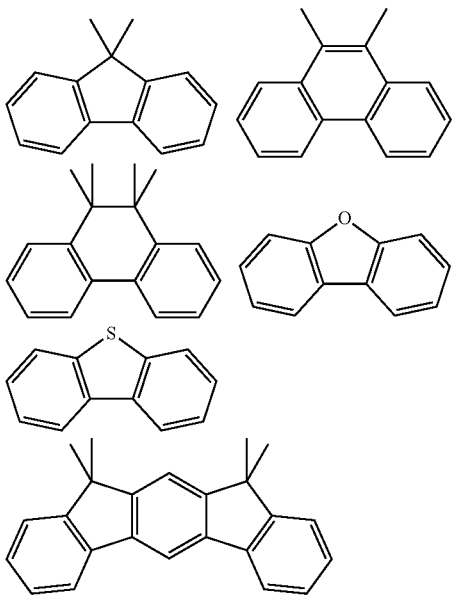

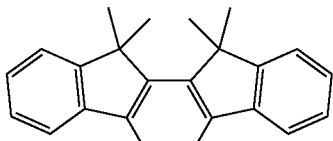

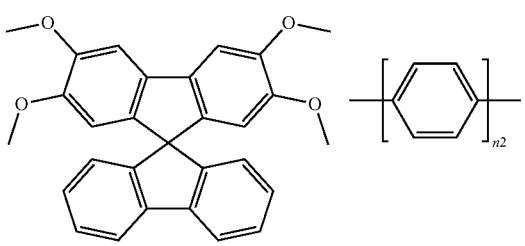

151
-continued
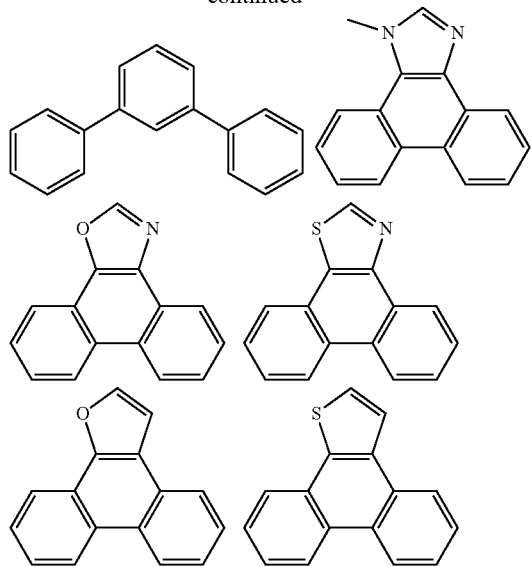
152
-continued
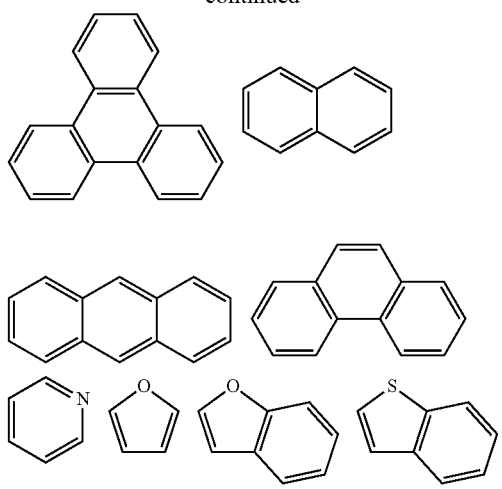
wherein n2 is 1, 2, 3, or 4.
* * * * *